(12) United States Patent
Uesaka et al.

(10) Patent No.: US 10,333,091 B2
(45) Date of Patent: Jun. 25, 2019

(54) LIGHT-EMITTING ELEMENT, DISPLAY ELEMENT, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Shogo Uesaka, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/689,487

(22) Filed: Aug. 29, 2017

(65) Prior Publication Data

US 2017/0365806 A1 Dec. 21, 2017

Related U.S. Application Data

(63) Continuation of application No. 15/050,779, filed on Feb. 23, 2016, now Pat. No. 9,755,174.

(30) Foreign Application Priority Data

Feb. 25, 2015 (JP) .................................. 2015-035678

(51) Int. Cl.
*H01L 51/50* (2006.01)
(52) U.S. Cl.
CPC ........ *H01L 51/504* (2013.01); *H01L 51/5088* (2013.01); *H01L 2251/5376* (2013.01)
(58) Field of Classification Search
CPC .......................... H01L 51/504; H01L 51/5088
See application file for complete search history.

(56) References Cited

U.S. PATENT DOCUMENTS

| | | | |
|---|---|---|---|
| 7,872,256 B2 * | 1/2011 | Sung | ..................... H01L 27/322 257/40 |
| 8,288,784 B2 | 10/2012 | Cho | |
| 8,405,100 B2 | 3/2013 | Matsumoto et al. | |
| 8,957,442 B2 | 2/2015 | Seo et al. | |
| 9,000,458 B2 | 4/2015 | Seo et al. | |
| 9,006,755 B2 | 4/2015 | Seo et al. | |
| 9,059,430 B2 | 6/2015 | Seo et al. | |
| 9,172,059 B2 | 10/2015 | Seo et al. | |

(Continued)

FOREIGN PATENT DOCUMENTS

JP 2012-182127 A 9/2012

*Primary Examiner* — Allan R Wilson
(74) *Attorney, Agent, or Firm* — Husch Blackwell LLP

(57) ABSTRACT

A light-emitting element with high emission efficiency which includes a plurality of light-emitting layers and exhibits multi-color light emission is provided. The light-emitting element includes a first electrode, a second electrode, and an EL layer between the first electrode and the second electrode. The EL layer includes a first injection layer, a first light-emitting layer, and a second light-emitting layer in a first region, and a second injection layer, the first light-emitting layer, and the second light-emitting layer in a second region. The first light-emitting layer includes a first light-emitting material and a first host material, and the second light-emitting layer includes a second light-emitting material and a second host material. A color of light emitted from the first region is different from that of light emitted from the second region.

24 Claims, 42 Drawing Sheets

(56) References Cited

U.S. PATENT DOCUMENTS

| | | | |
|---|---|---|---|
| 9,175,213 B2 | 11/2015 | Seo et al. | |
| 9,425,435 B2 | 8/2016 | Ando | |
| 9,515,279 B2 | 12/2016 | Ishisone et al. | |
| 9,893,303 B2 * | 2/2018 | Suzuki | H01L 51/0085 |
| 2008/0111474 A1 | 5/2008 | Sung et al. | |
| 2011/0062475 A1 * | 3/2011 | Cho | H01L 51/5036 |
| | | | 257/98 |
| 2011/0248247 A1 | 10/2011 | Matsumoto et al. | |
| 2012/0205632 A1 | 8/2012 | Shitagaki et al. | |
| 2012/0205701 A1 | 8/2012 | Sasaki et al. | |
| 2014/0084256 A1 | 3/2014 | Kim et al. | |
| 2014/0319487 A1 | 10/2014 | Park et al. | |
| 2015/0053958 A1 | 2/2015 | Ishisone et al. | |
| 2015/0069352 A1 * | 3/2015 | Kim | H01L 51/5004 |
| | | | 257/40 |
| 2015/0333229 A1 * | 11/2015 | Seo | H01L 51/504 |
| | | | 257/89 |
| 2016/0043146 A1 | 2/2016 | Uesaka et al. | |
| 2016/0164020 A1 * | 6/2016 | Kim | H01L 51/5028 |
| | | | 257/40 |
| 2016/0276602 A1 | 9/2016 | Yoshinaga et al. | |
| 2017/0053970 A1 | 2/2017 | Ishisone et al. | |

\* cited by examiner

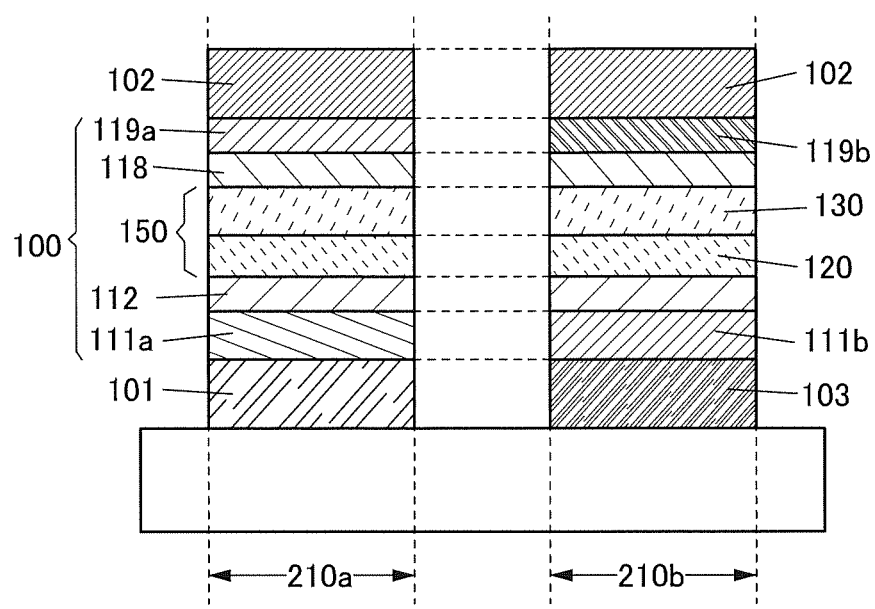

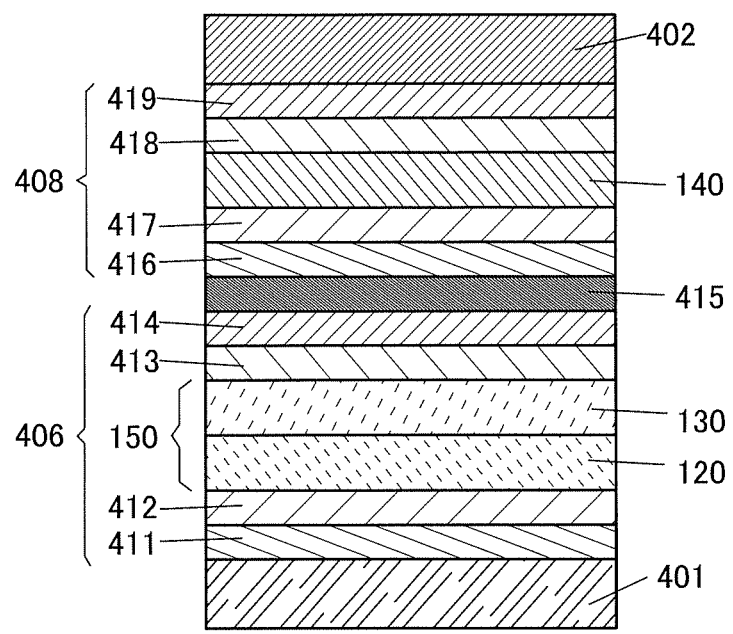

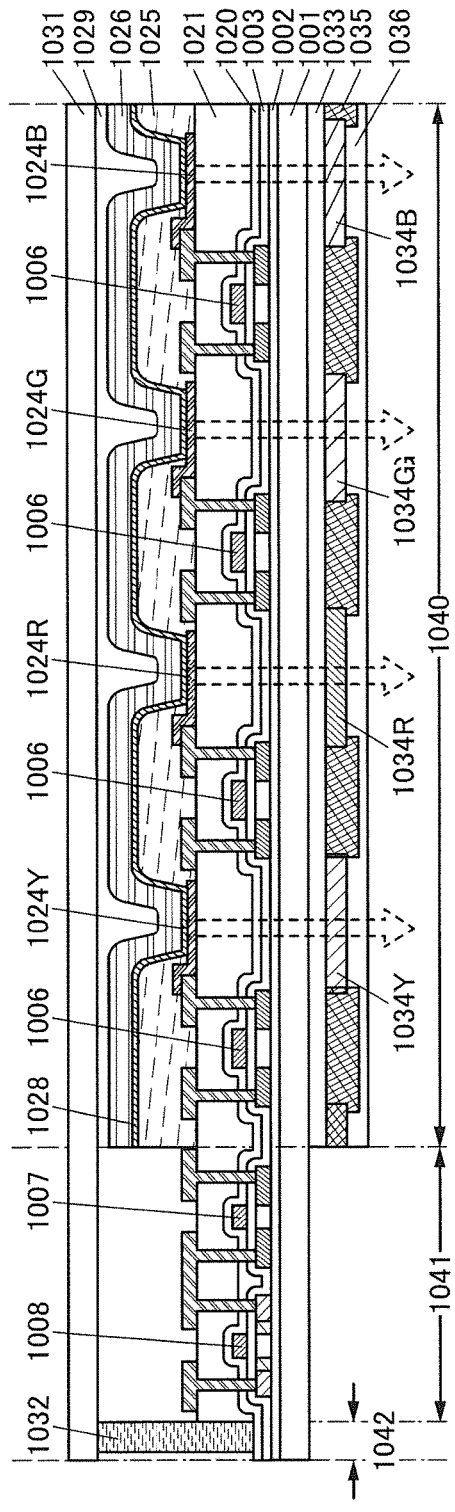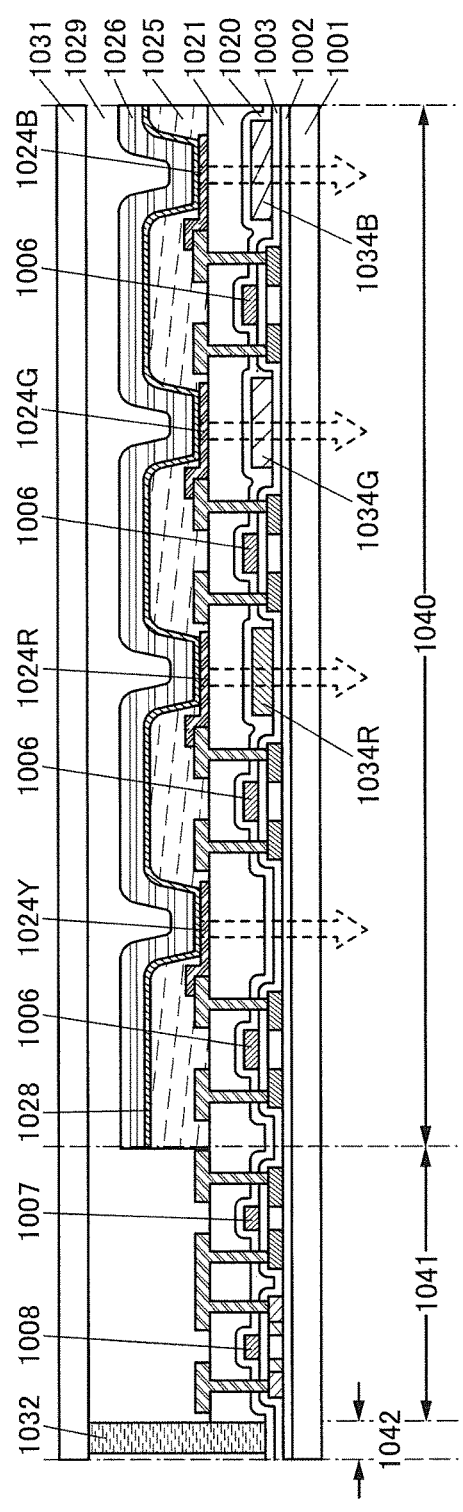

3500

3600

LIGHT-EMITTING ELEMENT, DISPLAY ELEMENT, DISPLAY DEVICE, ELECTRONIC DEVICE, AND LIGHTING DEVICE

This application is a continuation of copending U.S. application Ser. No. 15/050,779, filed on Feb. 23, 2016 which is incorporated herein by reference.

BACKGROUND OF THE INVENTION

1. Field of the Invention

One embodiment of the present invention relates to a light-emitting element, or one of a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

In recent years, research and development have been extensively conducted on light-emitting elements using electroluminescence (EL). In a basic structure of such a light-emitting element, a layer containing a light-emitting substance (an EL layer) is interposed between a pair of electrodes. By applying a voltage between the pair of electrodes of this element, light emission from the light-emitting substance can be obtained.

Since the above light-emitting element is of a self-luminous type, a display device using this light-emitting element has advantages such as high visibility, no necessity of a backlight, low power consumption, and the like. Further, the display device using the light-emitting element also has advantages in that it can be formed to be thin and lightweight, and has high response speed.

In the case where the above light-emitting element is used for a display device, there are the following two methods: a method of providing subpixels in a pixel with EL layers having functions of emitting light of different colors (hereinafter referred to as a separate coloring method) and a method of providing subpixels in a pixel with, for example, a common EL layer having a function of emitting white light and color filters each having a function of transmitting light of a different color (hereinafter referred to as a color filter method).

One of the advantages of the color filter method is that the EL layer can be shared by all of the subpixels. Therefore, compared with the separate coloring method, loss of a material of the EL layer and cost of patterning for forming the EL layer can be reduced; thus, display devices can be manufactured at low cost with high productivity. Further, although it is necessary, in the separate coloring method, to provide a space between the subpixels to prevent mixture of the materials of the EL layers in the subpixels, the color filter method does not need such a space and therefore enables a high-resolution display device having higher pixel density.

The light-emitting element can emit light of a variety of colors depending on the kind of light-emitting substance included in the EL layer. A light-emitting element which can emit white light or light of color close to white with high efficiency has been particularly demanded for the application to a lighting device and a display device utilizing the color filter method. In addition, a light-emitting element having low power consumption is required.

Increasing the extraction efficiency of light from a light-emitting element is important for higher emission efficiency of the light-emitting element. In order to increase the extraction efficiency of light from a light-emitting element, a method has been proposed, in which a micro optical resonator (microcavity) structure utilizing a resonant effect of light between a pair of electrodes is used to increase the intensity of light having a specific wavelength (e.g., see Patent Document 1).

As a light-emitting element that emits white light, an element including a charge-generation layer between a plurality of EL layers (a tandem element) has been proposed.

REFERENCE

Patent Document

[Patent Document 1] Japanese Published Patent Application No. 2012-182127

SUMMARY OF THE INVENTION

Since a tandem element uses light-emitting materials emitting light of different colors for different EL layers, it is suitable for forming a white-light-emitting element. However, many layers are stacked in the tandem element and thus there are problems of many manufacturing steps and high manufacturing cost.

When a display device that allows full-color display is manufactured by a separate coloring method, a step of vapor-depositing a light-emitting layer only on appropriate subpixels with a shadow mask having minute openings is necessary; therefore, the openings of the shadow mask need to be arranged (aligned) at required positions with high accuracy. Moreover, when a light-emitting layer is separately formed in a appropriate subpixel, a light-emitting substance enters an adjacent subpixel in some cases, which causes a problem of a decrease in yield in manufacturing display devices. A display device capable of high-resolution display requires higher alignment accuracy, which causes problems of a decrease in yield in manufacturing display devices and an increase in cost.

In contrast, the color filter method does not need such a shadow mask having minute openings; thus, a display device can be manufactured with high productivity. However, since a light-emitting layer for emitting white light is shared by subpixels in the color filter method, light of color which need not be emitted from the subpixels is also included. Thus, the color filter method has a problem of low light use efficiency, as compared with the separate coloring method.

In the microcavity structure, which is a technique for increasing the light extraction efficiency, the thicknesses of EL layers and electrodes need to be adjusted to obtain appropriate optical lengths between the electrodes for necessary emission colors of subpixels; therefore, a photomask and a shadow mask for separately forming such subpixels are necessary. This might cause problems of decreasing the yield in manufacturing display devices and increasing manufacturing cost.

A light-emitting element having excellent productivity is required. Higher emission efficiency is required for the light-emitting element that emits white light. Furthermore, a light-emitting element having high light use efficiency is required.

In view of the above-described problems, an object of one embodiment of the present invention is to provide a novel light-emitting element. Another object of one embodiment of the present invention is to provide a light-emitting element with high emission efficiency. In addition, another object is to provide a novel light-emitting element including an EL layer having a plurality of light-emitting layers. Another object of one embodiment of the present invention is to provide a light-emitting element that is easily formed in a relatively small number of steps for forming films. Another object of one embodiment of the present invention is to provide a light-emitting element with low power consumption. Another object of one embodiment of the present invention is to provide a novel light-emitting device. Another object of one embodiment of the present invention is to provide a novel display device.

Note that the description of these objects does not disturb the existence of other objects. In one embodiment of the present invention, there is no need to achieve all the objects. Other objects will be apparent from and can be derived from the description of the specification and the like.

One embodiment of the present invention is a light-emitting element in which carrier recombination regions are adjusted by using different injection layers included in an EL layer; thus, it is possible to adjust the colors of light emitted from the EL layer including a plurality of light-emitting layers.

Another embodiment of the present invention is a light-emitting element including an EL layer including a plurality of light-emitting layers, which can be formed to have a relatively small number of layers.

One embodiment of the present invention is a light-emitting element including a first electrode, a second electrode, and an EL layer between the first electrode and the second electrode. In the light-emitting element, the EL layer includes a first region and a second region. The first region includes a first injection layer, a first light-emitting layer, and a second light-emitting layer, and the second region includes a second injection layer, the first light-emitting layer, and the second light-emitting layer. The first injection layer includes a region in contact with the first electrode, and the second injection layer includes a region in contact with the first electrode. The first light-emitting layer includes a first light-emitting material and a first host material, and the second light-emitting layer includes a second light-emitting material and a second host material. The first light-emitting material has an emission spectrum different from an emission spectrum of the second light-emitting material, and a color of light to be emitted from the first region is different from a color of light to be emitted from the second region.

One embodiment of the present invention is a light-emitting element including a first electrode, a second electrode, a third electrode, and an EL layer. In the light-emitting element, the EL layer includes a first region and a second region, the first region is positioned between the first electrode and the second electrode, and the second region is positioned between the second electrode and the third electrode. The first region includes a first injection layer, a first light-emitting layer, and a second light-emitting layer, and the second region includes a second injection layer, the first light-emitting layer, and the second light-emitting layer. The first injection layer includes a region in contact with the first electrode, and the second injection layer includes a region in contact with the third electrode. The first light-emitting layer includes a first light-emitting material and a first host material, and the second light-emitting layer includes a second light-emitting material and a second host material. The first light-emitting material has an emission spectrum different from an emission spectrum of the second light-emitting material, and a color of light to be emitted from the first region is different from a color of light to be emitted from the second region.

One embodiment of the present invention is a light-emitting element including a first electrode, a second electrode, a third electrode, and an EL layer. In the light-emitting element, the EL layer includes a first region and a second region, the first region is positioned between the first electrode and the second electrode, and the second region is positioned between the second electrode and the third electrode. The first region includes a first injection layer, a first light-emitting layer, and a second light-emitting layer, and the second region includes a second injection layer, the first light-emitting layer, and the second light-emitting layer. The first injection layer includes a region in contact with the second electrode, and the second injection layer includes a region in contact with the second electrode. The first light-emitting layer includes a first light-emitting material and a first host material, and the second light-emitting layer includes a second light-emitting material and a second host material. The first light-emitting material has an emission spectrum different from an emission spectrum of the second light-emitting material, and a color of light to be emitted from the first region is different from a color of light to be emitted from the second region.

One embodiment of the present invention is a light-emitting element including a first electrode, a second electrode, a third electrode, and an EL layer. In the light-emitting element, the EL layer includes a first region, a second region, and a third region, the first region and the second region are positioned between the first electrode and the second electrode, and the third region is positioned between the second electrode and the third electrode. The first electrode includes a first conductive film capable of transmitting visible light, and the third electrode includes a second conductive film capable of transmitting visible light. The first region includes a first injection layer, a first light-emitting layer, and a second light-emitting layer, the second region includes a second injection layer, the first light-emitting layer, and the second light-emitting layer, and the third region includes the second injection layer, the first light-emitting layer, and the second light-emitting layer. In the first region, the first injection layer includes a region in contact with the first electrode. In the second region, the second injection layer includes a region in contact with the first electrode. In the third region, the second injection layer includes a region in contact with the third electrode. The first light-emitting layer includes a first light-emitting material and a first host material, and the second light-emitting layer includes a second light-emitting material and a second host material. The first light-emitting material has an emission spectrum different from an emission spectrum of the second light-emitting material. The second conductive film includes a region having a larger thickness than the first conductive film, and the second injection layer includes a region having a larger thickness than the first injection layer. In an emission spectrum of light emitted from the third region, a peak wavelength is longer than a peak wavelength in an emission spectrum of light emitted from the second region. In the emission spectrum of light emitted from the second region, the peak wavelength is longer than a peak wavelength in an emission spectrum of light emitted from the first region.

In the above-described structure, the light emitted from the first region preferably has at least one peak in a wavelength range higher than or equal to 400 nm and lower than 480 nm in the emission spectrum, the light emitted from the second region preferably has at least one peak in a wavelength range higher than or equal to 480 nm and lower than 580 nm in the emission spectrum, and the light emitted from the third region preferably has at least one peak in a wavelength range higher than or equal to 580 nm and lower than or equal to 740 nm in the emission spectrum.

In each of the above-described structures, a region in the first electrode and a region in the third electrode preferably include the same material.

In each of the above-described structures, the first injection layer preferably includes a first acceptor material and a first donor material, and the second injection layer preferably includes a second acceptor material and a second donor material.

In each of the above-described structures, the first injection layer preferably includes a first acceptor material and a first donor material, and the second injection layer preferably includes the first acceptor material and a second donor material.

In each of the above-described structures, the first injection layer preferably includes a first acceptor material and a first donor material, and the second injection layer preferably includes a second acceptor material and the first donor material.

In each of the above-described structures, the first injection layer preferably includes a first acceptor material and a first donor material, the second injection layer preferably includes a first acceptor material and a first donor material, and a mixing ratio of the first acceptor material to the first donor material in the first injection layer is preferably different from a mixing ratio of the first acceptor material to the first donor material in the second injection layer.

In each of the above-described structures, a HOMO level of the first donor material is preferably different from that of the second donor material.

In each of the above-described structures, the EL layer preferably includes a carrier transport layer, the carrier transport layer preferably includes a region in contact with the first injection layer, the carrier transport layer preferably includes a region in contact with the second injection layer, the carrier transport layer preferably includes a carrier-transport material, and a HOMO level of the carrier-transport material is preferably positioned between a HOMO level of the first donor material and a HOMO level of the second donor material.

In each of the above-described structures, the EL layer preferably includes a carrier transport layer, the carrier transport layer preferably includes a region in contact with the first injection layer, the carrier transport layer preferably includes a region in contact with the second injection layer, the carrier transport layer preferably includes a carrier-transport material, and a HOMO level of the carrier-transport material is preferably equal to one of a HOMO level of the first donor material and a HOMO level of the second donor material and different from the other of the HOMO level of the first donor material and the HOMO level of the second donor material.

In each of the above-described structures, a conductivity of the first injection layer is preferably different from a conductivity of the second injection layer.

In each of the above-described structures, the first light-emitting material preferably has a peak of an emission spectrum in a wavelength range of at least one color selected from violet, blue, and blue green, and the second light-emitting material preferably has a peak of an emission spectrum in a wavelength range of at least one color selected from green, yellow green, yellow, orange, and red.

In each of the above-described structures, a singlet excitation energy level of the first host material is preferably higher than a singlet excitation energy level of the first light-emitting material, and a triplet excitation energy level of the first host material is lower than that of the first light-emitting material.

In each of the above-described structures, the second host material preferably includes a first compound and a second compound, and the first compound and the second compound preferably form an exciplex.

In the above-described structure, a triplet excitation energy level of the first host material is preferably lower than a triplet excitation energy level of the first compound, and the triplet excitation energy level of the first host material is lower than a triplet excitation energy level of the second compound.

In each of the above-described structures, the light-emitting element preferably includes a region in which the first light-emitting layer and the second light-emitting layer are in contact with each other.

In each of the above-described structures, the first light-emitting material is preferably capable of converting singlet excitation energy into light emission, and the second light-emitting material is preferably capable of converting triplet excitation energy into light emission.

Another embodiment of the present invention is a display device including the light-emitting element having any of the above-described structures, and at least one of a color filter and a transistor. Another embodiment of the present invention is an electronic device including the display device, and at least one of a housing and a touch sensor. Another embodiment of the present invention is a lighting device including the light-emitting element having any of the above-described structures, and at least one of a housing and a touch sensor. The category of one embodiment of the present invention includes not only the light-emitting device including the light-emitting element but also an electronic device including the light-emitting device. Accordingly, the light-emitting device in this specification refers to an image display device and a light source (e.g., a lighting device). The light-emitting device may be included in a display module in which a connector such as a flexible printed circuit (FPC) or a tape carrier package (TCP) is connected to a light-emitting device, a display module in which a printed wiring board is provided on the tip of a TCP, or a display module in which an integrated circuit (IC) is directly mounted on a light-emitting element by a chip on glass (COG) method.

With one embodiment of the present invention, a novel light-emitting element can be provided. With one embodiment of the present invention, a light-emitting element with high emission efficiency can be provided. With one embodiment of the present invention, a novel light-emitting element including an EL layer having a plurality of light-emitting layers can be provided. A light-emitting element that is easily formed in a relatively small number of steps for forming films can be provided. With one embodiment of the present invention, a light-emitting element with low power consumption can be provided. With one embodiment of the present invention, a novel light-emitting device can be provided. With one embodiment of the present invention, a novel display device can be provided.

Note that the description of these effects does not disturb the existence of other effects. One embodiment of the present invention does not necessarily have all the effects described above. Other effects will be apparent from and can be derived from the description of the specification, the drawings, the claims, and the like.

BRIEF DESCRIPTION OF THE DRAWINGS

In the accompanying drawings:

FIG. 3 is a schematic cross-sectional view of a light-emitting element of one embodiment of the present invention;

FIG. 11 is a schematic cross-sectional view of a light-emitting element of one embodiment of the present invention;

FIGS. 16A and 16B are schematic cross-sectional views each illustrating a display device of one embodiment of the present invention;

DETAILED DESCRIPTION OF THE INVENTION

Figure 1:
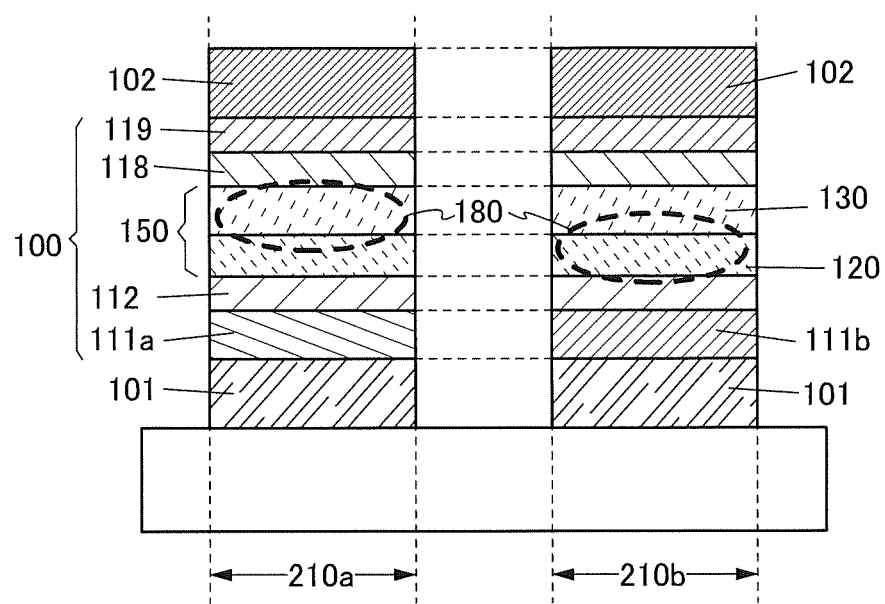
FIG. 1 is a schematic cross-sectional view of a light-emitting element of one embodiment of the present invention.

Embodiments of the present invention will be described below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like are not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a singlet excited state refers to a singlet state having excited energy. The lowest level of the singlet excited energy level (S1 level) refers to the excited energy level of the lowest singlet excited state. A triplet excited state refers to a triplet state having excited energy. The lowest level of the triplet excited energy level (T1 level) refers to the excited energy level of the lowest triplet excited state.

In this specification and the like, a fluorescent material refers to a material that emits light in the visible light region when the singlet excited state relaxes to the ground state. A phosphorescent material refers to a material that emits light in the visible light region at room temperature when the triplet excited state relaxes to the ground state. That is, a phosphorescent material refers to a material that can convert triplet excited energy into visible light.

Note that in this specification and the like, "room temperature" refers to a temperature higher than or equal to 0° C. and lower than or equal to 40° C.

In general, color is defined by three aspects of hue (corresponding to the wavelength of light of a single color), chroma (saturation, i.e., the degree to which it differs from white), and value (brightness, i.e., the intensity of light). In this specification and the like, color may be defined by only one of the above three aspects or two of the aspects which are selected arbitrarily. In this specification, a difference between two colors of light means a difference in at least one of the above three aspects and includes a difference in the shape between two spectra of light or in the distribution of the relative intensity of the peaks between two spectra of light.

In this specification and the like, a wavelength range of blue refers to a wavelength range of greater than or equal to 400 nm and less than 480 nm, and blue light has at least one peak in that wavelength range in an emission spectrum. A wavelength range of green refers to a wavelength range of greater than or equal to 480 nm and less than 580 nm, and green light has at least one peak in that wavelength range in an emission spectrum. A wavelength range of red refers to a wavelength range of greater than or equal to 580 nm and less than or equal to 740 nm, and red light has at least one peak in that wavelength range in an emission spectrum.

Embodiment 1

In this embodiment, a light-emitting element of one embodiment of the present invention will be described below with reference to FIG. 1, FIGS. 2A and 2B, FIG. 3, FIGS. 4A and 4B, FIGS. 5A and 5B, FIGS. 6A to 6C, and FIGS. 7A to 7C.

<Structure Example 1 of Light-Emitting Element>

First, a structure of the light-emitting element of one embodiment of the present invention will be described with reference to FIG. 1.

FIG. 1 is a schematic cross-sectional view of a light-emitting element 250 of one embodiment of the present invention.

The light-emitting element 250 includes a pair of electrodes (an electrode 101 and an electrode 102) and an EL layer 100 between the pair of electrodes. The EL layer 100 includes at least a light-emitting layer 150.

The light-emitting element 250 includes a region 210a and a region 210b. The EL layer 100 includes a carrier-injection layer 111a in contact with the electrode 101 in the region 210a, and a carrier-injection layer 111b in contact with the electrode 101 in the region 210b.

The EL layer 100 illustrated in FIG. 1 includes functional layers such as a carrier-transport layer 112, a carrier-transport layer 118 and a carrier-injection layer 119, in addition to the light-emitting layer 150 and the carrier-injection layers 111a and 111b. The light-emitting layer 150 includes at least a light-emitting layer 120 and a light-emitting layer 130.

In this embodiment, although description is given assuming that the electrode 101 and the electrode 102 of the pair of electrodes serve as an anode and a cathode, respectively, they are not limited thereto for the structure of the light-emitting element 250. That is, the electrode 101 may be a cathode, the electrode 102 may be an anode, and the stacking order of the layers between the electrodes may be reversed. In other words, the hole-injection layer, the hole-transport layer, the light-emitting layer, the electron-transport layer, and the electron-injection layer may be stacked in this order from the anode side. Accordingly, the carrier-injection layers 111a and 111b may be either hole-injection layers or electron-injection layers. Furthermore, the carrier-transport layer 112, the carrier-transport layer 118, and the carrier-injection layer 119 may be a hole-transport layer, an electron-transport layer, and an electron-injection layer, respectively, or may be an electron-transport layer, a hole-transport layer, and a hole-injection layer, respectively.

The structure of the EL layer 100 is not limited to the structure illustrated in FIG. 1, and a structure including at least one layer selected from the carrier-transport layer 112, the carrier-transport layer 118, and the carrier-injection layer 119 may be employed. Alternatively, the EL layer 100 may include a functional layer which is capable of lowering a carrier (hole or electron) injection barrier, improving a carrier (hole or electron)-transport property, inhibiting a carrier (hole or electron)-transport property, or suppressing a quenching phenomenon by an electrode, for example. Note that the functional layers may each be a single layer or stacked layers.

In the light-emitting element 250 of one embodiment of the present invention, voltage application between the pair of electrodes (the electrodes 101 and 102) allows electrons and holes to be injected from the cathode and the anode, respectively, into the EL layer 100 and thus current flows. By recombination of the injected carriers (electrons and holes), excitons are formed. When carriers (electrons and holes) recombine and excitons are formed in the light-emitting layer 150 including light-emitting materials, the light-emitting materials in the light-emitting layer 150 are brought into an excited state, causing light emission from the light-emitting materials.

Therefore, it is important for increasing emission efficiency to adjust the region for the recombination of carriers (electrons and holes) (this region is also referred to as a carrier recombination region) so that the region can be distributed within the light-emitting layer 150. The carrier recombination in the light-emitting layer 150 forms a region where the light-emitting material emits light (also referred to as a light-emitting region) in the light-emitting layer 150.

When the light-emitting layer 150 includes at least two light-emitting layers (the light-emitting layer 120 and the light-emitting layer 130) as in the light-emitting element 250, a light-emitting region 180 is distributed over a region in the light-emitting layer 120 and the light-emitting layer 130 as illustrated in FIG. 1. In the case where more carriers recombine in either one of the light-emitting layers 120 and 130, a larger part of the light-emitting region 180 is distributed in the one light-emitting layer, which causes the one light-emitting layer to emit more light and the other light-emitting layer to emit less light. In the case where carrier recombination occurs evenly in both of the light-emitting layers, the light-emitting region 180 is distributed evenly in both of the light-emitting layers, which results in balanced light emission from both of the light-emitting layers.

The region where the carrier recombination region and the light-emitting region of the light-emitting element are distributed is influenced by the carrier (electron and hole)-injection property and the carrier-transport property in the hole-injection layer, the hole-transport layer, the light-emitting layer, the electron-transport layer, and the electron-injection layer. By controlling the carrier-injection property and the carrier-transport property, the region where the carrier recombination region and the light-emitting region are distributed can be adjusted. In particular, the carrier-injection property and the carrier-transport property of the carrier-injection layer in contact with one of the pair of electrodes greatly influence the region where the carrier recombination region and the light-emitting region are distributed. Thus, by changing at least one of the carrier-injection property and the carrier-transport property of the carrier-injection layer, the region where the carrier recombination region and the light-emitting region are distributed can be changed.

For example, by increasing the carrier-injection property of the carrier-injection layer 111a in the light-emitting element 250, the light-emitting region 180 in the region 210a can be adjusted so that light emission can be obtained more from a region in the light-emitting layer 150 which is far from the carrier-transport layer 112 and close to the carrier-transport layer 118, that is, the light-emitting layer 130. By decreasing the carrier-injection property of the carrier-injection layer 111b, the light-emitting region 180 in the region 210b can be adjusted so that light emission can be obtained more from a region in the light-emitting layer 150 which is close to the carrier-transport layer 112 and far from the carrier-transport layer 118, that is, the light-emitting layer 120.

In the case where the light-emitting layer 120 and the light-emitting layer 130 included in the light-emitting layer 150 have different emission colors, adjusting the region where the carrier recombination region and the light-emitting region are distributed can strengthen the emission color of light emitted from one of the light-emitting layers. In other words, light emitted from the region 210a and light emitted from the region 210b can have different emission colors or emission spectra. Furthermore, in order to obtain different colors of light between the region 210a and the region 210b, the light-emitting region 180 can be adjusted by utilizing the above-described structure so that desired colors of light can be obtained from the region 210a and the region 210b; in this way, light extraction efficiency can be improved.

In the case where the carrier-injection layers 111a and 111b are hole-injection layers, the carrier-injection layers 111a and 111b are, for example, formed of materials having ionization potentials substantially equal to or lower than the work function of the electrode 101, whereby the property of injecting holes from the electrode 101 to the carrier-injection layers 111a and 111b can be increased. When the carrier-injection layers 111a and 111b are, for example, formed of materials having ionization potentials higher than the work function of the electrode 101, a hole injection barrier is generated at the interface between the electrode 101 and the carrier-injection layers 111a and 111b, whereby the property of injecting holes from the electrode 101 to the carrier-injection layers 111a and 111b can be decreased.

In other words, one embodiment of the present invention is a light-emitting element in which the material of the carrier-injection layer 111a and the material of the carrier-injection layer 111b have different ionization potentials from each other, so that the carrier-injection layer 111a and the carrier-injection layer 111b can have different degrees of carrier-injection property. One embodiment of the present invention is a light-emitting element in which the material of the carrier-injection layer 111a and the material of the carrier-injection layer 111b have different highest occupied molecular orbital (HOMO) levels from each other, so that the carrier-injection layer 111a and the carrier-injection layer 111b have different degrees of hole-injection property. One embodiment of the present invention is a light-emitting element in which the material of the carrier-injection layer 111a and the material of the carrier-injection layer 111b have different lowest unoccupied molecular orbital (LUMO) levels from each other, so that the carrier-injection layer 111a and the carrier-injection layer 111b have different degrees of electron-injection property. Thus, the region where the carrier recombination region and the light-emitting region are distributed can be changed between the region 210a and the region 210b of the light-emitting element 250, which is preferable.

Furthermore, in the case where the carrier-injection layers 111a and 111b are hole-injection layers, the carrier-injection layers 111a and 111b are, for example, formed of materials having lower HOMO levels than a material used for the carrier-transport layer 112, whereby the hole-transport property from the carrier-injection layers 111a and 111b to the carrier-injection layer 112 can be increased. When the carrier-injection layers 111a and 111b are formed of materials having higher HOMO levels than the material used for the carrier-transport layer 112, a hole injection barrier is generated at the interface between the carrier-injection layers 111a and 111b and the carrier-transport layer 112, whereby the hole-transport property from the carrier-injection layers 111a and 111b to the carrier-transport layer 112 can be decreased.

In the case where the carrier-injection layers 111a and 111b are electron-injection layers, the carrier-injection layers 111a and 111b are, for example, formed of materials having higher LUMO levels than the material used for the carrier-transport layer 112, whereby the electron-transport property from the carrier-injection layers 111a and 111b to the carrier-transport layer 112 can be increased. When the carrier-injection layers 111a and 111b are formed of materials having lower LUMO levels than the material used for the carrier-transport layer 112, an electron injection barrier is generated at the interface between the carrier-injection layers 111a and 111b and the carrier-transport layer 112, whereby the electron-transport property from the carrier-injection layers 111a and 111b to the carrier-transport layer 112 can be decreased.

In other words, one embodiment of the present invention is a light-emitting element in which the HOMO level of the material included in the carrier-transport layer 112 is located between the HOMO level of the material included in the carrier-injection layer 111a and the HOMO level of the material included in the carrier-injection layer 111b. One embodiment of the present invention is a light-emitting element in which the HOMO level of the material included in the carrier-transport layer 112 is equal to one of the HOMO level of the material included in the carrier-injection layer 111a and the HOMO level of the material included in the carrier-injection layer 111b and is different from the other. The region where the carrier recombination region and the light-emitting region are distributed can be changed between the region 210a and the region 210b, which is preferable.

Alternatively, one embodiment of the present invention is a light-emitting element in which the LUMO level of the material included in the carrier-transport layer 112 is located between the LUMO level of the material included in the carrier-injection layer 111a and the LUMO level of the material included in the carrier-injection layer 111b. One embodiment of the present invention is a light-emitting element in which the LUMO level of the material included in the carrier-transport layer 112 is equal to one of the LUMO level of the material included in the carrier-injection layer 111a and the LUMO level of the material included in the carrier-injection layer 111b and is different from the other. Thus, the region where the carrier recombination region and the light-emitting region are distributed can be changed between the region 210a and the region 210b, which is preferable.

The conductivity of the carrier-injection layer 111a is preferably different from that of the carrier-injection layer 111b, whereby the carrier-injection layer 111a and the carrier-injection layer 111b can have different degrees of carrier-transport property. This can change the region where the carrier recombination region and the light-emitting region are distributed, between the region 210a and the region 210b.

In the case where the carrier-injection layers 111a and 111b are electron-injection layers, the carrier-injection layers 111a and 111b preferably include a material having a high property of injecting electrons from the electrode 101. For example, the carrier-injection layers 111a and 111b can include a Group 1 metal, a Group 2 metal, an oxide of these metals, a halide of these metals, a carbonate of these metals, or the like.

The carrier-injection layers 111a and 111b may include a composite material obtained by mixing an organic material (an acceptor material) and an electron donor (a donor material). Such a composite material is excellent in an electron-injection property and an electron-transport property because electrons are generated in the organic material by the electron donor. In this case, the organic material is preferably a material excellent in transporting generated electrons (electron-transport material), and can specifically be a metal complex, a heteroaromatic compound, or the like. As the electron donor, a material showing an electron donating property to the organic material may be used. Specifically, a Group 1 metal, a Group 2 metal, an oxide of these metals, or the like can be used.

In the case where the carrier-injection layers 111a and 111b functioning as electron-injection layers are formed of such a composite material, the electron-injection property of the electron-injection layers can be changed by changing the electron-transport material (acceptor material). Alternatively, the electron-injection property of the electron-injection layers can be changed by changing the electron donor (donor material). Further alternatively, the electron-injection property of the electron-injection layers can be changed by changing the mixing ratio between the electron-transport material (acceptor material) and the electron donor (donor material).

In the case where the carrier-injection layers 111a and 111b are hole-injection layers, the carrier-injection layers 111a and 111b may be formed of a material having a high property of injecting holes from the electrode 101. For example, the carrier-injection layers 111a and 111b are preferably formed of a transition metal oxide, a phthalocyanine derivative, an aromatic amine, or the like.

Furthermore, the carrier-injection layers 111a and 111b functioning as hole-injection layers can be formed of a composite material containing a hole-transport material having a function of a donor material and an electron acceptor (acceptor material). Such a composite material is excellent in a hole-injection property and a hole-transport property because electrons are extracted from the hole-transport material (donor material) by the acceptor material to generate holes.

In the case where the carrier-injection layers 111a and 111b functioning as hole-injection layers are formed of a composite material containing a hole-transport material (donor material) and an acceptor material, the hole-injection property of the hole-injection layers can be changed by changing the hole-transport material (donor material). Alternatively, the hole-injection property of the hole-injection layers can be changed by changing the acceptor material. Further alternatively, the hole-injection property of the hole-injection layers can be changed by changing the mixing ratio between the hole-transport material (donor material) and the acceptor material.

As described above, one embodiment of the present invention is a light-emitting element in which an EL layer includes at least two light-emitting layers, the EL layer includes a first injection layer containing a first acceptor material and a first donor material in a first region, and the EL layer includes a second injection layer containing a second acceptor material and a second donor material in a second region. Alternatively, one embodiment of the present invention is a light-emitting element in which an EL layer includes at least two light-emitting layers, the EL layer includes a first injection layer containing a first acceptor material and a first donor material in a first region, and the EL layer includes a second injection layer containing the first acceptor material and a second donor material in a second region. Alternatively, one embodiment of the present invention is a light-emitting element in which an EL layer includes at least two light-emitting layers, the EL layer includes a first injection layer containing a first acceptor material and a first donor material in a first region, and the EL layer includes a second injection layer containing a second acceptor material and the first donor material in a second region. Alternatively, one embodiment of the present invention is a light-emitting element in which an EL layer includes at least two light-emitting layers, the EL layer includes a first injection layer containing a first acceptor material and a first donor material in a first region, the EL layer includes a second injection layer containing the first acceptor material and the first donor material in a second region, and the mixing ration between the first acceptor material and the first donor material in the first injection layer is different from that in the second injection layer. In these ways, the region where the carrier recombination region and the light-emitting region are distributed can be changed between the first region and the second region. Consequently, the color of light emitted from the EL layer in the first region can be made different from that in the second region.

Note that when the EL layer in the first region includes the first injection layer containing the first donor material and the EL layer in the second region includes the second injection layer containing the second donor material, the HOMO level of the first donor material is preferably different from that of the second donor material. Further, when the EL layer includes a carrier-transport layer in contact with the first injection layer and the second injection layer in the first region and the second region, the HOMO level of a carrier-transport material included in the carrier-transport layer is preferably located between the HOMO level of the first donor material and the HOMO level of the second donor material. Further, when the EL layer includes a carrier-transport layer in contact with the first injection layer and the second injection layer in the first region and the second region, the HOMO level of the carrier-transport material included in the carrier-transport layer is preferably equal to one of the HOMO level of the first donor material and the HOMO level of the second donor material and different from the other. In this case, since these injection layers and carrier-transport layer function as hole-injection layers and a hole-transport layer, respectively, the difference in the HOMO level can result in different degrees of hole-injection property from the anode to the hole-injection layer or from the hole-injection layer to the hole-transport layer, whereby the region where the carrier recombination region and the light-emitting region are distributed can be changed between the first region and the second region. Consequently, the color of light emitted from the EL layer in the first region can be made different from that in the second region.

Note that when the EL layer in the first region includes the first injection layer containing the first acceptor material and the EL layer in the second region includes the second injection layer containing the second acceptor material, the LUMO level of the first acceptor material is preferably different from that of the second acceptor material. Further, when the EL layer includes a carrier-transport layer in contact with the first injection layer and the second injection layer in the first region and the second region, the LUMO level of a carrier-transport material included in the carrier-transport layer is preferably located between the LUMO level of the first acceptor material and the LUMO level of the second acceptor material. Further, when the EL layer includes a carrier-transport layer in contact with the first injection layer and the second injection layer in the first region and the second region, the LUMO level of the carrier-transport material included in the carrier-transport layer is preferably equal to one of the LUMO level of the first acceptor material and the LUMO level of the second acceptor material and different from the other. In this case, since these injection layers and carrier-transport layer function as electron-injection layers and an electron-transport layer, respectively, the difference in the LUMO level can result in different degrees of electron-injection property from the cathode to the electron-injection layer or from the electron-injection layer to the electron-transport layer, whereby the region where the carrier recombination region and the light-emitting region are distributed can be changed between the first region and the second region. Consequently, the color of light emitted from the EL layer in the first region can be made different from that in the second region.

<Structure Example 2 of Light-Emitting Element>

Next, a structure example different from the light-emitting element 250 illustrated in FIG. 1 will be described below with reference to FIG. 2A.

Figure 2A:
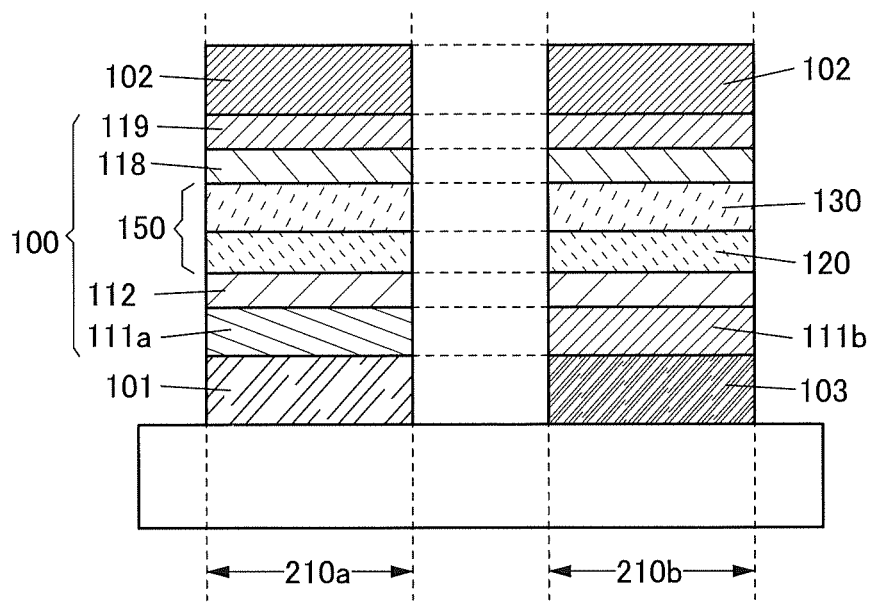
FIGS. 2A and 2B are each a schematic cross-sectional view of a light-emitting element of one embodiment of the present invention.

FIG. 2A is a schematic cross-sectional view of a light-emitting element of one embodiment of the present invention. In FIG. 2A, a portion having a function similar to that in FIG. 1 is represented by the same hatch pattern as in FIG. 1 and not especially denoted by a reference numeral in some cases. In addition, common reference numerals are used for portions having similar functions, and a detailed description of such portions is not repeated in some cases.

A light-emitting element 252 illustrated in FIG. 2A includes the electrode 101, the electrode 102, an electrode 103, and the EL layer 100. The EL layer 100 includes at least the light-emitting layer 150, and the light-emitting layer 150 includes the light-emitting layer 120 and the light-emitting layer 130. Furthermore, the EL layer 100 includes the region 210*a* where the EL layer 100 is sandwiched between the electrode 101 and the electrode 102 and the region 210*b* where the EL layer 100 is sandwiched between the electrode 103 and the electrode 102. The EL layer 100 includes the carrier-injection layer 111*a* in contact with the electrode 101 in the region 210*a*, and the carrier-injection layer 111*b* in contact with the electrode 103 in the region 210*b*.

In other words, in the light-emitting element 252, the structure of the electrode 101 and the carrier-injection layer 111*a* in contact with the electrode 101 in the region 210*a* is different from the structure of the electrode 103 and the carrier-injection layer 111*b* in contact with the electrode 103 in the region 210*b*.

When the electrode 101 and the electrode 103 include conductive materials having different work functions from each other, the carrier-injection layer 111*a*, the carrier-injection layer 111*b*, the electrode 101, and the electrode 103 are selected so that the difference between the ionization potential of the material included in the carrier-injection layer 111*a* and the work function of the electrode 101 is different from the difference between the ionization potential of the material included in the carrier-injection layer 111*b* and the work function of the electrode 103. In this way, the light-emitting element can have different degrees of carrier-injection property between the region 210*a* and the region 210*b*. Consequently, the region where the carrier recombination region and the light-emitting region are distributed can be changed between the region 210*a* and the region 210*b* of the light-emitting element 252, which is preferable.

In the case where the light-emitting layer 120 and the light-emitting layer 130 included in the light-emitting layer 150 have different emission colors, adjusting the region where the carrier recombination region and the light-emitting region are distributed can strengthen the emission color of light emitted from one of the light-emitting layers. In other words, light emitted from the region 210*a* and light emitted from the region 210b can be made different from each other. Furthermore, in order to obtain different colors of light between the region 210a and the region 210b, the light-emitting region can be adjusted by utilizing the above-described structure so that desired colors of light can be obtained from the region 210a and the region 210b; in this way, light extraction efficiency can be improved.

The thickness of the electrode 101 may be different from that of the electrode 103. In this case, it is favorable to adjust the optical length between the electrode 101 and the electrode 102 so as to be appropriate for the color of light emitted from the region 210a, and adjust the optical length between the electrode 102 and the electrode 103 so as to be appropriate for the color of light emitted from the region 210b, whereby light extraction efficiency can be increased. Specifically, in the case where the refractive indexes of the conductive materials included in the electrodes 101 to 103 are lower than the refractive indexes of the materials included in the light-emitting layer 150, the thicknesses of the electrode 101, the electrode 102, and/or the EL layer 100 may be adjusted so that the optical length between the electrode 101 and the electrode 102 can become $m_1\lambda_1/2$ ($m_1$ is a natural number, and $\lambda_1$ is the wavelength of light emitted from the region 210a in the EL layer 100). Alternatively, the thicknesses of the electrode 102, the electrode 103, and/or the EL layer 100 may be adjusted so that the optical length between the electrode 102 and the electrode 103 can become $m_2\lambda_2/2$ ($m_2$ is a natural number, and $\lambda_2$ is the wavelength of light emitted from the region 210b in the EL layer 100).

Note that the structure of the light-emitting element 250 may be referred to for the other structure in the light-emitting element 252.

<Structure Example 3 of Light-Emitting Element>

Next, a structure example different from the light-emitting element 250 illustrated in FIG. 1 will be described below with reference to FIG. 2B.

Figure 2B:
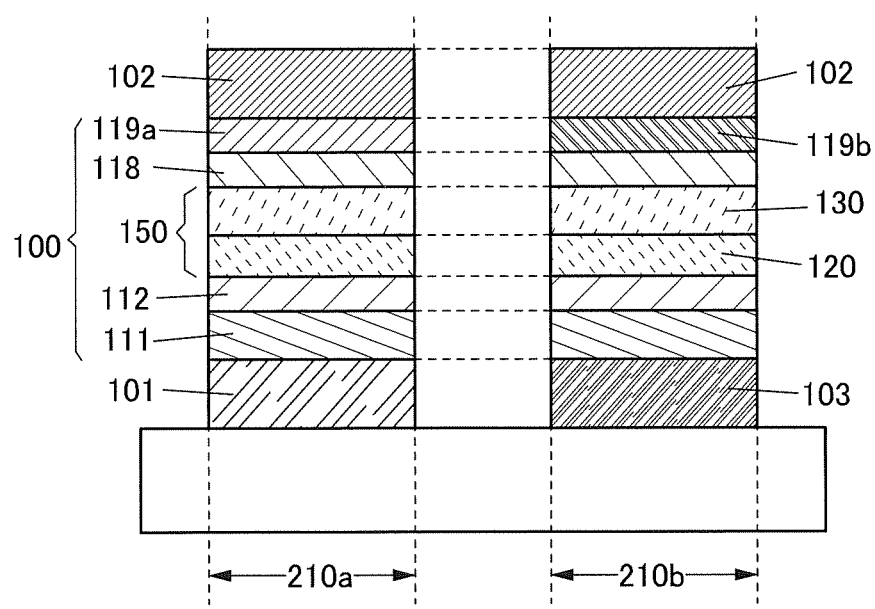

FIG. 2B is a schematic cross-sectional view of a light-emitting element of one embodiment of the present invention. In FIG. 2B, a portion having a function similar to that in FIG. 1 is represented by the same hatch pattern as in FIG. 1 and not especially denoted by a reference numeral in some cases. In addition, common reference numerals are used for portions having similar functions, and a detailed description of such portions is not repeated in some cases.

A light-emitting element 254 illustrated in FIG. 2B includes the electrode 101, the electrode 102, an electrode 103, and the EL layer 100. The EL layer 100 includes a carrier-injection layer 111 and the light-emitting layer 150, and the light-emitting layer 150 includes the light-emitting layer 120 and the light-emitting layer 130. Furthermore, the EL layer 100 includes the region 210a where the EL layer 100 is sandwiched between the electrode 101 and the electrode 102 and the region 210b where the EL layer 100 is sandwiched between the electrode 103 and the electrode 102. The EL layer 100 includes a carrier-injection layer 119a in contact with the electrode 102 in the region 210a, and a carrier-injection layer 119b in contact with the electrode 102 in the region 210b.

In other words, in the light-emitting element 254, the structure of the electrode 101 and the carrier-injection layer 119a in contact with the electrode 102 in the region 210a is different from the structure of the electrode 103 and the carrier-injection layer 119b in contact with the electrode 102 in the region 210b. Note that in the light-emitting element 254, although the EL layer 100 includes at least the carrier-injection layer 119a in the region 210a and the carrier-injection layer 119b in the region 210b, the electrode 101 and the electrode 103 may be of a same electrode.

For example, by decreasing the carrier-injection property of the carrier-injection layer 119a in the light-emitting element 254, the light-emitting region in the region 210a can be adjusted so that light emission can be obtained more from a region in the light-emitting layer 150 which is far from the carrier-transport layer 112 and close to the carrier-transport layer 118, that is, the light-emitting layer 130. By increasing the carrier-injection property of the carrier-injection layer 119b, the light-emitting region in the region 210b can be adjusted so that light emission can be obtained more from a region in the light-emitting layer 150 which is close to the carrier-transport layer 112 and far from the carrier-transport layer 118, that is, the light-emitting layer 120.

In the case where the light-emitting layer 120 and the light-emitting layer 130 included in the light-emitting layer 150 have different emission colors, adjusting the region where the carrier recombination region and the light-emitting region are distributed can strengthen the emission color of light emitted from one of the light-emitting layers. In other words, light emitted from the region 210a and light emitted from the region 210b can be made different from each other. Furthermore, in order to obtain different colors of light between the region 210a and the region 210b, the light-emitting region can be adjusted by utilizing the above-described structure so that desired colors of light can be obtained from the region 210a and the region 210b; in this way, light extraction efficiency can be improved.

Accordingly, one embodiment of the present invention is a light-emitting element in which the material included in the carrier-injection layer 119a and the material included in the carrier-injection layer 119b have different HOMO levels so that the carrier-injection layer 119a and the carrier-injection layer 119b have different degrees of hole-injection property. One embodiment of the present invention is a light-emitting element in which the material included in the carrier-injection layer 119a and the material included in the carrier-injection layer 119b have different LUMO levels so that the carrier-injection layer 119a and the carrier-injection layer 119b have different degrees of electron-injection property. Consequently, the region where the carrier recombination region and the light-emitting region are distributed can be changed between the region 210a and the region 210b of the light-emitting element 254, which is preferable.

In the case where the carrier-injection layers 119a and 119b are hole-injection layers, the carrier-injection layers 119a and 119b are, for example, formed of materials having lower HOMO levels than the material used in the carrier-transport layer 118, whereby the hole-transport property from the carrier-injection layers 119a and 119b to the carrier-transport layer 118 can be increased. When the carrier-injection layers 119a and 119b are formed of materials having higher HOMO levels than the material used in the carrier-transport layer 118, a hole injection barrier is generated at the interface between the carrier-injection layers 119a and 119b and the carrier-transport layer 118, whereby the hole-transport property from the carrier-injection layers 119a and 119b to the carrier-transport layer 118 can be decreased.

In the case where the carrier-injection layers 119a and 119b are electron-injection layers, the carrier-injection layers 119a and 119b are, for example, formed of materials having higher LUMO levels than the material used for the carrier-transport layer 118, whereby the electron-transport property from the carrier-injection layers 119a and 119b to the carrier-transport layer 118 can be increased. When the carrier-injection layers 119a and 119b are formed of materials having lower LUMO levels than the material used for the carrier-transport layer 118, an electron injection barrier is generated at the interface between the carrier-injection layers 119a and 119b and the carrier-transport layer 118, whereby the electron-transport property from the carrier-injection layers 119a and 119b to the carrier-transport layer 118 can be decreased.

In other words, one embodiment of the present invention is a light-emitting element in which the HOMO level of the material included in the carrier-transport layer 118 is located between the HOMO level of the material included in the carrier-injection layer 119a and the HOMO level of the material included in the carrier-injection layer 119b. One embodiment of the present invention is a light-emitting element in which the HOMO level of the material included in the carrier-transport layer 118 is equal to one of the HOMO level of the material included in the carrier-injection layer 119a and the HOMO level of the material included in the carrier-injection layer 119b and is different from the other. Thus, the region where the carrier recombination region and the light-emitting region are distributed can be changed between the region 210a and the region 210b, which is preferable.

Alternatively, one embodiment of the present invention is a light-emitting element in which the LUMO level of the material included in the carrier-transport layer 118 is located between the LUMO level of the material included in the carrier-injection layer 119a and the LUMO level of the material included in the carrier-injection layer 119b. One embodiment of the present invention is a light-emitting element in which the LUMO level of the material included in the carrier-transport layer 118 is equal to one of the LUMO level of the material included in the carrier-injection layer 119a and the LUMO level of the material included in the carrier-injection layer 119b and is different from the other. Thus, the region where the carrier recombination region and the light-emitting region are distributed can be changed between the region 210a and the region 210b, which is preferable.

The conductivity of the carrier-injection layer 119a is preferably different from that of the carrier-injection layer 119b, whereby the carrier-injection layer 119a and the carrier-injection layer 119b can have different degrees of carrier-transport property. This can change the region where the carrier recombination region and the light-emitting region are distributed, between the region 210a and the region 210b.

In the case where the carrier-injection layers 119a and 119b are electron-injection layers, any of the above-described materials and structures that can be used for the case where the carrier-injection layers 111a and 111b are electron-injection layers in the light-emitting element 250 can be used. In the case where the carrier-injection layers 119a and 119b are hole-injection layers, any of the above-described materials and structures that can be used for the case where the carrier-injection layers 111a and 111b are hole-injection layers in the light-emitting element 250 can be used.

The thickness of the electrode 101 may be different from that of the electrode 103. In this case, it is favorable to adjust the optical length between the electrode 101 and the electrode 102 so as to be appropriate for the color of light emitted from the region 210a, and adjust the optical length between the electrode 102 and the electrode 103 so as to be appropriate for the color of light emitted from the region 210b, whereby light extraction efficiency can be increased. Specifically, in the case where the refractive indexes of the conductive materials included in the electrodes 101 to 103 are lower than the refractive indexes of the materials included in the light-emitting layer 150, the thicknesses of the electrode 101, the electrode 102, and/or the EL layer 100 may be adjusted so that the optical length between the electrode 101 and the electrode 102 can become $m_1\lambda_1/2$ ($m_1$ is a natural number, and $\lambda_1$ is the wavelength of light emitted from the region 210a in the EL layer 100). Alternatively, the thicknesses of the electrode 102, the electrode 103, and/or the EL layer 100 may be adjusted so that the optical length between the electrode 102 and the electrode 103 can become $m_2\lambda_2/2$ ($m_2$ is a natural number, and $\lambda_2$ is the wavelength of light emitted from the region 210b in the EL layer 100).

Note that the structure of the light-emitting element 250 or the light-emitting element 252 may be referred to for the other structure in the light-emitting element 254.

<Structure Example 4 of Light-Emitting Element>

Next, a structure example different from the light-emitting element 250 illustrated in FIG. 1 will be described below with reference to FIG. 3.

FIG. 3 is a schematic cross-sectional view of a light-emitting element of one embodiment of the present invention. In FIG. 3, a portion having a function similar to that in FIG. 1 is represented by the same hatch pattern as in FIG. 1 and not especially denoted by a reference numeral in some cases. In addition, common reference numerals are used for portions having similar functions, and a detailed description of such portions is not repeated in some cases.

A light-emitting element 256 illustrated in FIG. 3 includes the electrode 101, the electrode 102, the electrode 103, and the EL layer 100. The EL layer 100 includes at least the light-emitting layer 150, and the light-emitting layer 150 includes the light-emitting layer 120 and the light-emitting layer 130. Furthermore, the EL layer 100 includes the region 210a where the EL layer 100 is sandwiched between the electrode 101 and the electrode 102 and the region 210b where the EL layer 100 is sandwiched between the electrode 103 and the electrode 102. The EL layer 100 includes the carrier-injection layer 111a in contact with the electrode 101 and the carrier-injection layer 119a in contact with the electrode 102 in the region 210a, and the carrier-injection layer 111b in contact with the electrode 103 and the carrier-injection layer 119b in contact with the electrode 102 in the region 210b.

In other words, in the light-emitting element 256, the structure of the electrode 101, the carrier-injection layer 111a in contact with the electrode 101, and the carrier-injection layer 119a in contact with the electrode 102 in the region 210a is different from the structure of the electrode 103, the carrier-injection layer 111b in contact with the electrode 103, and the carrier-injection layer 119b in contact with the electrode 102 in the region 210b. Note that in the light-emitting element 256, although the EL layer 100 includes at least the carrier-injection layers 111a and 119a in the region 210a and the carrier-injection layers 111b and 119b in the region 210b, the electrode 101 and the electrode 103 may be a same electrode.

For example, by increasing the carrier-injection property of the carrier-injection layer 111a and decreasing the carrier-injection property of the carrier-injection layer 119a in the light-emitting element 256, the light-emitting region in the region 210a can be adjusted so that light emission can be obtained more from a region in the light-emitting layer 150 which is far from the carrier-transport layer 112 and close to the carrier-transport layer 118, that is, the light-emitting layer 130. By adjusting the carrier-injection property in the carrier-injection layer 111a and the carrier-injection layer 119a, the region where the carrier recombination region and the light-emitting region are distributed can be effectively adjusted. By decreasing the carrier-injection property of the carrier-injection layer 111b and increasing the carrier-injection property of the carrier-injection layer 119b, the light-emitting region in the region 210b can be adjusted so that light emission can be obtained more from a region in the light-emitting layer 150 which is close to the carrier-transport layer 112 and far from the carrier-transport layer 118, that is, the light-emitting layer 120. By adjusting the carrier-injection property in the carrier-injection layer 111b and the carrier-injection layer 119b, the region where the carrier recombination region and the light-emitting region are distributed can be effectively adjusted.

In the case where the light-emitting layer 120 and the light-emitting layer 130 included in the light-emitting layer 150 have different emission colors, adjusting the region where the carrier recombination region and the light-emitting region are distributed can strengthen the emission color of light emitted from one of the light-emitting layers. In other words, light emitted from the region 210a and light emitted from the region 210b can be made different from each other. Furthermore, in order to obtain different colors of light between the region 210a and the region 210b, the light-emitting region can be adjusted by utilizing the above-described structure so that desired colors of light can be obtained from the region 210a and the region 210b; in this way, light extraction efficiency can be improved.

Note that the structure of the light-emitting element 250, the light-emitting element 252, or the light-emitting element 254 may be referred to for the other structure in the light-emitting element 256.

<Structure Example 5 of Light-Emitting Element>

Next, structure examples different from the light-emitting element 250 illustrated in FIG. 1 will be described below with reference to FIGS. 4A and 4B.

Figure 4A:
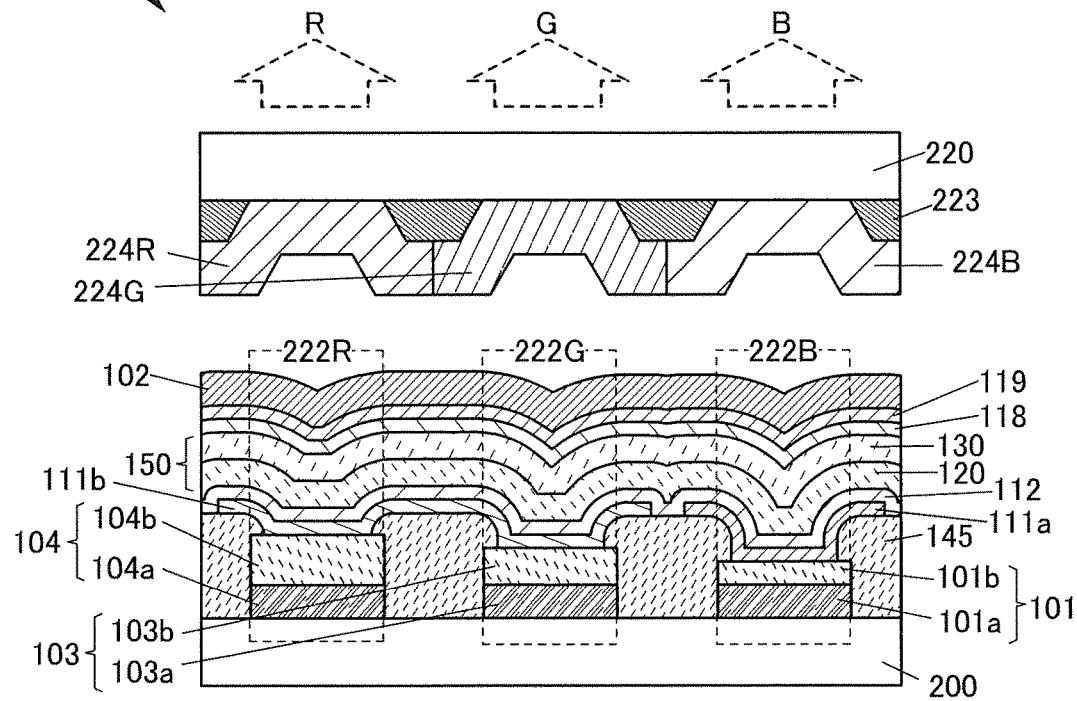
FIGS. 4A and 4B are each a schematic cross-sectional view of a light-emitting element of one embodiment of the present invention.
Figure 4B:
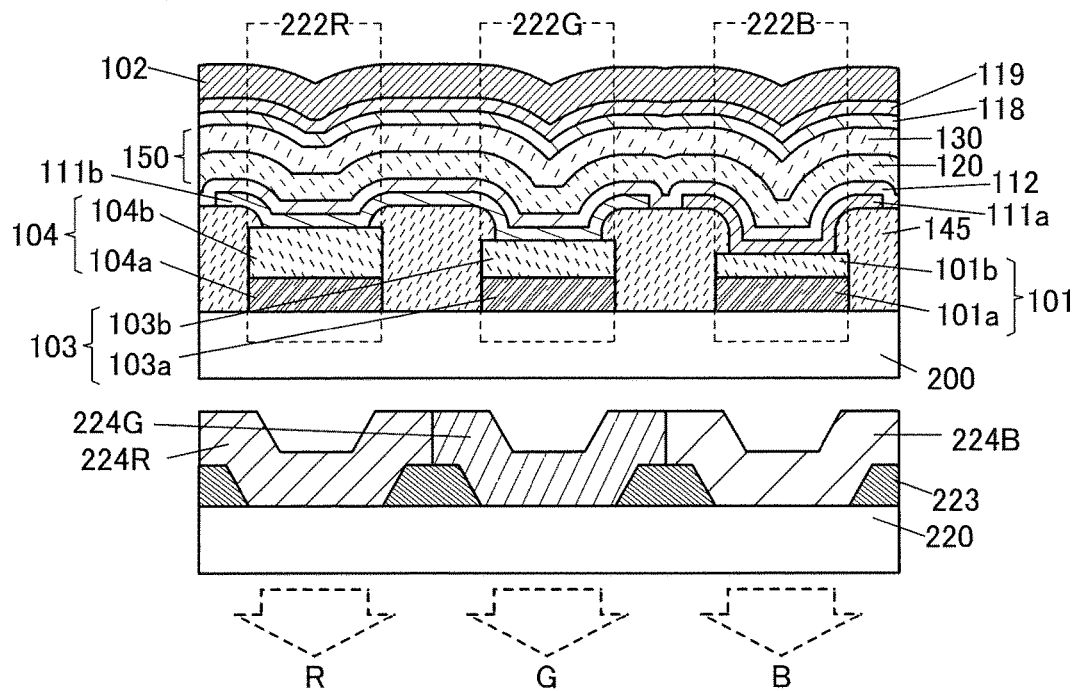

FIGS. 4A and 4B are schematic cross-sectional views of a light-emitting element of one embodiment of the present invention. In FIGS. 4A and 4B, a portion having a function similar to that in FIG. 1 is represented by the same hatch pattern as in FIG. 1 and not especially denoted by a reference numeral in some cases. In addition, common reference numerals are used for portions having similar functions, and a detailed description of such portions is not repeated in some cases.

FIGS. 4A and 4B illustrate structure examples of a light-emitting element including the light-emitting layer 150 between a pair of electrodes. A light-emitting element 258 illustrated in FIG. 4A has a top-emission structure in which light is extracted in a direction opposite to the substrate 200, and a light-emitting element 260 illustrated in FIG. 4B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 258 and 260 each include the electrode 101, the electrode 102, the electrode 103, and an electrode 104 over the substrate 200. The light-emitting layer 150 is included between the electrode 101 and the electrode 102, between the electrode 102 and the electrode 103, and between the electrode 102 and the electrode 104. Further, the carrier-injection layer 111a in contact with the electrode 101 and the carrier-injection layer 111b in contact with the electrode 103 and the electrode 104 are included. In addition, the carrier-transport layer 112, the carrier-transport layer 118, and the carrier-injection layer 119 are included. The light-emitting layer 150 includes the light-emitting layer 120 and the light-emitting layer 130.

The material included in the light-emitting layer 120 and the material included in the light-emitting layer 130 preferably emit different colors of light from each other. Either or both of the light-emitting layers 120 and 130 may have a stacked structure of two layers. The two light-emitting layers including two kinds of light-emitting materials for emitting different colors of light enable light emissions of a plurality of colors at the same time. It is particularly preferable to select the light-emitting materials of the light-emitting layers so that white light can be obtained by combining light emissions from the light-emitting layers 120 and 130. Either or both of the light-emitting layers 120 and 130 may have a stacked structure of three or more layers, in which a layer not including a light-emitting material may be included.

The electrode 101 includes a conductive film 101a and a conductive film 101b over and in contact with the conductive film 101a. The electrode 103 includes a conductive film 103a and a conductive film 103b over and in contact with the conductive film 103a. The electrode 104 includes a conductive film 104a and a conductive film 104b over and in contact with the conductive film 104a.

Since the light-emitting element 258 has a top-emission structure, the electrode 101, the electrode 103, and the electrode 104 preferably have a function of reflecting light, and the electrode 102 preferably has a function of transmitting light.

Since the light-emitting element 260 has a bottom-emission structure, the electrode 101, the electrode 103, and the electrode 104 preferably have a function of transmitting light, and the electrode 102 preferably has a function of reflecting light.

The light-emitting element 258 illustrated in FIG. 4A and the light-emitting element 260 illustrated in FIG. 4B include a region 222B where the EL layer is sandwiched between the electrode 101 and the electrode 102, a region 222G where the EL layer is sandwiched between the electrode 102 and the electrode 103, and a region 222R where the EL layer is sandwiched between the electrode 102 and the electrode 104. A partition wall 145 is provided between the region 222B, the region 222G, and the region 222R. The partition wall 145 has an insulating property. The partition wall 145 covers end portions of the electrodes 101, 103, and 104 and has openings overlapping with the electrodes. With the partition wall 145, the electrodes provided over the substrate 200 can be separated into island shapes like the electrodes 101, 103, and 104.

The partition wall 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

There may be a region where the carrier-injection layer 111a and the carrier-injection layer 111b overlap with each other in a region overlapping with the partition wall 145.

In the case where the carrier-injection layer 111a and the carrier-injection layer 111b include different materials from each other, the degree of carrier-injection property to the EL layer of the electrode 101 and that of the electrodes 103 and 104 are preferably different from each other.

For example, in the case where materials having higher ionization potentials than the work function of the anode are used for the carrier-injection layers 111a and 111b, a region where holes injected from the anode to the EL layer and electrons injected from the cathode to the EL layer recombine (recombination region) is densely distributed on the relatively anode side. In contrast, in the case where materials having substantially equal to or lower than the work function of the anode are used for the carrier-injection layers 111a and 111b, a region where holes and electrons recombine (recombination region) is densely distributed on the relatively cathode side.

For example, in the case where the light-emitting layer 150 includes a plurality of layers (the light-emitting layers 120 and 130) as in FIGS. 4A and 4B, the ratio between the intensity of light emitted from the light-emitting layer 120 and the intensity of light emitted from the light-emitting layer 130 is changed when the electron or hole-injection property is changed and the region in the light-emitting layer 150 where holes and electrons recombine is changed. Therefore, in the case where lights of different colors are emitted from the light-emitting layers 120 and 130, the shape of the spectrum of light extracted as a whole from the light-emitting element (the relative intensity ratio of wavelength components) is changed. Accordingly, the color of light emitted from the regions 222B, 222G, and 222R can be adjusted. Furthermore, different colors of light emissions can be obtained from the regions 222B, 222G, and 222R. Furthermore, in order to obtain different colors of light between the regions 222B, 222G, and 222R, the light-emitting region can be adjusted by utilizing the above-described structure so that desired colors of light can be obtained from the regions 222B, 222G, and 222R; in this way, light extraction efficiency can be improved.

For example, by decreasing the carrier-injection property of the carrier-injection layer 111a in the light-emitting element 258 and the light-emitting element 260, the light-emitting region in the region 222B can be adjusted so that light emission can be obtained more from a region in the light-emitting layer 150 which is close to the carrier-transport layer 112 and far from the carrier-transport layer 118, that is, the light-emitting layer 120. By increasing the carrier-injection property of the carrier-injection layer 111b, the light-emitting region in the region 222G and the region 222R can be adjusted so that light emission can be obtained more from a region in the light-emitting layer 150 which is far from the carrier-transport layer 112 and close to the carrier-transport layer 118, that is, the light-emitting layer 130.

When the light-emitting layer 120 includes a light-emitting material having a peak of an emission spectrum in a wavelength range of at least one color selected from violet, blue, and blue green, the region 222B can emit blue light. When the light-emitting layer 130 includes a light-emitting material having a peak of an emission spectrum in a wavelength range of at least one color selected from green, yellow green, yellow, orange, and red, the region 222G can emit green light and the region 222R can emit red light. By using the light-emitting element 258 or the light-emitting element 260 having this structure in a pixel of a display device, a full-color display device can be fabricated. Note that the thicknesses of the light-emitting layers may be the same or different.

The light-emitting elements 258 and 260 each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum-dot type can increase color reproducibility of the display device.

A plurality of optical elements may also be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

Note that in FIGS. 4A and 4B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

Furthermore, the light-emitting elements 258 and 260 preferably have a microcavity structure.

Light emitted from the light-emitting layer 120 and the light-emitting layer 130 resonates between a pair of electrodes (e.g., the electrode 101 and the electrode 102). The light-emitting layer 120 and the light-emitting layer 130 are formed at such a position as to increase the intensity of light of a desired wavelength among light to be emitted. For example, by adjusting the optical length from a reflective region of the electrode 101 to the light-emitting region of the light-emitting layer 120 and the optical length from a reflective region of the electrode 102 to the light-emitting region of the light-emitting layer 120, the intensity of light emitted from the light-emitting layer 120 can be increased. By adjusting the optical length from reflective regions of the electrodes 103 and 104 to the light-emitting region of the light-emitting layer 130 and the optical length from a reflective region of the electrode 102 to the light-emitting region of the light-emitting layer 130, the intensity of light emitted from the light-emitting layer 130 can be increased. In the case of a light-emitting element in which a plurality of light-emitting layers (here, the light-emitting layers 120 and 130) are stacked, the optical lengths of the light-emitting layers 120 and 130 are preferably optimized.

It is difficult to precisely determine the reflective regions of the electrodes 101 to 104; therefore, the optical length for increasing the intensity of light emitted from the light-emitting layer 120 or the light-emitting layer 130 may be derived on the assumption that certain regions of the electrodes 101 to 104 are the reflective regions. It is also difficult to precisely determine the light-emitting regions of the light-emitting layer 120 and the light-emitting layer 130; therefore, the optical length for increasing the intensity of light emitted from the light-emitting layer 120 and the light-emitting layer 130 may be derived on the assumption that certain regions of the light-emitting layer 120 and the light-emitting layer 130 are the light-emitting regions.

In each of the light-emitting elements 258 and 260, by adjusting the thicknesses of the conductive films (the conductive film 101b, the conductive film 103b, and the conductive film 104b) in each region, the intensity of light of a desired wavelength among light emitted from the light-emitting layers 120 and 130 can be increased. Note that the thickness of the carrier-injection layer 111a and the carrier-injection layer 111b may differ between the regions to increase the intensity of light of a desired wavelength among light emitted from the light-emitting layers 120 and 130.

For example, in the case where the refractive index of the conductive material having a function of reflecting light in the electrodes 101 to 104 is lower than the refractive index of the light-emitting layer 120 or 130, the thickness of the conductive film 101b of the electrode 101 is adjusted so that the optical length between the electrode 101 and the electrode 102 is $m_{B2}\lambda_B/2$ ($m_B$ is a natural number and $\lambda_B$ is the wavelength of light intensified in the region 222B). Similarly, the thickness of the conductive film 103b of the electrode 103 is adjusted so that the optical length between the electrode 103 and the electrode 102 is $m_G\lambda_G/2$ ($m_G$ is a natural number and $\lambda_G$ is the wavelength of light intensified in the region 222G). Furthermore, the thickness of the conductive film 104b of the electrode 104 is adjusted so that the optical length between the electrode 104 and the electrode 102 is $m_R\lambda_R/2$ ($m_R$ is a natural number and $\lambda_R$ is the wavelength of light intensified in the region 222R).

In the above manner, with the microcavity structure, in which the optical length between the pair of electrodes in the respective regions is adjusted, scattering and absorption of light in the vicinity of the electrodes can be suppressed, resulting in high light extraction efficiency. In the above structure, the conductive films 101b, 103b, and 104b preferably have a function of transmitting light. The materials of the conductive films 101b, 103b, and 104b may be the same or different. Each of the conductive films 101b, 103b, and 104b may have a stacked structure of two or more layers.

Since the light-emitting element 258 illustrated in FIG. 4A has a top-emission structure, it is preferable that the conductive film 101a, the conductive film 103a, and the conductive film 104a have a function of reflecting light. In addition, it is preferable that the electrode 102 have functions of transmitting light and reflecting light.

Since the light-emitting element 260 illustrated in FIG. 4B has a bottom-emission structure, it is preferable that the conductive film 101a, the conductive film 103a, and the conductive film 104a have functions of transmitting light and reflecting light. In addition, it is preferable that the electrode 102 have a function of reflecting light.

In each of the light-emitting elements 258 and 260, the conductive films 101a, 103a, and 104a may be formed of different materials or the same material. When the conductive films 101a, 103a, and 104a are formed of the same material, manufacturing cost of the light-emitting elements 258 and 260 can be reduced. Note that each of the conductive films 101a, 103a, and 104a may have a stacked structure including two or more layers.

In the above-described manner, by using the light-emitting element 258 or the light-emitting element 260 including the carrier-injection layers described for the light-emitting element 250 in a pixel of a display device, the display device can have high emission efficiency. Accordingly, the display device including the light-emitting element 258 or the light-emitting element 260 can have low power consumption.

Note that the structure of the light-emitting element 250, the light-emitting element 252, the light-emitting element 254, or the light-emitting element 256 may be referred to for the other structure in the light-emitting element 258 and the light-emitting element 260.

<Structure Example 6 of Light-Emitting Element>

Next, structure examples different from the light-emitting elements 258 and 260 illustrated in FIGS. 4A and 4B will be described below with reference to FIGS. 5A and 5B.

Figure 5A:
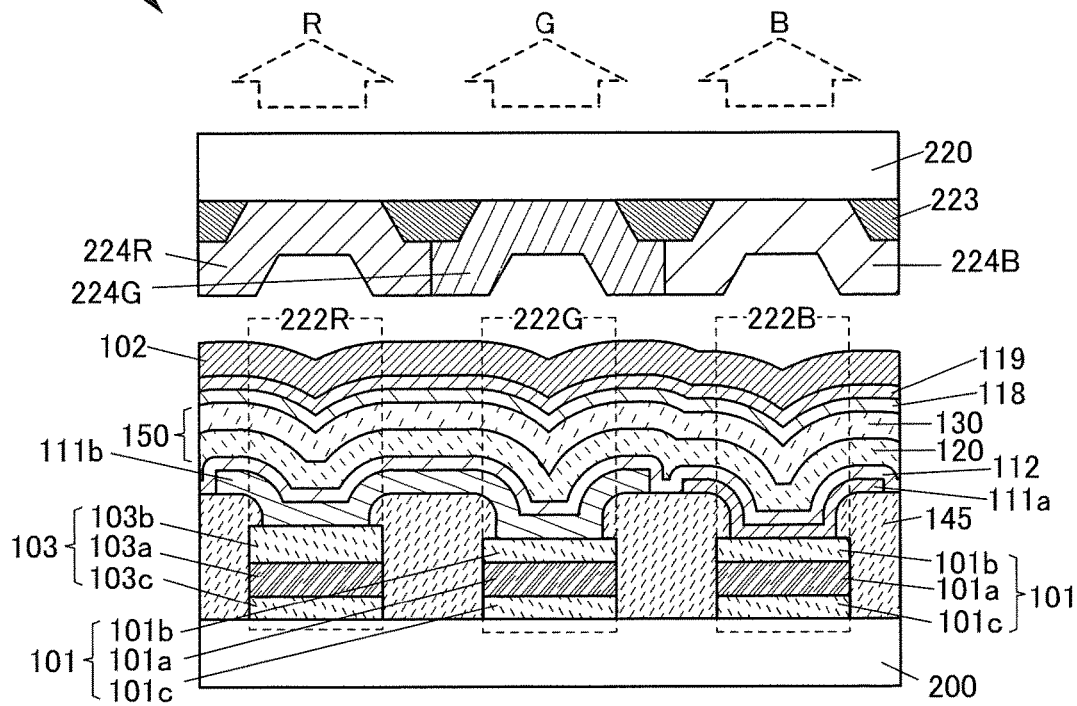
FIGS. 5A and 5B are each a schematic cross-sectional view of a light-emitting element of one embodiment of the present invention.
Figure 5B:
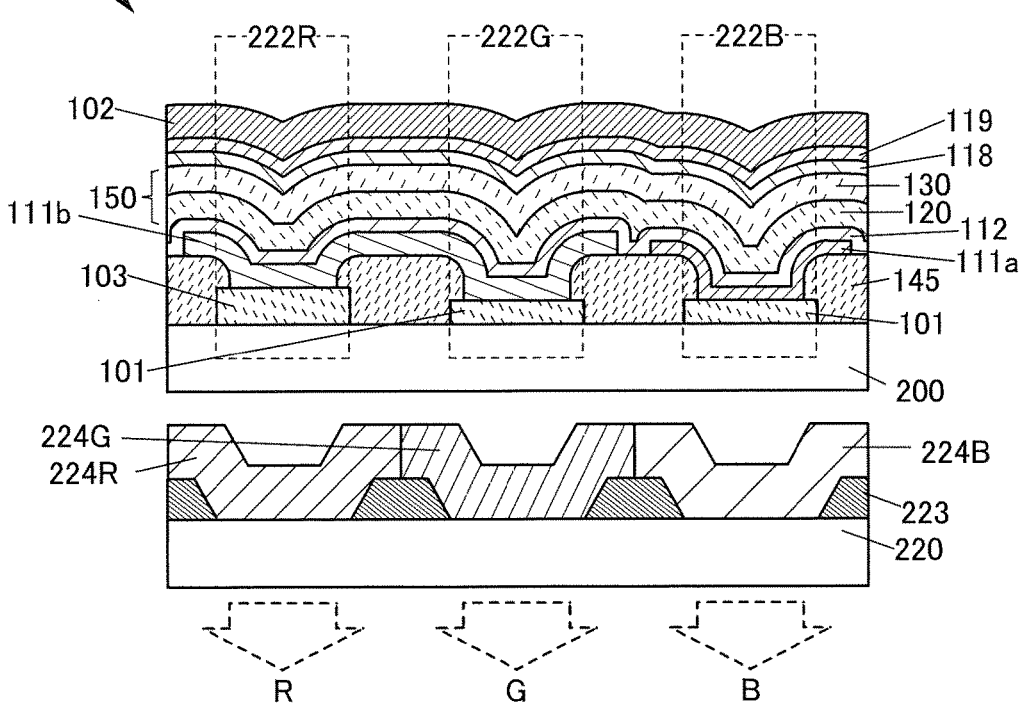

FIGS. 5A and 5B are schematic cross-sectional views of a light-emitting element of one embodiment of the present invention. In FIGS. 5A and 5B, a portion having a function similar to that in FIGS. 4A and 4B is represented by the same hatch pattern as in FIG. 1 and not especially denoted by a reference numeral in some cases. In addition, common reference numerals are used for portions having similar functions, and a detailed description of such portions is not repeated in some cases.

FIGS. 5A and 5B illustrate structure examples of a light-emitting element including the light-emitting layer 150 between a pair of electrodes. A light-emitting element 262 illustrated in FIG. 5A has a top-emission structure in which light is extracted in a direction opposite to the substrate 200, and a light-emitting element 264 illustrated in FIG. 5B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262 and 264 each include the electrode 101, the electrode 102, and the electrode 103 over the substrate 200. The light-emitting layer 150 is included between the electrode 101 and the electrode 102 and between the electrode 102 and the electrode 103. In addition, the carrier-transport layer 112, the carrier-transport layer 118, and the carrier-injection layer 119 are included. The light-emitting layer 150 includes the light-emitting layer 120 and the light-emitting layer 130.

The material included in the light-emitting layer 120 and the material included in the light-emitting layer 130 preferably emit different colors of light from each other. Either or both of the light-emitting layers 120 and 130 may have a stacked structure of two layers. The two light-emitting layers including two kinds of light-emitting materials for emitting different colors of light enable light emissions of a plurality of colors at the same time. It is particularly preferable to select the light-emitting materials of the light-emitting layers so that white light can be obtained by combining light emissions from the light-emitting layers 120 and 130. Either or both of the light-emitting layers 120 and 130 may have a stacked structure of three or more layers, in which a layer not including a light-emitting material may be included.

The light-emitting element 262 and the light-emitting element 264 include the region 222B and the region 222G where the EL layer is sandwiched between the electrode 101 and the electrode 102 and the region 222R where the EL layer is sandwiched between the electrode 102 and the electrode 103. The region 222B includes the carrier-injection layer 111a in contact with the electrode 101, the region 222G includes the carrier-injection layer 111b in contact with the electrode 101, and the region 222R includes the carrier-injection layer 111b in contact with the electrode 103.

In the light-emitting element 262 illustrated in FIG. 5A, the electrode 101 includes the conductive film 101a, the conductive film 101b over the conductive film 101a, and a conductive film 101c below the conductive film 101a. The electrode 103 includes the conductive film 103a, the conductive film 103b over the conductive film 103a, and a conductive film 103c below the conductive film 103a. In other words, the light-emitting element 262 has a structure of the electrode 101 in which the conductive film 101a is sandwiched between the conductive film 101b and the conductive film 101c. The light-emitting element 262 has a structure of the electrode 103 in which the conductive film 103a is sandwiched between the conductive film 103b and the conductive film 103c.

In the light-emitting element 262, the conductive film 101b and the conductive film 101c may be formed of the same material or different materials. Furthermore, the conductive film 103b and the conductive film 103c may be formed of the same material or different materials. In the case where the electrode 101 and/or the electrode 103 have a structure in which the conductive film 101a and/or the conductive film 103a are sandwiched between the same conductive materials, patterning by an etching step can be easily performed, which is preferable.

The light-emitting element 262 may include either one of the conductive films 101b and 101c and either one of the conductive films 103b and 103c.

Since the light-emitting element 262 has a top-emission structure, the electrode 101 and the electrode 103 preferably have a function of reflecting light, and the electrode 102 preferably has a function of transmitting light.

Since the light-emitting element 264 has a bottom-emission structure, the electrode 101 and the electrode 103 preferably have a function of transmitting light, and the electrode 102 preferably has a function of reflecting light.

In the case where the carrier-injection layer 111a and the carrier-injection layer 111b include different materials from each other, the degree of carrier-injection property to the EL layer of the electrode 101 and that of the electrode 103 are preferably different from each other.

For example, by decreasing the carrier-injection property of the carrier-injection layer 111a in the light-emitting element 262 and the light-emitting element 264, the light-emitting region in the region 222B can be adjusted so that light emission can be obtained more from a region in the light-emitting layer 150 which is close to the carrier-transport layer 112 and far from the carrier-transport layer 118, that is, the light-emitting layer 120. By increasing the carrier-injection property of the carrier-injection layer 111b, the light-emitting region in the region 222G and the region 222R can be adjusted so that light emission can be obtained more from a region in the light-emitting layer 150 which is far from the carrier-transport layer 112 and close to the carrier-transport layer 118, that is, the light-emitting layer 130.

When the light-emitting layer 120 includes a light-emitting material having a peak of an emission spectrum in a wavelength range of at least one color selected from violet, blue, and blue green, the region 222B can emit blue light. When the light-emitting layer 130 includes a light-emitting material having a peak of an emission spectrum in a wavelength range of at least one color selected from green, yellow green, yellow, orange, and red, the region 222G can emit green light and the region 222R can emit red light. By using the light-emitting element 262 or the light-emitting element 264 having this structure in a pixel of a display device, a full-color display device can be fabricated. Note that the thicknesses of the light-emitting layers may be the same or different.

In the region 222B, by adjusting the thicknesses of the electrode 101 and the carrier-injection layer 111a, the optical length from the reflective region of the electrode 101 to the light-emitting region of the light-emitting layer 120 and the optical length from the reflective region of the electrode 102 to the light-emitting region of the light-emitting layer 120 can be adjusted so as to increase the intensity of light emitted from the light-emitting layer 120, enabling an increase in the intensity of light of a desired wavelength from the region 222B. In the region 222G, by adjusting the thicknesses of the electrode 101 and the carrier-injection layer 111b, the optical length from the reflective region of the electrode 101 to the light-emitting region of the light-emitting layer 130 and the optical length from the reflective region of the electrode 102 to the light-emitting region of the light-emitting layer 130 can be adjusted so as to increase the intensity of light emitted from the light-emitting layer 130, enabling an increase in the intensity of light of a desired wavelength from the region 222G. In the region 222R, by adjusting the thicknesses of the electrode 103 and the carrier-injection layer 111b, the optical length from the reflective region of the electrode 103 to the light-emitting region of the light-emitting layer 130 and the optical length from the reflective region of the electrode 102 to the light-emitting region of the light-emitting layer 130 can be adjusted so as to increase the intensity of light emitted from the light-emitting layer 130, enabling an increase in the intensity of light of a desired wavelength from the region 222R.

Furthermore, the light-emitting elements 262 and 264 preferably have a microcavity structure.

When the light-emitting element 262 has a microcavity structure, the conductive film 101b and the conductive film 103b preferably have a function of transmitting light. In this case, by adjusting the thicknesses of the conductive film 101b and the conductive film 103b, the intensity of light emitted from the region 222B, the region 222G, and the region 222R can be increased.

In the above-described structure, the wavelength of the intensified light differs among the regions 222B, 222G, and 222R and accordingly the optical length differs among the regions. In the light-emitting element 262 and the light-emitting element 264 of one embodiment of the present invention, since the region 222B and the region 222G have the same electrode structure, the number of photomasks necessary for pattern formation can be reduced and thereby manufacturing cost can be reduced. Furthermore, since the region 222G and the region 222R have the same structure of the carrier-injection layer 111b, the number of shadow masks necessary for pattern formation can be reduced and thereby manufacturing cost can be reduced. Moreover, yield in manufacturing the light-emitting element can be increased.

In the light-emitting elements 262 and 264, the conductive films 101 and 103 may be formed of different materials or the same material. When the conductive films 101 and 103 are formed of the same material, manufacturing cost of the light-emitting elements can be reduced. Note that each of the electrodes 101 and 103 and the conductive films 101a, 101b, 101c, 103a, 103b, and 103c may have a stacked structure including two or more layers.

In the above-described manner, by using the light-emitting element 262 or the light-emitting element 264 including the carrier-injection layers described for the light-emitting element 250 in a pixel of a display device, the display device can have high emission efficiency. Furthermore, the display device can be manufactured in a relatively small number of steps for forming films in a manufacturing process. Accordingly, the display device including the light-emitting element 262 or the light-emitting element 264 can have low power consumption. The display device can be easily manufactured.

Note that the structure of the light-emitting element 258 or the light-emitting element 260 may be referred to for the other structure in the light-emitting element 262 and the light-emitting element 264.

<Components of Light-Emitting Element>

Next, components of a light-emitting element of one embodiment of the present invention are described in detail below.

<<Hole-Injection Layer>>

In the case where the carrier-injection layers 111, 111a, and 111b or the carrier-injection layers 119, 119a, and 119b are hole-injection layers, the hole-injection layers have a function of reducing a barrier for hole injection from one of the pair of electrodes (the electrode 101 or the electrode 102) to promote hole injection and are formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given, for example. As the phthalocyanine derivative, phthalocyanine (abbreviation: $H_2Pc$), metal phthalocyanine such as copper phthalocyanine, or the like can be given, for example. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid) (abbreviation: PEDOT/PSS), which is self-doped polythiophene.

As the hole-injection layer 111, a layer containing a composite material of a hole-transport material (donor material) and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ $cm^2/Vs$ or higher is preferable. Specifically, an aromatic amine, a carbazole derivative, an aromatic hydrocarbon, a stilbene derivative, or the like can be used, for example. Furthermore, the hole-transport material may be a high molecular compound.

Examples of the material having a high hole-transport property are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ $cm^2/Vs$ or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris [N-(1-naphthyl)-N-phenylamino]triphenylamine (abbreviation: 1'-TNATA), 4,4',4"-tris(N,N-diphenylamino) triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yetriphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino] spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N, N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluor en-2-amine (abbreviation: PCBBiF), 9,9-dimethyl-N-phenyl-N-[4-(9-phenyl-9H-carbazol-3-yl)phenyl] fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl) phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylene-2-yl)phenyl]dibenzothiophene (abbreviation: mDBTPTp-II). The substances described here are mainly substances having a hole mobility of $1 \times 10^{-6}$ cm$^2$/Vs or higher. Note that other than these substances, any substance that has a property of transporting more holes than electrons may be used.

<<Electron-Injection Layer>>

In the case where the carrier-injection layers 111, 111*a*, and 111*b* or the carrier-injection layers 119, 119*a*, and 119*b* are electron-injection layers, the electron-injection layers have a function of reducing a barrier for electron injection from one of the pair of electrodes (the electrode 101 or the electrode 102) to promote electron injection and can be formed using a Group 1 metal or a Group 2 metal, or an oxide, a halide, or a carbonate of any of the metals, for example. Alternatively, a composite material containing an electron-transport material and a material having a property of donating electrons to the electron-transport material can also be used. As the material having an electron-donating property, a Group 1 metal, a Group 2 metal, an oxide of any of these metals, or the like can be given. Specific examples are an alkali metal, an alkaline earth metal, and a compound thereof, such as lithium fluoride (LiF), cesium fluoride (CsF), calcium fluoride (CaF$_2$), and lithium oxide (LiO$_x$). Alternatively, a rare earth metal compound like erbium fluoride (ErF$_3$) can be used. Electride may also be used for the electron-injection layer. Examples of the electride include a substance in which electrons are added at high concentration to calcium oxide-aluminum oxide.

The electron-injection layers may be formed using a composite material in which an organic material (acceptor material) and an electron donor (donor material) are mixed. The composite material is superior in an electron-injection property and an electron-transport property, since electrons are generated in the organic material by the electron donor. The organic compound here is preferably a material excellent in transporting the generated electrons (electron-transport material); specifically, for example, an electron-transport material such as a metal complex or a heteroaromatic compound can be used. As the electron donor, a substance showing an electron-donating property with respect to the organic compound may be used. Specifically, an alkali metal, an alkaline earth metal, and a rare earth metal are preferable, and for example, lithium, cesium, magnesium, calcium, erbium, ytterbium, and the like can be given. Further, an alkali metal oxide or an alkaline earth metal oxide is preferable, and for example, lithium oxide, calcium oxide, barium oxide, and the like can be given. Alternatively, Lewis base such as magnesium oxide can also be used. An organic material such as tetrathiafulvalene (abbreviation: TTF) can also be used.

As the electron-transport material, a material having a property of transporting more electrons than holes can be used, and a material having an electron mobility of $1 \times 10^{-6}$ cm$^2$/Vs or higher is preferable. A π-electron deficient heteroaromatic compound such as a nitrogen-containing heteroaromatic compound, a metal complex, or the like can be used. Specific examples include a metal complex having a quinoline ligand, a benzoquinoline ligand, an oxazole ligand, and a thiazole ligand. Other examples include an oxadiazole derivative, a triazole derivative, a phenanthroline derivative, a pyridine derivative, a bipyridine derivative, a pyrimidine derivative, and the like.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq) and bis(8-quinolinolato)zinc(II) (abbreviation: Znq), and the like. Alternatively, a metal complex having an oxazole-based or thiazole-based ligand, such as bis[2-(2-benzoxazolyl)phenolate]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(biphenyl-4-yl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl]pyridine (abbreviation: 35DCzPPy); and heteroaromatic compounds such as 4,4'-bis(5-methylbenzoxazol-2-yl)stilbene (abbreviation: BzOs). Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ cm$^2$/Vs or higher. Note that other substances may also be used as long as their electron-transport properties are higher than their hole-transport properties.

<<Hole-Transport Layer>>

The hole-transport layer contains a hole-transport material. In the case where the carrier-transport layer 112 or the carrier-transport layer 118 is a hole-transport layer, any of the materials described as the material of the hole-injection layer can be used as the hole-transport material. In order that the hole-transport layer has a function of transporting holes injected into the hole-injection layer to the light-emitting layer 150, the HOMO level of the hole-transport layer is preferably equal or close to the HOMO level of the hole-injection layer. When the HOMO level of the hole-transport layer is lower than that of the hole-injection layer, injection of holes to the light-emitting layer 150 can be suppressed; thus, the region in the light-emitting layer 150 where the carrier recombination region and the light-emitting region are distributed can be adjusted.

The hole-transport material described above preferably has a hole mobility of $1\times10^{-6}$ cm$^2$/Vs or higher. Note that other than these substances, any substance that has a property of transporting more holes than electrons may be used. The layer containing a substance having a high hole-transport property is not limited to a single layer, and may include stacked two or more layers containing the aforementioned substances.

<<Electron-Transport Layer>>

The electron-transport layer has a function of transporting, to the light-emitting layer 150, electrons injected from the other of the pair of electrodes (the electrode 101 or the electrode 102) through the electron-injection layer. In the case where the carrier-transport layer 112 or 118 is an electron-transport layer, a material having a property of transporting more electrons than holes can be used as the electron-transport material, and a material having an electron mobility of $1\times10^{-6}$ cm$^2$/Vs or higher is preferable. As the electron-transport material, a π-electron deficient heteroaromatic compound such as a nitrogen-containing heteroaromatic compound, a metal complex, or the like can be used, for example. Specifically, a metal complex having a quinoline ligand, a benzoquinoline ligand, an oxazole ligand, or a thiazole ligand; an oxadiazole derivative; a triazole derivative; a phenanthroline derivative; a pyridine derivative; a bipyridine derivative; a pyrimidine derivative; and the like, which are described as the electron-transport materials that can be used for the electron-injection layer, can be given. Note that other than these substances, any substance that has a property of transporting more electrons than holes may be used for the electron-transport layer. The carrier-transport layer 118 is not limited to a single layer, and may include stacked two or more layers containing the aforementioned substances.

Between the electron-transport layer and the light-emitting layer 150, a layer that controls transfer of electron carriers may be provided. This is a layer formed by addition of a small amount of a substance having a high electron-trapping property to a material having a high electron-transport property described above, and the layer is capable of adjusting carrier balance by suppressing transfer of electron carriers. Such a structure is very effective in preventing a problem (such as a reduction in element lifetime) caused when electrons pass through the light-emitting layer.

<<Light-Emitting Layer>>

One of the light-emitting layers 120 and 130 included in the light-emitting layer 150 includes a first light-emitting material having a peak of an emission spectrum in a wavelength range of at least one color selected from violet, blue, and blue green. The other thereof includes a second light-emitting material having a peak of an emission spectrum in a wavelength range of at least one color selected from green, yellow green, yellow, orange, and red. Each light-emitting layer includes a host material in addition to the light-emitting material. The host material preferably includes one or both of an electron-transport material and a hole-transport material.

As the first light-emitting material and the second light-emitting material, light-emitting materials having a function of converting the singlet excitation energy into light emission or light-emitting materials having a function of converting the triplet excitation energy into light emission can be used. Examples of the light-emitting materials are given below.

Examples of the light-emitting material having a function of converting singlet excitation energy into light emission include substances that emit fluorescence. For example, any of the following substances having an anthracene skeleton, a tetracene skeleton, a chrysene skeleton, a phenanthrene skeleton, a pyrene skeleton, a perylene skeleton, a stilbene skeleton, an acridonoe skeleton, a coumarin skeleton, a phenoxazine skeleton, a phenothiazine skeleton, or the like can be used: 5,6-bis[4-(10-phenyl-9-anthryl)phenyl]-2,2'-bipyridine (abbreviation: PAP2BPy), 5,6-bis[4'-(10-phenyl-9-anthryebiphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra(tert-butyl)perylene (abbreviation: TBP), N,N'-diphenyl-N,N'-bis[4-(9-phenyl-9H-fluoren-9-yl)phenyl] pyrene-1,6-diamine (abbreviation: 1,6FLPAPrn), N,N'-bis (3-methylphenyl)-N,N'-bis[3-(9-phenyl-9H-fluoren-9-yl) phenyl]-pyrene-1,6-diamine (abbreviation 1,6mMemFLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-(9,10-diphenyl-2-anthryl)-N,N',N'-triphenyl-1,4-phenylenediamine (abbreviation: 2DPAPA), N,N,9-triphenylanthracen-9-amine (abbreviation: DPhAPhA), coumarin 6, coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl-6-methyl-4H-pyran-4-ylidene}propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

Examples of the light-emitting material having a function of converting triplet excitation energy into light emission include substances that emit phosphorescence.

Examples of the substance that has an emission peak in the blue or green wavelength range include organometallic iridium complexes having a 4H-triazole skeleton, such as tris {2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N, C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis {2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes having a 4H-triazole skeleton have high reliability and high emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato) iridium(III) (abbreviation: Ir(tBuppm)$_3$), (acetylacetonato) bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$ (acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis (5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)

iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$) iridium(III) acetylacetonate (abbreviation: Ir(pq)$_2$(acac)); organometallic iridium complexes such as bis(2,4-diphenyl-1,3-oxazolato-N,C$^{2'}$)iridium(III)acetylacetonate (abbreviation: Ir(dpo)$_2$(acac)), bis{2-[4'-(perfluorophenyl)phenyl]pyridinato-N,C$^{2'}$}iridium(III)acetylacetonate (abbreviation: Ir(p-PF-ph)$_2$(acac)), and bis(2-phenylbenzothiazolato-N, C$^{2'}$)iridium(III)acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N, C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$(acac)); a platinum complex such as 2,3,7,8,12,13, 17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris [1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Further, the organometallic iridium complexes having a pyrazine skeleton can provide red light emission with favorable chromaticity.

Although there is no particular limitation on a material that can be used as a host material of the light-emitting layer, any of the following substances can be used for the host material, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis (8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: Bphen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB, TPD, and BSPB. In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 2PCAPA, 6,12-dimethoxy-5,11-diphenylchrysene, DBC1, 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9-phenyl-3-[4-(10-phenyl-9-anthryl)phenyl]-9H-carbazole (abbreviation: PCzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo [b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di (2-naphthyl)anthracene (abbreviation: DNA), 2-tert-butyl-9, 10-di(2-naphthyl)anthracene (abbreviation: t-BuDNA), 9,9'-bianthryl (abbreviation: BANT), 9,9'-(stilbene-3,3'-diyl) diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, 5,12-bis(biphenyl-2-yl)tetracene, and the like. One or more substances having a wider energy gap than the above-described light-emitting material is preferably selected from these and other variety of substances. Moreover, in the case where the light-emitting material emits phosphorescence, a substance having triplet excitation energy (energy difference between a ground state and a triplet excited state) which is higher than that of the light-emitting material is preferably selected as the host material.

In the case where a plurality of materials are used as the host material of the light-emitting layer, it is preferable to use a combination of two kinds of compounds which form an exciplex. In this case, a variety of carrier-transport materials can be used as appropriate. In order to form an exciplex efficiently, it is particularly preferable to combine an electron-transport material and a hole-transport material.

This is because in the case where the combination of an electron-transport material and a hole-transport material which form an exciplex is used as a host material, the carrier balance between holes and electrons in the light-emitting layer can be easily optimized by adjustment of the mixture ratio of the electron-transport material and the hole-transport material. The optimization of the carrier balance between holes and electrons in the light-emitting layer can prevent a region in which electrons and holes are recombined from existing on one side in the light-emitting layer. By preventing the region in which electrons and holes are recombined from existing on one side, the reliability of the light-emitting element can be improved.

As the electron-transport material, a π-electron deficient heteroaromatic compound such as a nitrogen-containing heteroaromatic compound, a metal complex, or the like can be used. Specifically, an electron-transport material that can be used for an electron-injection layer or an electron-transport layer can be used. Among such materials, heterocyclic compounds having a pyridine skeleton, a diazine skeleton, or a triazine skeleton have high reliability and are thus preferable. Heterocyclic compounds having a diazine (pyrimidine or pyrazine) skeleton or a triazine skeleton have a high electron-transport property and contribute to a reduction in drive voltage.

As the hole-transport material, a π-electron rich heteroaromatic compound (e.g., a carbazole derivative or an indole derivative), an aromatic amine compound, or the like can be favorably used. Specifically, the hole-transport material that can be used for the hole-injection layer or the hole-transport layer can be used. Among such materials, a compound having an aromatic amine skeleton and a compound having a carbazole skeleton are preferable because these compounds are highly reliable and have high hole-transport properties to contribute to a reduction in drive voltage.

Note that the combination of the materials which form an exciplex and is used as a host material is not limited to the above-described compounds, as long as they can transport carriers, the combination can form an exciplex, and light emission of the exciplex overlaps with an absorption band on the longest wavelength side in an absorption spectrum of a light-emitting substance (an absorption corresponding to the transition of the light-emitting substance from the singlet ground state to the singlet excited state), and other materials may be used.

In order that the above-described hole-transport material and the electron-transport material efficiently form an exciplex, it is preferable that the HOMO level of the hole-transport material be higher than that of the electron-transport material and the LUMO level of the hole-transport material be higher than the LUMO level of the electron-transport material. Specifically, the difference between the HOMO level of the hole-transport material and the HOMO level of the electron-transport material is preferably 0.05 eV or more, further preferably 0.1 eV or more, and still further preferably 0.2 eV or more. In addition, the difference between the LUMO level of the hole-transport material and the LUMO level of the electron-transport material is preferably 0.05 eV or more, further preferably 0.1 eV or more, and still further preferably 0.2 eV or more.

As the light-emitting material or host material of the light-emitting layer, a thermally activated delayed fluorescent (TADF) substance may be used. The thermally activated delayed fluorescent substance is a material having a small difference between the level of the triplet excitation energy and the level of the singlet excitation energy and a function of converting triplet excitation energy into singlet excitation energy by reverse intersystem crossing.

The thermally activated delayed fluorescent substance may be composed of one kind of material or a plurality of materials. For example, in the case where the thermally activated delayed fluorescent substance is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP)).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazine-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA), can be used for example as the thermally activated delayed fluorescent substance composed of one kind of material. The heterocyclic compound is preferable because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both increased and the difference between the level of the singlet excitation state and the level of the triplet excitation state becomes small.

In the case where the thermally activated delayed fluorescent substance is used as the host material, it is preferable to use a combination of two kinds of materials which form an exciplex. In this case, it is particularly preferable to use the above-described combination of an electron-transport material and a hole-transport material, which forms an exciplex.

In the light-emitting layer 120 or the light-emitting layer 130, a material other than the host material and the light-emitting material may be contained.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound such as a quantum dot or a high molecular compound (e.g., an oligomer, a dendrimer, or a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. A material containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, a quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

<<Pair of Electrodes>>

The electrode 101 and the electrode 102 have functions of injecting holes and electrons into the light-emitting layer 150. The electrode 101 and the electrode 102 can be formed using a metal, an alloy, or a conductive compound, or a mixture or a stack thereof, for example. A typical example of the metal is aluminum (Al); besides, a transition metal such as silver (Ag), tungsten, chromium, molybdenum, copper, or titanium, an alkali metal such as lithium (Li) or cesium, or a Group 2 metal such as calcium or magnesium (Mg) can be used. As the transition metal, a rare earth metal such as ytterbium (Yb) may be used. An alloy containing any of the above metals can be used as the alloy, and MgAg and AlLi can be given as examples. Examples of the conductive compound include metal oxides such as indium tin oxide (hereinafter, referred to as ITO), indium tin oxide containing silicon or silicon oxide (ITSO), indium oxide-zinc oxide (indium zinc oxide), indium oxide containing tungsten oxide and zinc oxide, and the like. It is also possible to use an inorganic carbon-based material such as graphene as the conductive compound. As described above, the electrode 101 and/or the electrode 102 may be formed by stacking two or more of these materials.

Light emitted from the light-emitting layer 150 is extracted through the electrode 101 and/or the electrode 102. Therefore, at least one of the electrodes 101 and 102 transmits visible light. As the conductive material transmitting light, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used. The electrode on the light extraction side may be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. In the case where the electrode through which light is extracted is formed using a material with low light transmittance, such as metal or alloy, the electrode 101 and/or the electrode 102 is formed to a thickness that is thin enough to transmit visible light (e.g., a thickness more than or equal to 1 nm and less than or equal to 30 nm).

In this specification and the like, as the electrode transmitting light, a material that transmits visible light and has conductivity is used. Examples of the material include, in addition to the above-described oxide conductor layer typified by an ITO, an oxide semiconductor layer and an organic conductor layer containing an organic substance. Examples of the organic conductor layer containing an organic substance include a layer containing a composite material in which an organic material (acceptor material) and an electron donor (donor material) are mixed and a layer containing a composite material in which an organic material (donor material) and an electron acceptor (acceptor material) are mixed. The resistivity of the transparent conductive layer is preferably lower than or equal to $1 \times 10^5$ Ω·cm, further preferably lower than or equal to $1 \times 10^4$ Ω·cm.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

Note that the above-described materials can be used for the electrodes 103 and 104 or the conductive films 101a, 101b, 101c, 103a, 103b, 103c, 104a, and 104b.

<<Substrate>>

A light-emitting element in one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or the optical elements or as long as it has a function of protecting the light-emitting element or the optical elements.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, and the like. As an example of a glass substrate, a barium borosilicate glass substrate, an aluminoborosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Example of the substrate to which the light-emitting element is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like. When such a substrate is used, a light-emitting element with high durability, high heat resistance, reduced weight, or reduced thickness can be formed.

A light-emitting element may be formed over an electrode electrically connected to a field-effect transistor (FET), for example, that is formed over any of the above-described substrates. Accordingly, an active matrix display device in which the FET controls the driving of the light-emitting element can be fabricated.

<Method for Manufacturing Light-Emitting Element>

Next, a method for fabricating a light-emitting element of one embodiment of the present invention is described below with reference to FIGS. 6A to 6C and FIGS. 7A to 7C. Here, a method for fabricating the light-emitting element 258 illustrated in FIG. 4A is described.

FIGS. 6A to 6C and FIGS. 7A to 7C are cross-sectional views illustrating a method for fabricating the light-emitting element of one embodiment of the present invention.

The method for manufacturing the light-emitting element 258 described below includes first to seventh steps.

<<First Step>>

Figure 6A:
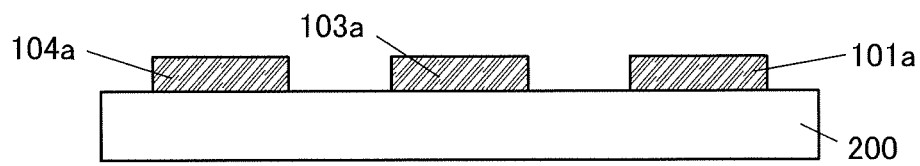
FIGS. 6A to 6C are schematic cross-sectional views illustrating a method for manufacturing a light-emitting element of one embodiment of the present invention.
Figure 6B:
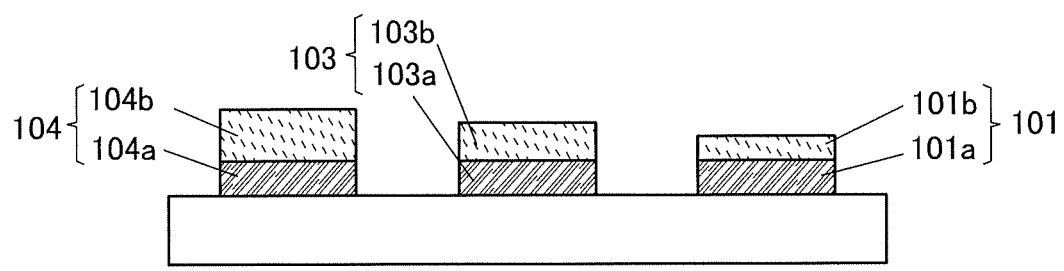

In the first step, part of the electrodes (specifically the conductive film 101a of the electrode 101, the conductive film 103a of the electrode 103, and the conductive film 104a of the electrode 104) of the light-emitting element are formed over the substrate 200 (see FIG. 6A).

In this embodiment, a reflective conductive film is formed over the substrate 200 and processed into a desired shape; whereby the conductive films 101a, 103a, and 104a are formed. As the reflective conductive film, an alloy film of aluminum, nickel, and lanthanum (an Al—Ni—La film) is used, for example. The conductive films 101a, 103a, and 104a are preferably formed through a step of processing the same conductive film, because the manufacturing cost can be reduced.

Note that a plurality of transistors may be formed over the substrate 200 before the first step. The plurality of transistors may be electrically connected to the conductive films 101a, 103a, and 104a.

<<Second Step>>

In the second step, the conductive film 101b is formed over the conductive film 101a of the electrode 101, the conductive film 103b is formed over the conductive film 103a of the electrode 103, and the conductive film 104b is formed over the conductive film 104a of the electrode 104. By forming the conductive films 101b, 103b, and 104b and the conductive films 101a, 103a, and 104a formed in the first step, the electrode 101, the electrode 103, and the electrode 104 are formed. In this embodiment, an ITSO film is used as the conductive films 101b, 103b, and 104b (see FIG. 6B).

The conductive films 101b, 103b, and 104b may be formed in a plurality of steps. When the conductive films 101b, 103b, and 104b are formed in a plurality of steps, they can be formed to have thicknesses which enable microcavity structures appropriate in the respective regions.

<<Third Step>>

Figure 6C:
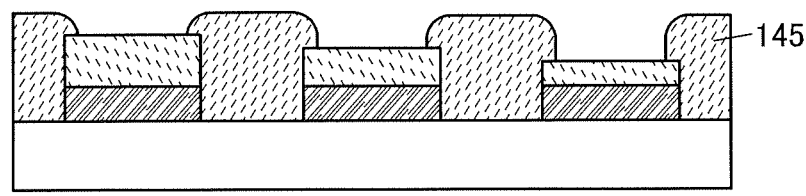

In the third step, the partition wall 145 that covers end portions of the electrodes of the light-emitting element is formed (see FIG. 6C).

The partition wall 145 includes an opening overlapping with the electrode. The conductive film exposed by the opening functions as the anode of the light-emitting element. As the partition wall 145, a polyimide-based resin is used in this embodiment.

In the first to third steps, since there is no possibility of damaging the EL layer (a layer containing an organic compound), a variety of film formation methods and micromachining technologies can be employed. In this embodiment, after the reflective conductive film is formed by a sputtering method, a transparent conductive film is formed by a sputtering method, a pattern of the conductive film is formed by a lithography method, and then the conductive film is processed into island shapes by a wet etching method to form the electrodes 101, 103, and 104.

<<Fourth Step>>

Figure 7A:
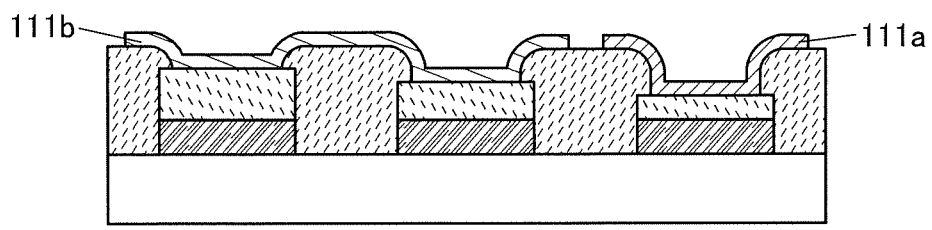
FIGS. 7A to 7C are schematic cross-sectional views illustrating a method for manufacturing a light-emitting element of one embodiment of the present invention.

In the fourth step, the carrier-injection layer 111a and the carrier-injection layer 111b are formed (see FIG. 7A).

The carrier-injection layers 111a and 111b can be formed by co-evaporating a hole-transport material and a material containing an acceptor substance. Note that a co-evaporation method is an evaporation method in which a plurality of different substances are concurrently vaporized from respective different evaporation sources.

Note that the carrier-injection layer 111a and the carrier-injection layer 111b may be formed in a plurality of steps. When carrier-injection layer 111a and the carrier-injection layer 111b are formed in a plurality of steps, they can be formed to have thicknesses which enable microcavity structures appropriate in the respective regions.

<<Fifth Step>>

Figure 7B:
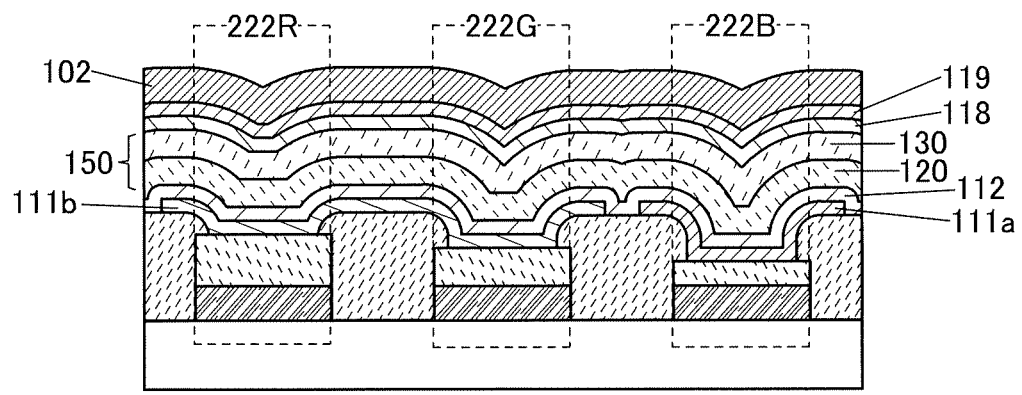

In the fifth step, the carrier-transport layer 112, the light-emitting layer 120, the light-emitting layer 130, the carrier-transport layer 118, the carrier-injection layer 119, and the electrode 102 are formed (see FIG. 7B).

The carrier-transport layer 112 can be formed by evaporating a hole-transport material.

The light-emitting layer 120 can be formed by evaporating the first light-emitting material that emits light having a wavelength for at least one color selected from violet, blue, and blue green. As the first light-emitting material, a fluorescent organic compound can be used. The fluorescent organic compound may be evaporated alone or the fluorescent organic compound mixed with another material may be evaporated. For example, the fluorescent organic compound may be used as a guest material, and the guest material may be dispersed into a host material having higher excitation energy than the guest material.

The light-emitting layer 130 can be formed by evaporating the second light-emitting material that emits light having a wavelength for at least one color selected from green, yellow green, yellow, orange, and red. As the second light-emitting material, a phosphorescent organic compound can be used. The phosphorescent organic compound may be evaporated alone or the phosphorescent organic compound mixed with another material may be evaporated. The phosphorescent organic compound may be used as a guest material, and the guest material may be dispersed into a host material having higher excitation energy than the guest material. The light-emitting layer 130 may have a two-layered structure. In such a case, the two light-emitting layers each preferably contain a light-emitting material that emits light of a different color.

The carrier-transport layer 118 can be formed by evaporating a substance having a high electron-transport property. The carrier-injection layer 119 can be formed by evaporating a material having a high electron-injection property.

The electrode 102 can be formed by stacking a reflective conductive film and a light-transmitting conductive film. The electrode 102 may have a single-layer structure or a stacked structure.

Through the above-described steps, the light-emitting element including the region 222B, the region 222G, and the region 222R over the electrode 101, the electrode 103, and the electrode 104, respectively, are formed over the substrate 200.

<<Sixth Step>>

Figure 7C:
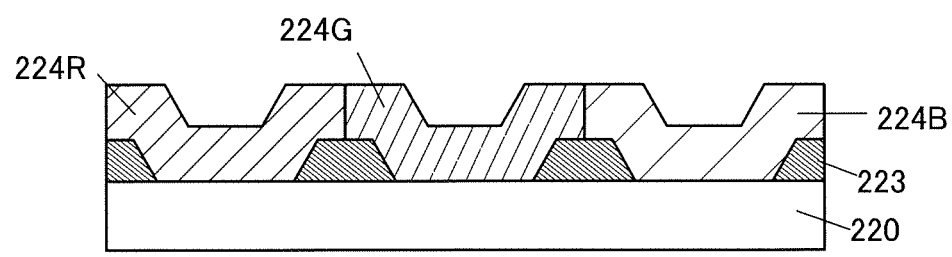

In the sixth step, the light-blocking layer 223, the optical element 224R, the optical element 224G, and the optical element 224B are formed over the substrate 220 (see FIG. 7C).

As the light-blocking layer 223, a resin film containing black pigment is formed in a desired region. Then, the optical element 224R, the optical element 224G, and the optical element 224B are formed over the substrate 220 and the light-blocking layer 223. As the optical element 224R, a resin film containing red pigment is formed in a desired region. As the optical element 224G, a resin film containing green pigment is formed in a desired region. As the optical element 224B, a resin film containing blue pigment is formed in a desired region.

<<Seventh Step>>

In the seventh step, the light-emitting element formed over the substrate 200 is attached to the light-blocking layer 223, the optical element 224R, the optical element 224G, and the optical element 224B formed over the substrate 220, and sealed with a sealant (not illustrated).

Through the above-described steps, the light-emitting element 258 illustrated in FIG. 4A can be formed.

In this embodiment, one embodiment of the present invention is described. Other embodiments of the present invention are described in Embodiments 2 to 8. Note that one embodiment of the present invention is not limited to the embodiments. For example, one embodiment of the present invention includes a first region and a second region, in which the first region includes a first injection layer, a first light-emitting layer, and a second light-emitting layer and the second region includes a second injection layer, the first light-emitting layer, and the second light-emitting layer. The first injection layer is in contact with a first electrode, and the second injection layer includes the first electrode. A light-emitting material included in the first light-emitting layer and a light-emitting material included in the second light-emitting layer emit light having different emission spectrums from each other. Described above are examples in which the color of light emitted from the first region is different from that emitted from the second region; however, one embodiment of the present invention is not limited to these examples. Depending on the case or situation, the EL layer does not necessarily include two light-emitting layers in one embodiment of the present invention. A structure not including the first region or the second region is possible. A structure not including the first injection layer in the first region is possible. A structure not including the second injection layer in the second region is possible. The first injection layer is not necessarily in contact with the first electrode. The second injection layer is not necessarily in contact with the first electrode. The color of light emitted from the first region may be the same as that emitted from the second region. The light-emitting layers may be formed by a separate coloring method.

The structure described above in this embodiment can be combined with any of the structures described in the other embodiments as appropriate.

Embodiment 2

In this embodiment, a light emission mechanism in a light-emitting element of one embodiment of the present invention will be described below with reference to FIGS. 8A and 8B, FIGS. 9A to 9C, FIGS. 10A and 10B, and FIG. 11. In FIG. 8A to FIG. 11, a portion having a function similar to that in FIG. 1 is represented by the same hatch pattern as in FIG. 1 and not especially denoted by a reference numeral in some cases. In addition, common reference numerals are used for portions having similar functions, and a detailed description of such portions is not repeated in some cases.

<Structural Example 7 of Light-Emitting Element>

Figure 8A:
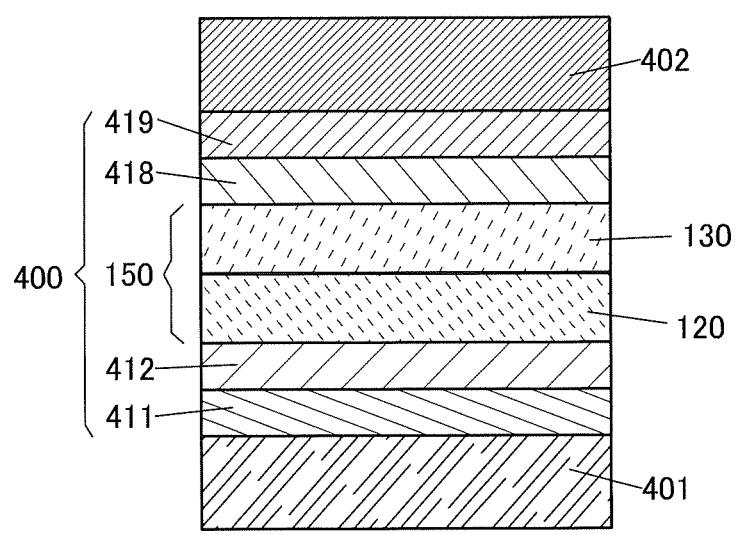
FIGS. 8A and 8B are schematic cross-sectional views of a light-emitting element of one embodiment of the present invention.
Figure 8B:
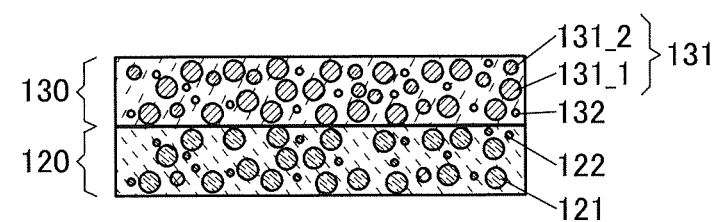

FIGS. 8A and 8B are schematic cross-sectional views of a light-emitting element 450.

In the light-emitting element 450 in FIGS. 8A and 8B, an EL layer 400 is interposed between a pair of electrodes (an electrode 401 and an electrode 402). Note that although description is given below on the assumption that the electrode 401 functions as an anode and the electrode 402 functions as a cathode in the light-emitting element 450, the functions may be interchanged in the light-emitting element 450

The EL layer 400 includes the light-emitting layer 150. The light-emitting layer 150 includes the light-emitting layer 120 and the light-emitting layer 130. In the light-emitting element 450, as the EL layer 400, a hole-injection layer 411, a hole-transport layer 412, an electron-transport layer 418, and an electron-injection layer 419 are illustrated in addition to the light-emitting layers 120 and 130. However, this stacked structure is an example, and the structure of the EL layer 400 in the light-emitting element 450 is not limited thereto. For example, the stacking order of the above layers of the EL layer 400 may be changed. Alternatively, in the EL layer 400, another functional layer other than the above layers may be provided. The functional layer may have a function of injecting a carrier (an electron or a hole), a function of transporting a carrier, a function of inhibiting a carrier, or a function of generating a carrier, for example.

In the light-emitting element 450, the electrode 401, the electrode 402, the hole-injection layer 411, the hole-transport layer 412, the electron-transport layer 418, and the electron-injection layer 419 have functions similar to those of the electrode 101, the electrode 102, the carrier-injection layers 111, 111a, and 111b, the carrier-transport layer 112, the carrier-transport layer 118, and the carrier-injection layers 119, 119a, and 119b, respectively, described in Embodiment 1. Therefore, a detailed description thereof is omitted in this embodiment.

The light-emitting layer 120 includes a host material 121 and a guest material 122. The light-emitting layer 130 includes a host material 131 and a guest material 132, and the host material 131 includes an organic compound 131_1 and an organic compound 131_2. Note that in the following description, the guest material 122 is a fluorescent light-emitting material (fluorescent material) and the guest material 132 is a phosphorescent light-emitting material (phosphorescent material).

<Light Emission Mechanism of First Light-Emitting Layer>

First, the light emission mechanism of the light-emitting layer 120 is described below.

In the light-emitting layer 120, recombination of carriers generates excitons, and the compound including the generated excitons is brought into an excited state. Because the amount of the host material 121 is large as compared with the guest material 122, the excited states are formed mostly as the excited states of the host material 121. The ratio of singlet excitons to triplet excitons generated by carrier recombination (hereinafter referred to as exciton generation probability) is approximately 1:3.

First, a case where the lowest level of the triplet excited energy level (T1 level) of the host material 121 is higher than the T1 level of the guest material 122 is described below.

Energy is transferred from the host material 121 in the triplet excited state to the guest material 122 (triplet energy transfer). However, the guest material 122 does not provide light emission in a visible light region because the guest material 122 is the fluorescent material. Thus, it is difficult to use the triplet excitation energy of the host material 121 for light emission. Therefore, when the T1 level of the host material 121 is higher than the T1 level of the guest material 122, it is difficult to use more than approximately 25% of injected carriers for light emission.

Figure 9A:
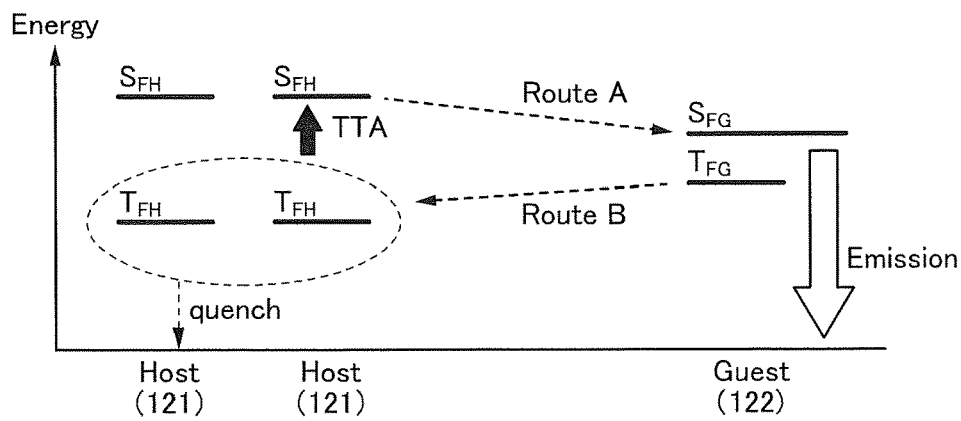
FIGS. 9A to 9C are schematic diagrams illustrating the correlation of energy levels in a light-emitting element of one embodiment of the present invention.

Next, FIG. 9A shows a correlation of energy levels between the host material 121 and the guest material 122 of the light-emitting layer 120. The following explains what terms and signs in FIG. 9A represent:

Host (121): the host material 121;

Guest (122): the guest material 122 (the fluorescent material);

$S_{FH}$: the S1 level the host material 121;

$T_{FH}$: the T1 level of the host material 121;

$S_{FG}$: the S1 level of the guest material 122 (the fluorescent material); and $T_{FG}$: the T1 level of the guest material 122 (the fluorescent material).

As shown in FIG. 9A, the T1 level of the guest material ($T_{FG}$ in FIG. 9A) is higher than the T1 level of the host material ($T_{FH}$ in FIG. 9A).

In addition, as shown in FIG. 9A, triplet excitons become adjacent to each other by triplet-triplet annihilation (TTA), and their excitation energies are partly converted into singlet excitation energy and is transferred to the S1 level of the host material 121 ($S_{FH}$). The energy is transferred from the S1 level of the host material ($S_{FH}$) to the guest material 122 (the fluorescent material) having an energy lower than the S1 level of the host material ($S_{FG}$) (see Route A in FIG. 9A); and thus the guest material (the fluorescent material) emits light.

Because the T1 level ($T_{FH}$) of the host material is lower than the T1 level of the guest material ($T_{FG}$), energy is transferred from $T_{FG}$ to $T_{FH}$ without deactivation of $T_{FG}$ (see Route B in FIG. 9A) and is utilized for TTA.

When the light-emitting layer 120 has the above structure, light emission from the guest material 122 of the light-emitting layer 120 can be efficiently obtained. Thus, it is preferable that the S1 level of the host material 121 ($S_{FH}$) be higher than the S1 level ($S_{FG}$) of the guest material 122. Furthermore, the T1 level of the host material 121 ($T_{FH}$) be lower than the T1 level ($T_{FG}$) of the guest material 122.

<Light Emission Mechanism of Second Light-Emitting Layer>

Next, the light emission mechanism of the light-emitting layer 130 is described below.

In the light-emitting layer 130, it is preferable that a combination of the organic compound 131_1 and the organic compound 131_2 included in the host material 131 form an exciplex.

Although it is acceptable as long as the combination of the organic compound 131_1 and the organic compound 131_2 can form exciplexes in the light-emitting layer 130, it is preferable that one of them be a material having a hole-transport property (hole-transport material) and the other be a material having an electron-transport property (electron-transport material). In that case, a donor-acceptor excited state is formed easily, which allows an exciplex to be formed efficiently. In the case where the combination of the organic compounds 131_1 and 131_2 is a combination of a hole-transport material and an electron-transport material, the carrier balance can be easily controlled depending on the mixture ratio. Specifically, the weight ratio of the hole-transport material to the electron-transport material is preferably within a range of 1:9 to 9:1. Since the carrier balance can be easily controlled with the structure, a recombination region can also be easily controlled.

Figure 9B:
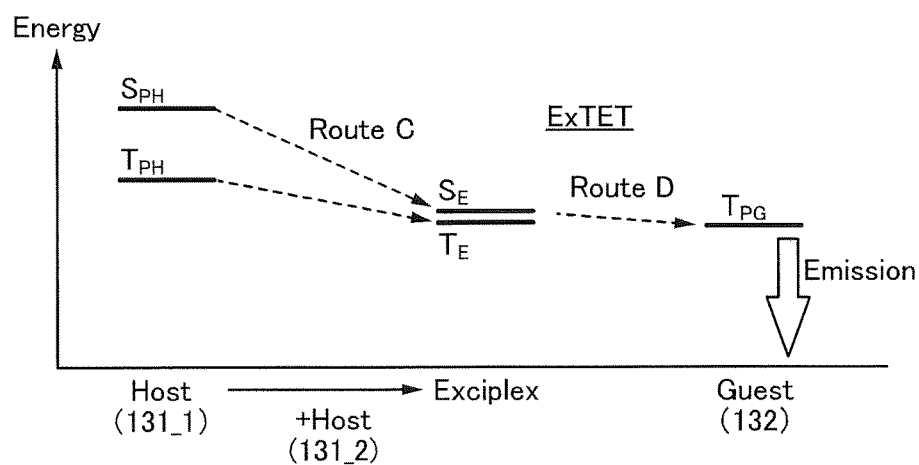

FIG. 9B shows a correlation of energy levels between the organic compound 131_1, the organic compound 131_2, and the guest material 132 in the light-emitting layer 130. The following explains what terms and signs in FIG. 9B represent:

Host (131_1): the organic compound 131_1;

Host (131_2): the organic compound 131_2;

Guest (132): the guest material 132 (the phosphorescent material);

$S_{PH}$: the S1 level of the organic compound 131_1 (host material);

$T_{PH}$: the S1 level of the organic compound 131_1 (host material);

$T_{PG}$: the T1 level of the guest material 132 (the phosphorescent material);

$S_E$: the S1 level of the exciplex; and $T_E$: the T1 level of the exciplex.

In the light-emitting element of one embodiment of the present invention, the organic compounds 131_1 and 131_2 included in the host material 131 in the light-emitting layer 130 form the exciplex. The S1 level of the exciplex ($S_E$) and the T1 level of the exciplex ($T_E$) are adjacent to each other (see Route C in FIG. 9B).

An exciplex is an excited state formed from two kinds of substances. In the case of photoexcitation, the exciplex is formed by interaction between one substance in an excited state and the other substance in a ground state. The two kinds of substances that have formed the exciplex return to a ground state by emitting light and serve as the original two kinds of substances. In the case of electrical excitation, the exciplex can be formed when a cationic molecule (having a hole) comes close to an anionic molecule (having an electron). That is, the exciplex can be formed without formation of excitation state of either molecule in the electrical excitation; thus, drive voltage can be lowered. Both energies of $S_E$ and $T_E$ of the exciplex then move to the T1 level of the guest material 132 (the phosphorescent material) to obtain light emission (see Route D in FIG. 9B).

The above-described process of Route C and Route D is in some cases referred to as exciplex-triplet energy transfer (ExTET) in this specification and the like. In other words, in the light-emitting element 450, energy can be given from the exciplex to the guest material 132 (the phosphorescent material).

When one of the organic compounds 131_1 and 131_2 receives a hole and the other of the organic compounds 131_1 and 131_2 receives an electron, the exciplex is formed. Alternatively, when one of them becomes in an excited state, the one immediately interacts with the other to form the exciplex. Therefore, most excitons in the light-emitting layer 130 exist as the exciplexes. A band gap of the exciplex is smaller than those of the organic compounds 131_1 and 131_2; therefore, the drive voltage can be lowered when the exciplex is formed.

When the light-emitting layer 130 has the above-described structure, light emission from the guest material 132 (the phosphorescent material) of the light-emitting layer 130 can be obtained efficiently.

<Light Emission Mechanism of First and Second Light-Emitting Layers>

Each light emission mechanism of the light-emitting layers 120 and 130 is described above. As in the light-emitting element 450, in the case where the light-emitting layers 120 and 130 are in contact with each other, even when energy is transferred from the exciplex to the host material 121 of the light-emitting layer 120 (in particular, when energy of the triplet excited level is transferred) at an interface between the light-emitting layer 120 and the light-emitting layer 130, triplet excitation energy can be converted into light emission in the light-emitting layer 120.

The T1 level of the host material 121 of the light-emitting layer 120 is preferably lower than T1 levels of the organic compounds 131_1 and 131_2 of the light-emitting layer 130. In the light-emitting layer 120, an S1 level of the host material 121 is preferably higher than an S1 level of the guest material 122 (the fluorescent material) while the T1 level of the host material 121 is preferably lower than the T1 level of the guest material 122 (the fluorescent material).

Figure 9C:
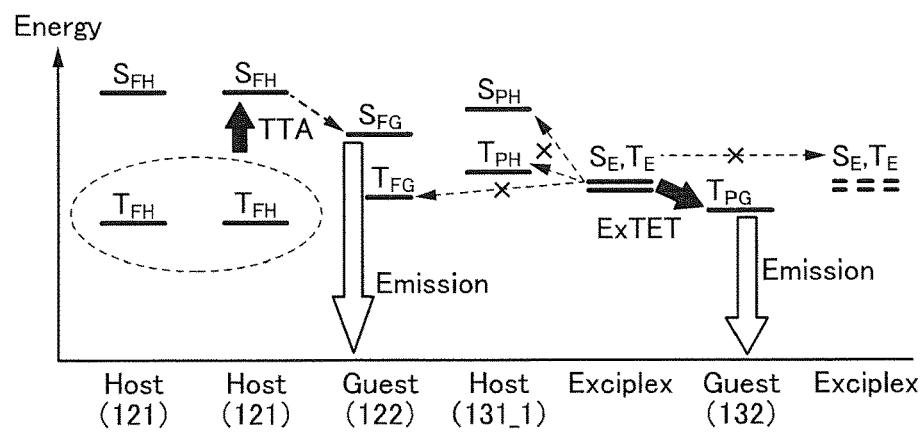

FIG. 9C shows a correlation of energy levels in the case where TTA is utilized in the light-emitting layer 120 and ExTET is utilized in the light-emitting layer 130. The following explains what terms and signs in FIG. 9C represent:

Fluorescence EML (120): the light-emitting layer 120 (the fluorescent light-emitting layer);

Phosphorescence EML (130): the light-emitting layer 130 (the phosphorescent light-emitting layer);

$S_{FH}$: the S1 level of the host material 121;

$T_{FH}$: the T1 level of the host material 121;

$S_{FG}$: the S1 level of the guest material 122 (the fluorescent material);

$T_{FG}$: the T1 level of the guest material 122 (the fluorescent material);

$S_{PH}$: the S1 level of the organic compound 131_1 (the host material);

$T_{PH}$: the T1 level of the organic compound 131_1 (the host material);

$T_{PG}$: the T1 level of the guest material 132 (the phosphorescent material);

$S_E$: the S1 level of the exciplex; and $T_E$: the T1 level of the exciplex.

As shown in FIG. 9C, the exciplex exists only in an excited state; thus, exciton diffusion between the exciplexes is less likely to occur. In addition, because the excited levels of the exciplex ($S_E$ and $T_E$) are lower than the excited levels of the organic compound 131_1 (the host material of the phosphorescent material) of the light-emitting layer 130 ($S_{PH}$ and $T_{PH}$), energy diffusion from the exciplex to the organic compound 131_1 does not occur. That is, emission efficiency of the phosphorescent light-emitting layer (the light-emitting layer 130) can be maintained because an exciton diffusion distance of the exciplex is short in the phosphorescent light-emitting layer (the light-emitting layer 130). In addition, even when part of the triplet excitation energy of the exciplex of the phosphorescent light-emitting layer (the light-emitting layer 130) diffuses into the fluorescent light-emitting layer (the light-emitting layer 120) through the interface between the fluorescent light-emitting layer (the light-emitting layer 120) and the phosphorescent light-emitting layer (the light-emitting layer 130), energy loss can be reduced because the triplet excitation energy in the fluorescent light-emitting layer (the light-emitting layer 120) caused by the diffusion is used for light emission through TTA.

The light-emitting element 450 can have high emission efficiency because ExTET is utilized in the light-emitting layer 130 and TTA is utilized in the light-emitting layer 120 as described above so that energy loss is reduced. As in the light-emitting element 450, in the case where the light-emitting layer 120 and the light-emitting layer 130 are in contact with each other, the number of EL layers 400 as well as the energy loss can be reduced. Therefore, a light-emitting element with low manufacturing cost can be obtained.

Note that the light-emitting layer 120 and the light-emitting layer 130 are not necessarily in contact with each other. In that case, it is possible to prevent energy transfer by the Dexter mechanism (particularly triplet energy transfer) from the host material 131 in an excited state or the guest material 132 (the phosphorescent material) in an excited state which is generated in the light-emitting layer 130 to the host material 121 or the guest material 122 (the fluorescent material) in the light-emitting layer 120. Therefore, the thickness of a layer provided between the light-emitting layer 120 and the light-emitting layer 130 may be several nanometers and is specifically preferably more than or equal to 1 nm and less than or equal to 5 nm.

The layer provided between the light-emitting layer 120 and the light-emitting layer 130 may contain a single material or both a hole-transport material and an electron-transport material. In the case of a single material, a bipolar material may be used. The bipolar material here refers to a material in which the ratio between the electron mobility and the hole mobility is 100 or less. Alternatively, the hole-transport material, the electron-transport material, or the like may be used. At least one of materials contained in the layer may be the same as the host material (the organic compound 131_1 or 131_2) of the light-emitting layer 130. This facilitates the manufacture of the light-emitting element and reduces the drive voltage. Furthermore, the hole-transport material and the electron-transport material may form an exciplex, which effectively prevents exciton diffusion. Specifically, it is possible to prevent energy transfer from the host material (the organic compound 131_1 or 131_2) in an excited state or the guest material 132 (the phosphorescent material) in an excited state of the light-emitting layer 130 to the host material 121 or the guest material 122 (the fluorescent material) in the light-emitting layer 120.

In the light-emitting element 450, although the light-emitting layer 120 and the light-emitting layer 130 have been described as being positioned on the hole-transport layer 412 side and the electron-transport layer 418 side, respectively, the light-emitting element of one embodiment of the present invention is not limited to this structure. For example, the light-emitting layer 120 and the light-emitting layer 130 may be positioned on the electron-transport layer 418 side and the hole-transport layer 412 side, respectively, as in a light-emitting element 450a illustrated in FIG. 10A.

Note that in the light-emitting element 450, a carrier recombination region is preferably distributed to some extent. Therefore, it is preferable that the light-emitting layer 120 or 130 have an appropriate degree of carrier-trapping property. It is particularly preferable that the guest material 132 (the phosphorescent material) in the light-emitting layer 130 have an electron-trapping property.

Note that light emitted from the light-emitting layer 120 preferably has a peak on the shorter wavelength side than light emitted from the light-emitting layer 130. The luminance of a light-emitting element using the phosphorescent material emitting light with a short wavelength tends to degrade quickly. In view of the above, fluorescence is used for light emission with a short wavelength, so that a light-emitting element with less degradation of luminance can be provided.

Furthermore, the light-emitting layers 120 and 130 are made to emit light with different emission wavelengths, so that the light-emitting element can be a multicolor light-emitting element. In that case, the emission spectrum is formed by combining light having different emission peaks, and thus has at least two peaks.

The above-described structure is suitable for obtaining white light emission. When the light-emitting layers 120 and 130 emit light of complementary colors, white light emission can be obtained.

In addition, white light emission with a high color rendering property that is formed of three primary colors or four or more colors can be obtained by using a plurality of light-emitting substances emitting light with different wavelengths for one or both of the light-emitting layers 120 and 130. In that case, the light-emitting layer 120 may be divided into layers and each of the divided layers may contain a different light-emitting material from the others.

Figure 10A:
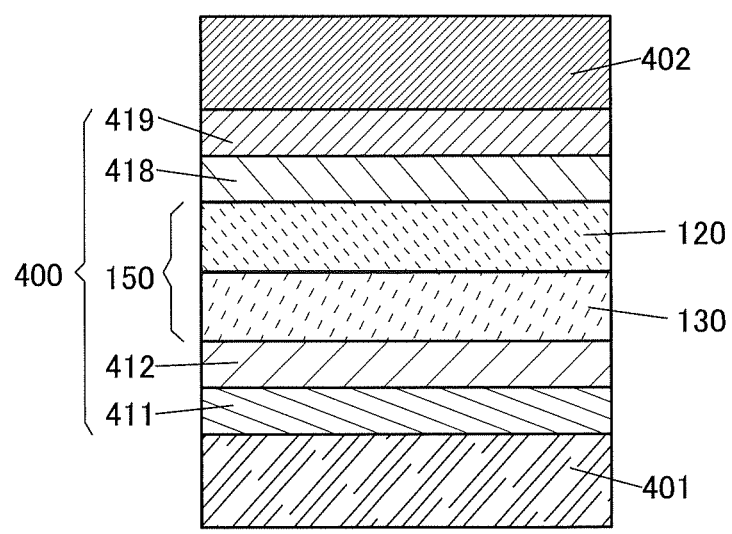
FIGS. 10A and 10B are schematic cross-sectional views of a light-emitting element of one embodiment of the present invention.
Figure 10B:
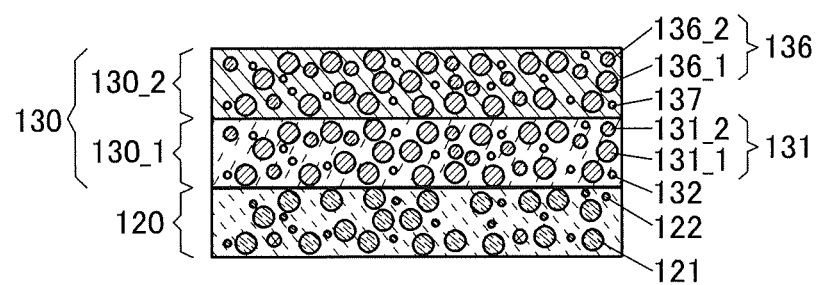

For example, as illustrated in FIG. 10B, in the case where the light-emitting layer 130 includes a plurality of light-emitting layers that are the light-emitting layer 130_1 and the light-emitting layer 130_2, the light-emitting layer 130_1 preferably includes the host material 131 and the guest material 132, and the light-emitting layer 130_2 preferably includes a host material 136 and a guest material 137. In this case, a combination of the organic compound 131_1 and the organic compound 131_2 included in the host material 131 preferably forms an exciplex, and a combination of an organic compound 136_1 and an organic compound 136_2 included in the host material 136 preferably forms an exciplex. In this way, both the light-emitting layer 130_1 and the light-emitting layer 130_2 can emit light with high emission efficiency.

In the above-described structure, when the light-emitting layer 130 includes two kinds of guest materials (the guest material 132 and the guest material 137), it is preferable that the guest material 122 in the light-emitting layer 120 emit blue light, one of the guest materials in the light-emitting layer 130 emit green light, and the other guest material in the light-emitting layer 130 emit red light. The guest material 122 in the light-emitting layer 120 preferably emits light having a peak of an emission spectrum of higher than or equal to 400 nm and lower than 480 nm, one of the guest materials in the light-emitting layer 130 preferably emits light having a peak of an emission spectrum of higher than or equal to 480 nm and lower than 580 nm, and the other guest material in the light-emitting layer 130 preferably emits light having a peak of an emission spectrum of higher than or equal to 580 nm and lower than or equal to 740 nm. In this way, the light-emitting element can emit light of three primary colors of blue, green, and red, achieving high color rendering properties. Furthermore, the light-emitting element can be favorably used in a display device.

Note that in FIG. 10B, the organic compound 131_1 and the organic compound 136_1 may be the same compound or different compounds. It is preferable to use the same compound as the organic compound 131_1 and the organic compound 136_1 because fabrication of the light-emitting element is easy. The same can apply to the organic compound 131_2 and the organic compound 136_2.

Furthermore, in the light-emitting layer 130_1 and the light-emitting layer 130_2, either one of the organic compounds 131_1 and 131_2 or either one of the organic compounds 136_1 and 136_2 may be included. The organic compounds 131_1 and 131_2 and the organic compounds 136_1 and 136_2 which are used in the light-emitting layer 130_1 and the light-emitting layer 130_2 are selected as appropriate so as to obtain appropriate carrier balance or emission color for the light-emitting element.

By combining the above-described structure and the structure of the carrier-injection layer (the hole-injection layer or the electron-injection layer) described in Embodiment 1, the region where the carrier recombination region and the light-emitting region are distributed can be adjusted and a light-emitting element with high emission efficiency can be fabricated. In other words, by using the carrier-injection layer 111a and 111b or the carrier-injection layers 119a and 119b as the hole-injection layer 411 and the electron-injection layer 419, a light-emitting element including a region in which the region where the carrier recombination region is distributed is adjusted can be fabricated.

When the above-described structure is used for the light-emitting element shown in Embodiment 1, which includes a plurality of different electrode structures and carrier-injection layers in subpixels, the emission intensity of one of the light-emitting layers 120 and 130 can be high in the first region including the first injection layer and the emission intensity of the other thereof can be high in the second region including the second injection layer, in the light-emitting element including the pair of electrodes. In other words, with the use of the carrier injection layers of one embodiment of the present invention, light of different emission colors can be extracted from each subpixel without depositing the light-emitting layers side by side. Thus, a display device having high light use efficiency can be manufactured without reducing yield. That is, a display device with low power consumption can be manufactured. In addition, the manufacturing cost of the display device can be reduced.

<Components of Light-Emitting Element>

Next, materials that can be used for the light-emitting layers 120 and 130 will be described below.

<<Material that can be Used for First Light-Emitting Layer>>

In the light-emitting layer 120, the host material 121 is present in the highest proportion by weight, and the guest material 122 (the fluorescent material) is dispersed in the host material 121. The S1 level of the host material 121 is preferably higher than the S1 level of the guest material 122 (the fluorescent material) while the T1 level of the host material 121 is preferably lower than the T1 level of the guest material 122 (the fluorescent material).

In particular, an anthracene derivative or a tetracene derivative is preferably used as the host material 121. This is because these derivatives each have a high S1 level and a low T1 level. Any of the host material described in Embodiment 1 can be used.

Examples of the guest material 122 (the fluorescent material) include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like. A pyrene derivative is particularly preferable because it has a high emission quantum yield. Any of the light-emitting substances that convert singlet excitation energy into light emission described in Embodiment 1 can be used.

<<Material that can be Used for Second Light-Emitting Layer>>

In the light-emitting layer 130, the host material 131 (the organic compounds 131_1 and 131_2) is present in the highest proportion by weight, and the guest material 132 (the phosphorescent material) is dispersed in the host material 131 (the organic compounds 131_1 and 131_2). The T1 level of the host material 131 (the organic compounds 131_1 and 131_2) of the light-emitting layer 130 is preferably higher than the T1 level of the guest material 122 (the fluorescent material) of the light-emitting layer 120.

As the host material 131 (the organic compounds 131_1 and 131_2), a n-electron deficient heteroaromatic compound such as a nitrogen-containing heteroaromatic compound, a metal complex, or the like can be used. Specifically, a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, or the like can be used. As another example, a π-electron rich heteroaromatic compound (e.g., a carbazole derivative or an indole derivative), an aromatic amine compound, or the like can be favorably used. The electron-transport material or the hole-transport material described in Embodiment 1 can be used.

It is preferable that a combination of the organic compounds 131_1 and 131_2 form an exciplex. Specifically, the electron-transport material and the hole-transport material described in Embodiment 1 can be used. In that case, it is preferable that the organic compound 131_1, the organic compound 131_2, and the guest material 132 (the phosphorescent material) be selected such that the emission peak of the exciplex overlaps with an absorption band, specifically an absorption band on the longest wavelength side, of a triplet metal to ligand charge transfer (MLCT) transition of the phosphorescent material. This makes it possible to provide a light-emitting element with drastically improved emission efficiency. However, if a material exhibiting thermally activated delayed fluorescence (TADF) is used instead of the phosphorescent material, it is preferred that an absorption band on the longest wavelength side be a singlet absorption band.

As the guest material 132 (the phosphorescent material), an iridium-, rhodium-, or platinum-based organometallic complex or a metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given. Any of the light-emitting materials that can convert triplet excitation energy into light emission described in Embodiment 1 can be used.

As the light-emitting material included in the light-emitting layer 130, any material can be used as long as the material can convert the triplet excitation energy into light emission. As an example of the material that can convert the triplet excitation energy into light emission, a TADF material can be given in addition to a phosphorescent material. Therefore, it is acceptable that the "phosphorescent material" in the description is replaced with the "TADF material". Note that the TADF material is a substance that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is preferably greater than or equal to 0 eV and less than or equal to 0.2 eV, further preferably greater than or equal to 0 eV and less than or equal to 0.1 eV.

The material that exhibits thermally activated delayed fluorescence may be a material that can form a singlet excited state by itself from a triplet excited state by reverse intersystem crossing or may be a combination of a plurality of materials which form an exciplex.

In the case where the material exhibiting thermally activated delayed fluorescence is formed of one kind of material, any of the thermally activated delayed fluorescent substances described in Embodiment 1 can be specifically used.

There is no limitation on the emission colors of the light-emitting material included in the light-emitting layer 120 and the light-emitting material included in the light-emitting layer 130, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material included in the light-emitting layer 120 is preferably shorter than that of the light-emitting material included in the light-emitting layer 130.

Note that the light-emitting layers 120 and 130 can be formed by an evaporation method (including a vacuum evaporation method), an ink-jet method, a coating method, gravure printing, or the like.

<Structural Example 8 of Light-Emitting Element>

Next, a light-emitting element having a structure different from that illustrated in FIGS. 8A and 8B will be described with reference to FIG. 11. FIG. 11 is a schematic cross-sectional view of a light-emitting element 452.

The light-emitting element 452 illustrated in FIG. 11 includes a plurality of light-emitting units (a light-emitting unit 406 and a light-emitting unit 408 in FIG. 11) between a pair of electrodes (the electrode 401 and the electrode 402). One light-emitting unit has the same structure as the EL layer 100 illustrated in FIG. 1 or the EL layer 400 illustrated in FIGS. 8A and 8B. That is, the light-emitting element 250 in FIG. 1 and the light-emitting element 450 illustrated in FIGS. 8A and 8B each include one light-emitting unit, while the light-emitting element 452 includes a plurality of light-emitting units. Note that the electrode 401 functions as an anode and the electrode 402 functions as a cathode in the following description of the light-emitting element 452; however, the functions may be interchanged in the light-emitting element 452.

In the light-emitting element 452 illustrated in FIG. 11, the light-emitting unit 406 and the light-emitting unit 408 are stacked, and a charge-generation layer 415 is provided between the light-emitting unit 406 and the light-emitting unit 408. Note that the light-emitting unit 406 and the light-emitting unit 408 may have the same structure or different structures. For example, it is preferable that the EL layer 100 illustrated in FIG. 1 or the EL layer 400 illustrated in FIGS. 8A and 8B be used in the light-emitting unit 406.

That is, the light-emitting element 452 includes the light-emitting layer 150 and a light-emitting layer 140. The light-emitting unit 406 includes the hole-injection layer 411, the hole-transport layer 412, an electron-transport layer 413, and an electron-injection layer 414 in addition to the light-emitting layer 150. The light-emitting layer 150 includes the light-emitting layer 120 and the light-emitting layer 130. The light-emitting unit 408 includes a hole-injection layer 416, a hole-transport layer 417, an electron-transport layer 418, and an electron-injection layer 419 in addition to the light-emitting layer 140.

In the light-emitting element 452, the electrode 401, the electrode 402, the hole-injection layers 411 and 416, the hole-transport layers 412 and 417, the electron-transport layers 413 and 418, and the electron-injection layers 414 and 419 have functions similar to those of the electrode 101, the electrode 102, the carrier-injection layers 111, 111a, and 111b, the carrier-transport layer 112, the carrier-transport layer 118, and the carrier-injection layers 119, 119a, and 119b described in Embodiment 1, respectively. Therefore, a detailed description thereof is omitted in this embodiment.

The charge-generation layer 415 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 415 contains a composite material of an organic compound and an acceptor substance, the composite material that can be used for the hole-injection layer described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1 \times 10^{-6}$ cm$^2$/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 415 like the light-emitting unit 408, the charge-generation layer 415 can also serve as a hole-injection layer or a hole-transport layer of the light-emitting unit; thus, a hole-injection layer or a hole-transport layer need not be included in the light-emitting unit.

The charge-generation layer 415 may have a stacked structure of a layer containing the composite material of an organic compound and an acceptor substance and a layer containing another material. For example, the charge-generation layer 415 may be formed using a combination of a layer containing the composite material of an organic compound and an acceptor substance with a layer containing one compound selected from among donor materials and a compound having a high electron-transport property. Furthermore, the charge-generation layer 415 may be formed using a combination of a layer containing the composite material of an organic compound and an acceptor substance with a layer including a transparent conductive film.

The charge-generation layer 415 provided between the light-emitting unit 406 and the light-emitting unit 408 may have any structure as long as electrons can be injected to the light-emitting unit on one side and holes can be injected into the light-emitting unit on the other side when a voltage is applied between the electrode 401 and the electrode 402. For example, in FIG. 11, the charge-generation layer 415 injects electrons into the light-emitting unit 406 and holes into the light-emitting unit 408 when a voltage is applied such that the potential of the electrode 401 is higher than that of the electrode 402.

Note that in terms of light extraction efficiency, the charge-generation layer 415 preferably has a visible light transmittance (specifically, a visible light transmittance of higher than or equal to 40%). The charge-generation layer 415 functions even if it has lower conductivity than the pair of electrodes (the electrodes 401 and 402).

Note that forming the charge-generation layer 415 by using any of the above materials can suppress an increase in drive voltage caused by the stack of the light-emitting layers.

The light-emitting element having two light-emitting units is described with reference to FIG. 11; however, a similar structure can be applied to a light-emitting element in which three or more light-emitting units are stacked. With a plurality of light-emitting units partitioned by the charge-generation layer between a pair of electrodes as in the light-emitting element 452, it is possible to provide a light-emitting element which can emit light with high luminance with the current density kept low and has a long lifetime. A light-emitting element with low power consumption can be provided.

When the structure of the EL layer 100 illustrated in FIG. 1 or the EL layer 400 illustrated in FIGS. 8A and 8B is used for at least one of the plurality of units, a light-emitting element with high emission efficiency can be provided.

It is preferable to use the light-emitting layer 120 or the light-emitting layer 130 illustrated in FIGS. 8A and 8B as the light-emitting layer 140 included in the light-emitting unit 408. In other words, both the light-emitting unit 406 and the light-emitting unit 408 include one or both of the light-emitting layers 120 and 130, so that light emitted from one or both of the light-emitting layers 120 and 130 can be obtained from both of the light-emitting units 406 and 408.

Note that in each of the above-described structures, the guest materials (fluorescent or phosphorescent materials) used in the light-emitting unit 406 and the light-emitting unit 408 may be the same or different. In the case where the same guest material is used for the light-emitting unit 406 and the light-emitting unit 408, the light-emitting element 452 can exhibit high emission luminance at a small current value, which is preferable. In the case where different guest materials are used for the light-emitting unit 406 and the light-emitting unit 408, the light-emitting element 452 can exhibit multi-color light emission, which is preferable. It is particularly favorable to select the guest materials so that white light emission with high color rendering properties or light emission of at least red, green, and blue can be obtained.

Note that the light-emitting unit 406, the light-emitting unit 408, and the charge-generation layer 115 can formed by any of the following methods: an evaporation method (including a vacuum evaporation method), an ink-jet method, a coating method, gravure printing, and the like.

Note that the structure described in this embodiment can be combined as appropriate with any of the structures described in the other embodiments.

Embodiment 3

In this embodiment, a display device of one embodiment of the present invention will be described below with reference to FIGS. 12A and 12B, FIGS. 13A and 13B, FIG. 14, FIGS. 15A and 15B, FIGS. 16A and 16B, FIG. 17, and FIGS. 18A and 18B.

<Structure Example 1 of Display Device>

Figure 12A:
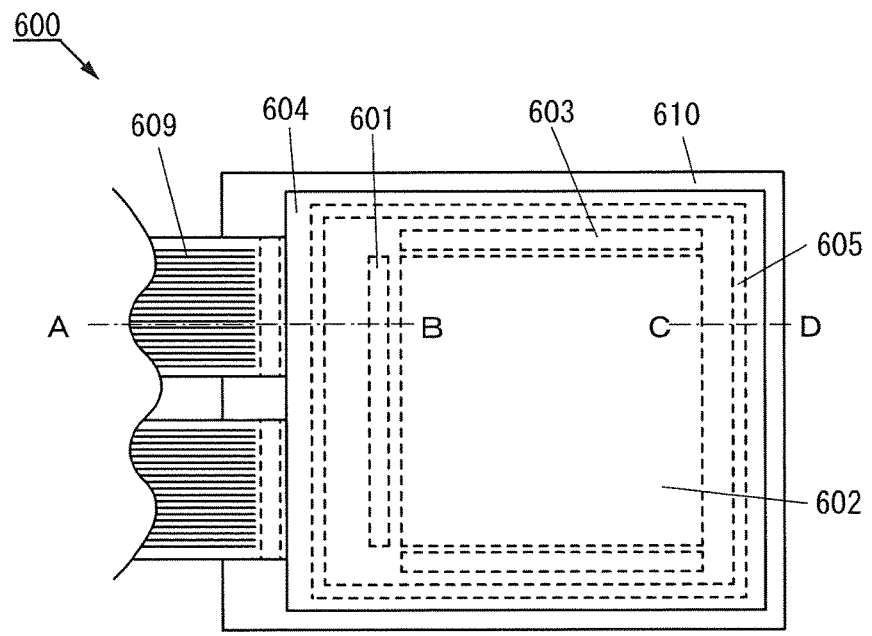
FIGS. 12A and 12B are a top view and a schematic cross-sectional view illustrating a display device of one embodiment of the present invention.
Figure 12B:
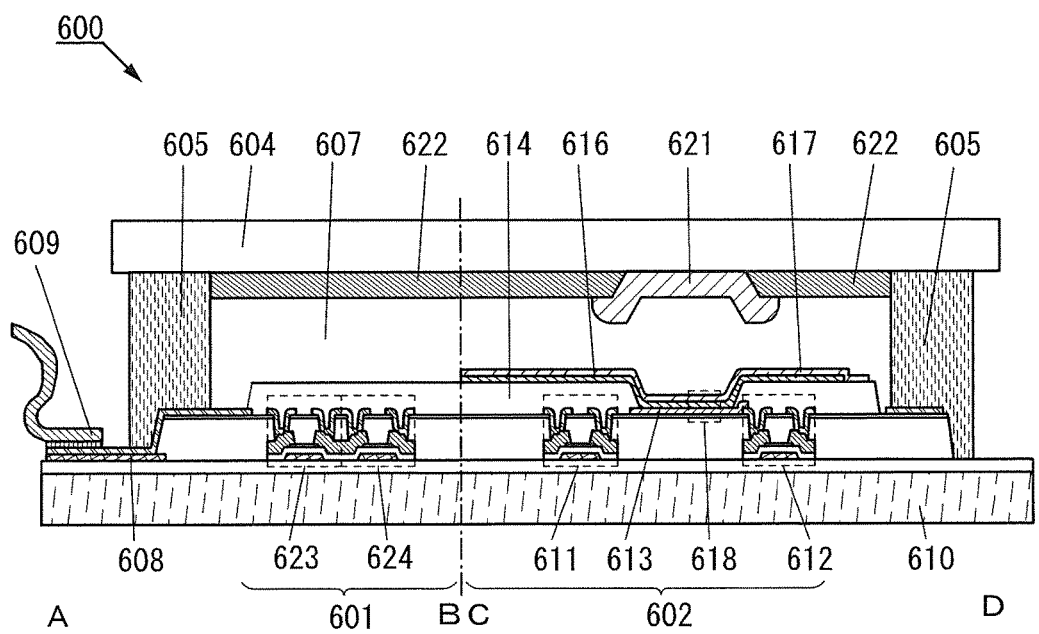

FIG. 12A is a top view illustrating a display device 600 and FIG. 12B is a cross-sectional view taken along the dashed-dotted line A-B and the dashed-dotted line C-D in FIG. 12A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission of a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for these transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more and further preferably 3 eV or more, for the transistors, so that the off-state current of the transistors can be reduced. Examples of the oxide semiconductor include an In—Ga oxide and an In-M-Zn oxide (M is aluminum (Al), gallium (Ga), yttrium (Y), zirconium (Zr), lanthanum (La), cerium (Ce), tin (Sn), hafnium (Hf), or neodymium (Nd)).

An EL layer 616 and an upper electrode 617 are formed over the lower electrode 613. Here, the lower electrode 613 functions as an anode and the upper electrode 617 functions as a cathode.

In addition, the EL layer 616 is formed by various methods such as an evaporation method with an evaporation mask, an ink-jet method, or a spin coating method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 has any of the structures described in Embodiments 1 and 2. In the case where the pixel portion includes a plurality of light-emitting elements, the pixel portion may include both any of the light-emitting elements described in Embodiments 1 and 2 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. It is preferable that the sealing substrate be provided with a recessed portion and the desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 1, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

In the above-described manner, the display device including any of the light-emitting elements and the optical elements which are described in Embodiments 1 and 2 can be obtained.

<Structure Example 2 of Display Device>

Next, another example of the display device is described with reference to FIGS. 13A and 13B and FIG. 14. Note that FIGS. 13A and 13B and FIG. 14 are each a cross-sectional view of a display device of one embodiment of the present invention.

Figure 13A:
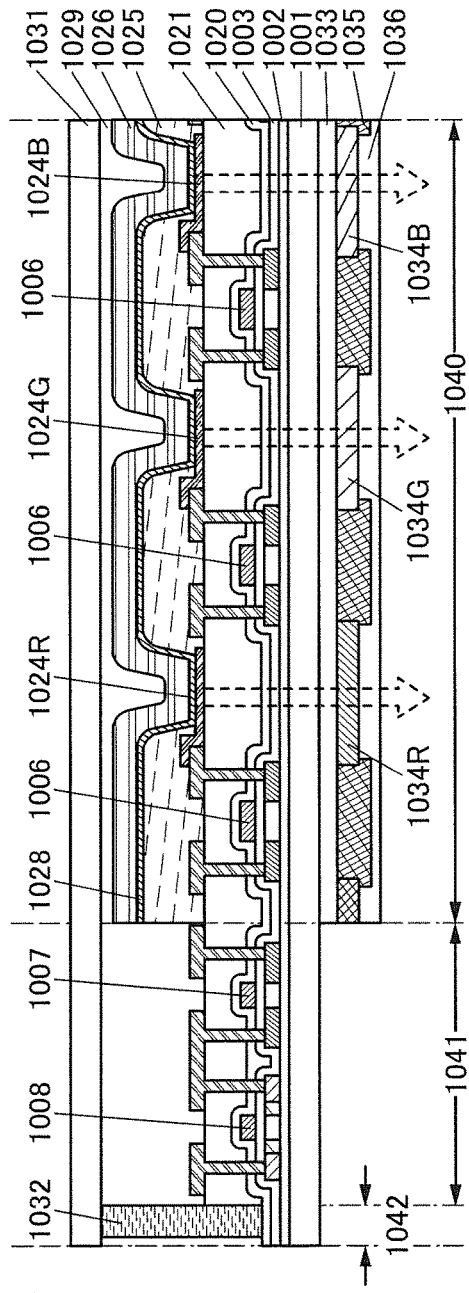
FIGS. 13A and 13B are schematic cross-sectional views each illustrating a display device of one embodiment of the present invention.
Figure 14:
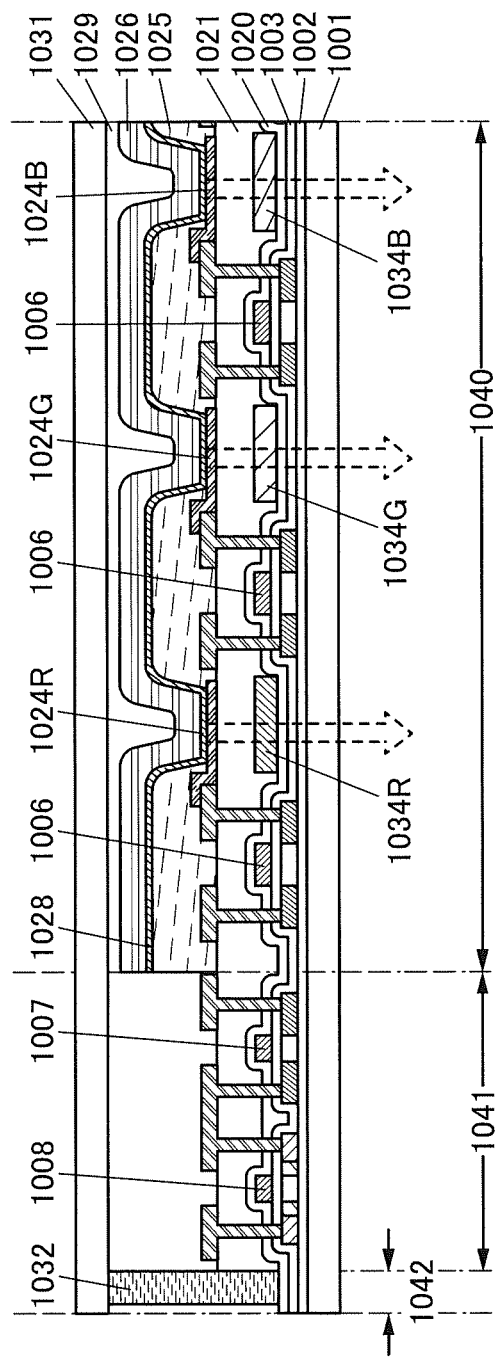
FIG. 14 is a schematic cross-sectional view illustrating a display device of one embodiment of the present invention.

In FIG. 13A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 13A, examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 13A, red light, green light, and blue light transmit the coloring layers, and thus an image can be displayed with the use of pixels of three colors.

Figure 13B:
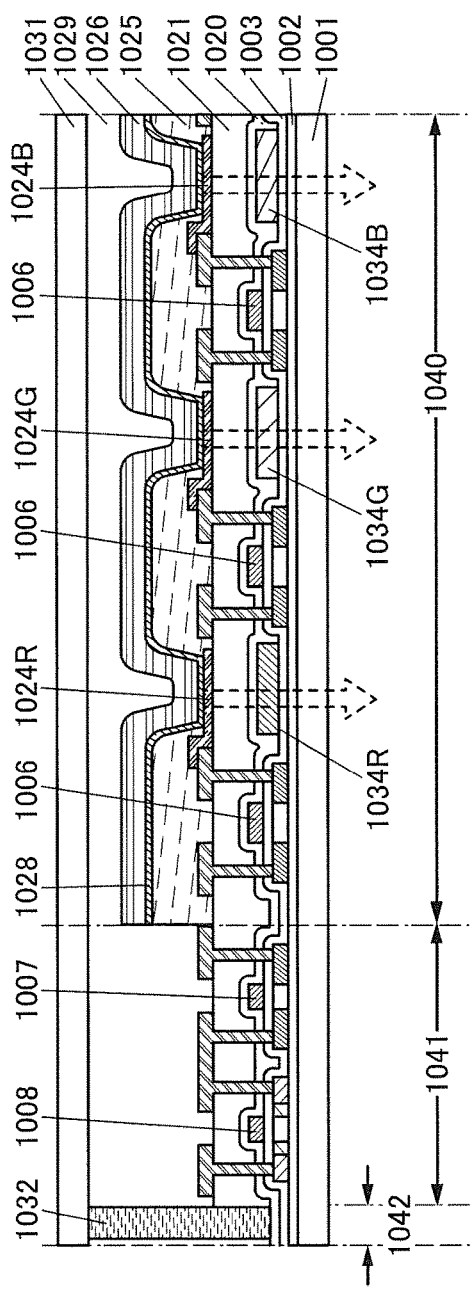

FIG. 13B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

FIG. 14 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in this structure, the coloring layers may be provided between the substrate 1001 and the sealing substrate 1031.

The above-described display device has a structure in which light is extracted from the substrate 1001 side where the transistors are formed (a bottom-emission structure), but may have a structure in which light is extracted from the sealing substrate 1031 side (a top-emission structure).

<Structure Example 3 of Display Device>

Figure 15A:
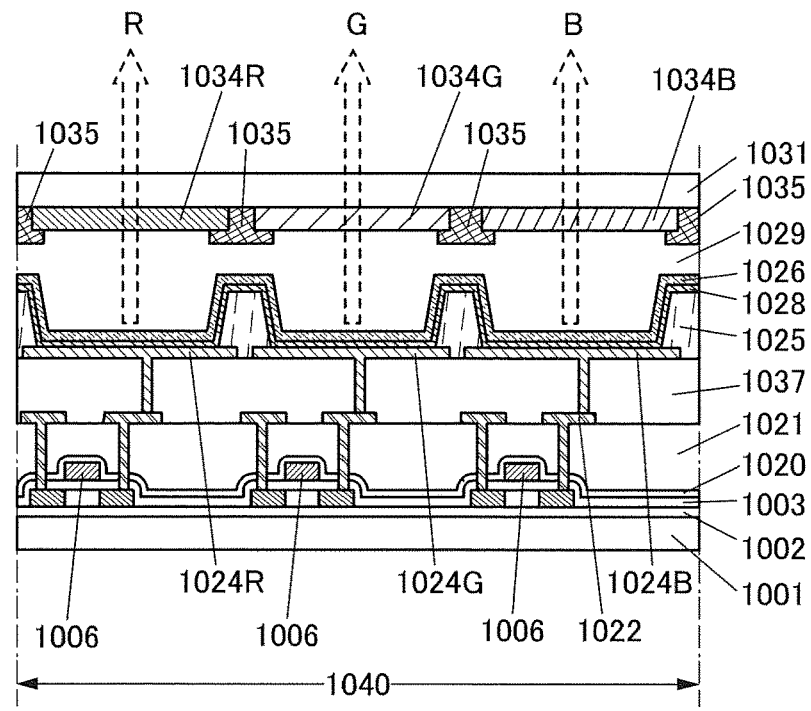
FIGS. 15A and 15B are schematic cross-sectional views each illustrating a display device of one embodiment of the present invention.
Figure 15B:
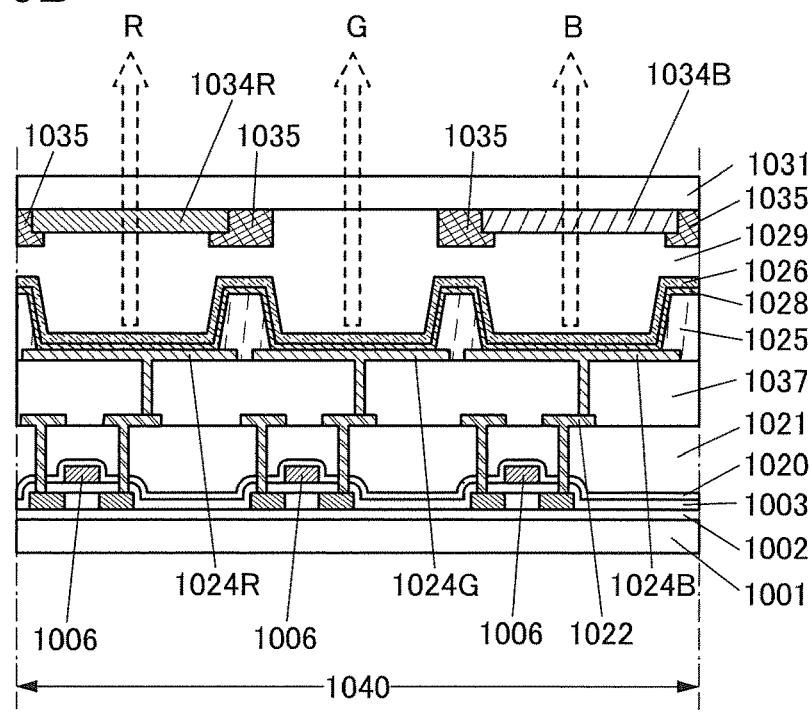

FIGS. 15A and 15B are each an example of a cross-sectional view of a display device having a top emission structure. Note that FIGS. 15A and 15B are each a cross-sectional view illustrating the display device of one embodiment of the present invention, and the driver circuit portion 1041, the peripheral portion 1042, and the like, which are illustrated in FIGS. 13A and 13B and FIG. 14, are not illustrated therein.

In this case, as the substrate 1001, a substrate that does not transmit light can be used. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed using a material similar to that of the second interlayer insulating film, or can be formed using any other various materials.

The lower electrodes 1024R, 1024G, and 1024B of the light-emitting elements each function as an anode here, but may function as a cathode. Further, in the case of a display device having a top-emission structure as illustrated in FIGS. 15A and 15B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light having a specific wavelength is increased.

In the case of a top-emission structure as illustrated in FIG. 15A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 15A illustrates the structure provided with the light-emitting elements and the coloring layers for the light-emitting elements as an example; however, the structure is not limited thereto. For example, as shown in FIG. 15B, a structure including the red coloring layer 1034R and the blue coloring layer 1034B but not including a green coloring layer may be employed to achieve full color display with the three colors of red, green, and blue. The structure as illustrated in FIG. 15A where the light-emitting elements are provided with the coloring layers is effective to suppress reflection of external light. In contrast, the structure as illustrated in FIG. 15B where the light-emitting elements are provided with the red coloring layer and the blue coloring layer and without the green coloring layer is effective to reduce power consumption because of small energy loss of light emitted from the green light-emitting element.

<Structure Example 4 of Display Device>

Figure 17:
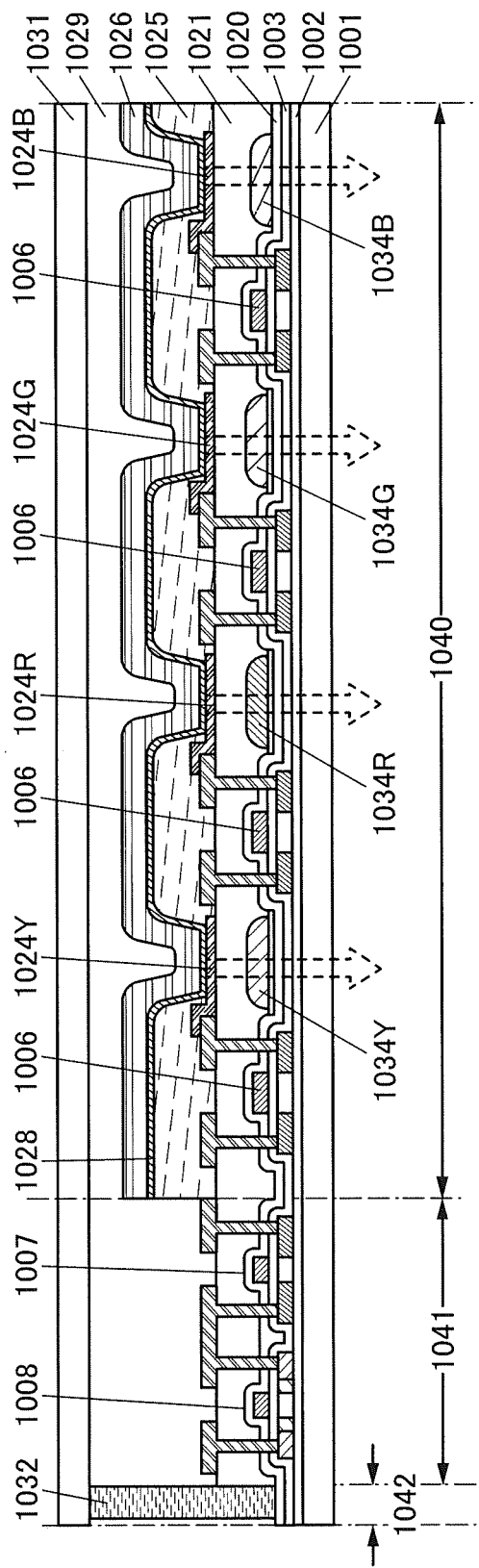
FIG. 17 is a schematic cross-sectional view illustrating a display device of one embodiment of the present invention.

Although a display device including sub-pixels of three colors (red, green, and blue) is described above, the number of colors of sub-pixels may be four (red, green, blue, and yellow, or red, green, blue, and white). FIGS. 16A and 16B, FIG. 17, and FIGS. 18A and 18B illustrate structures of display devices each including the lower electrodes 1024R, 1024G, 1024B, and 1024Y. FIGS. 16A and 16B and FIG. 17 each illustrate a display device having a structure in which light is extracted from the substrate 1001 side on which transistors are formed (bottom-emission structure), and FIGS. 18A and 18B each illustrate a display device having a structure in which light is extracted from the sealing substrate 1031 side (top-emission structure).

FIG. 16A illustrates an example of a display device in which optical elements (the coloring layer 1034R, the coloring layer 1034G, the coloring layer 1034B, and a coloring layer 1034Y) are provided on the transparent base material 1033. FIG. 16B illustrates an example of a display device in which optical elements (the coloring layer 1034R, the coloring layer 1034G, the coloring layer 1034B, and the coloring layer 1034Y) are provided between the gate insulating film 1003 and the first interlayer insulating film 1020. FIG. 17 illustrates an example of a display device in which optical elements (the coloring layer 1034R, the coloring layer 1034G, the coloring layer 1034B, and the coloring layer 1034Y) are provided between the first interlayer insulating film 1020 and the second interlayer insulating film 1021.

The coloring layer 1034R transmits red light, the coloring layer 1034G transmits green light, and the coloring layer 1034B transmits blue light. The coloring layer 1034Y transmits yellow light or transmits light of a plurality of colors selected from blue, green, yellow, and red. When the coloring layer 1034Y can transmit light of a plurality of colors selected from blue, green, yellow, and red, light released from the coloring layer 1034Y may be white light. Since the light-emitting element which transmits yellow or white light has high emission efficiency, the display device including the coloring layer 1034Y can have lower power consumption.

Figure 18A:
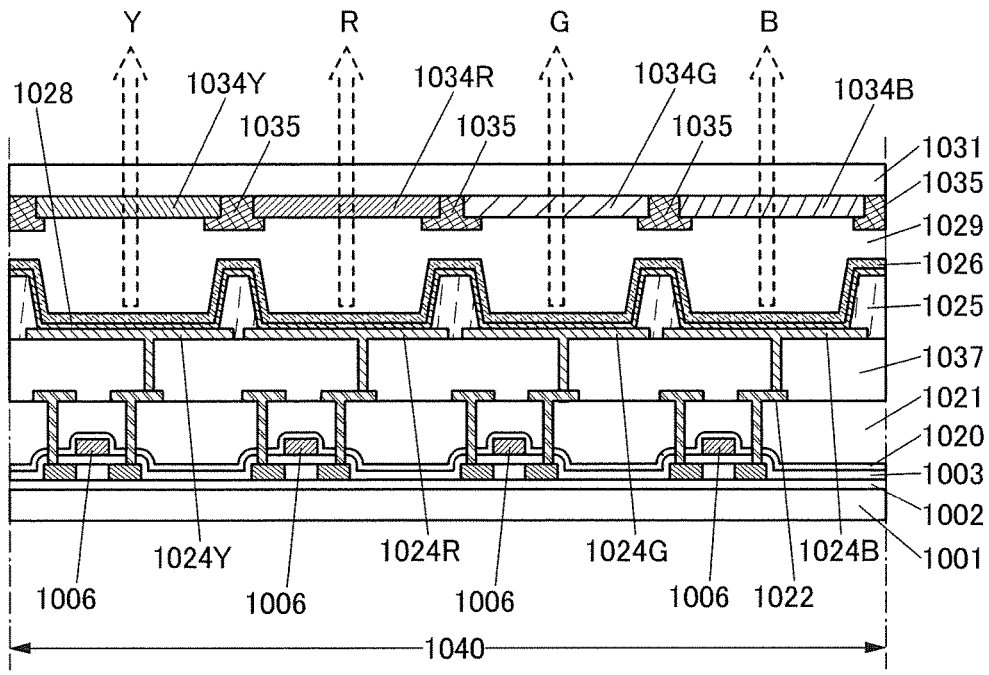
FIGS. 18A and 18B are each a schematic cross-sectional view of a display device of one embodiment of the present invention.
Figure 18B:
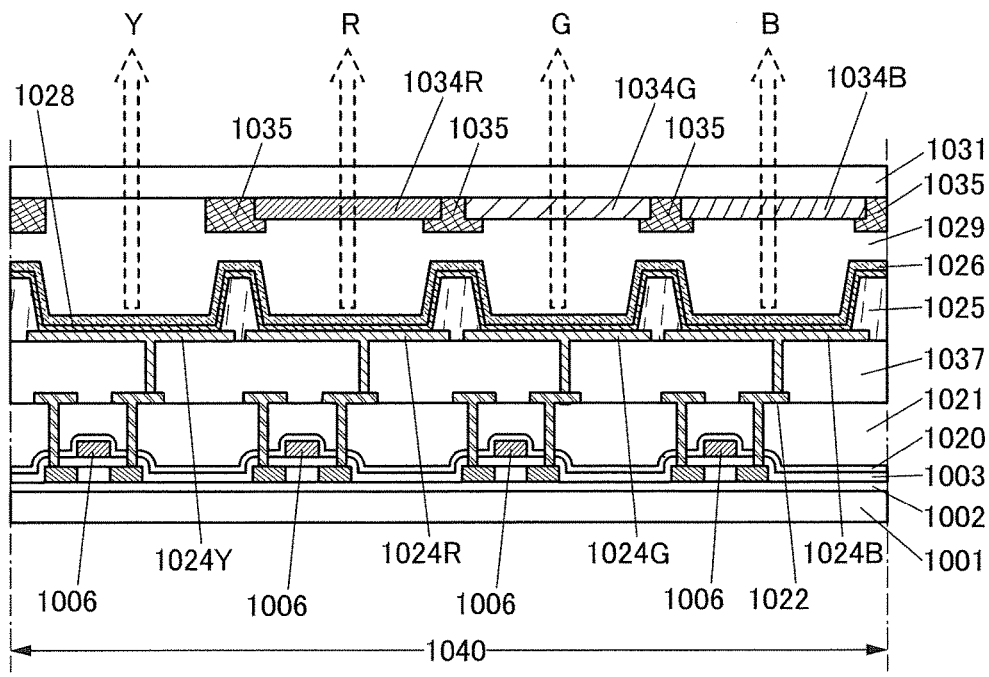

In the top-emission display devices illustrated in FIGS. 18A and 18B, a light-emitting element including the lower electrode 1024Y preferably has a microcavity structure between the lower electrode and the upper electrode 1026 as in the display device illustrated in FIG. 15A. In the display device illustrated in FIG. 18A, sealing can be performed with the sealing substrate 1031 on which the coloring layers (the red coloring layer 1034R, the green coloring layer 1034G, the blue coloring layer 1034B, and the yellow coloring layer 1034Y) are provided.

Light emitted through the microcavity and the yellow coloring layer 1034Y has an emission spectrum in a yellow region. Since yellow is a color with a high luminosity factor, a light-emitting element emitting yellow light has high emission efficiency. Therefore, the display device of FIG. 18A can reduce power consumption.

FIG. 18A illustrates the structure provided with the light-emitting elements and the coloring layers for the light-emitting elements as an example; however, the structure is not limited thereto. For example, as shown in FIG. 18B, a structure including the red coloring layer 1034R, the green coloring layer 1034G, and the blue coloring layer 1034B but not including a yellow coloring layer may be employed to achieve full color display with the four colors of red, green, blue, and yellow or of red, green, blue, and white. The structure as illustrated in FIG. 18A where the light-emitting elements are provided with the coloring layers is effective to suppress reflection of external light. In contrast, the structure as illustrated in FIG. 18B where the light-emitting elements are provided with the red coloring layer, the green coloring layer, and the blue coloring layer and without the yellow coloring layer is effective to reduce power consumption because of small energy loss of light emitted from the yellow or white light-emitting element.

The structure described in this embodiment can be combined with any of the structures in this embodiment and the other embodiments.

Embodiment 4

In this embodiment, a display device including a light-emitting element of one embodiment of the present invention will be described with reference to FIGS. 19A and 19B, FIGS. 20A and 20B, and FIGS. 21A and 21B.

Figure 19A:
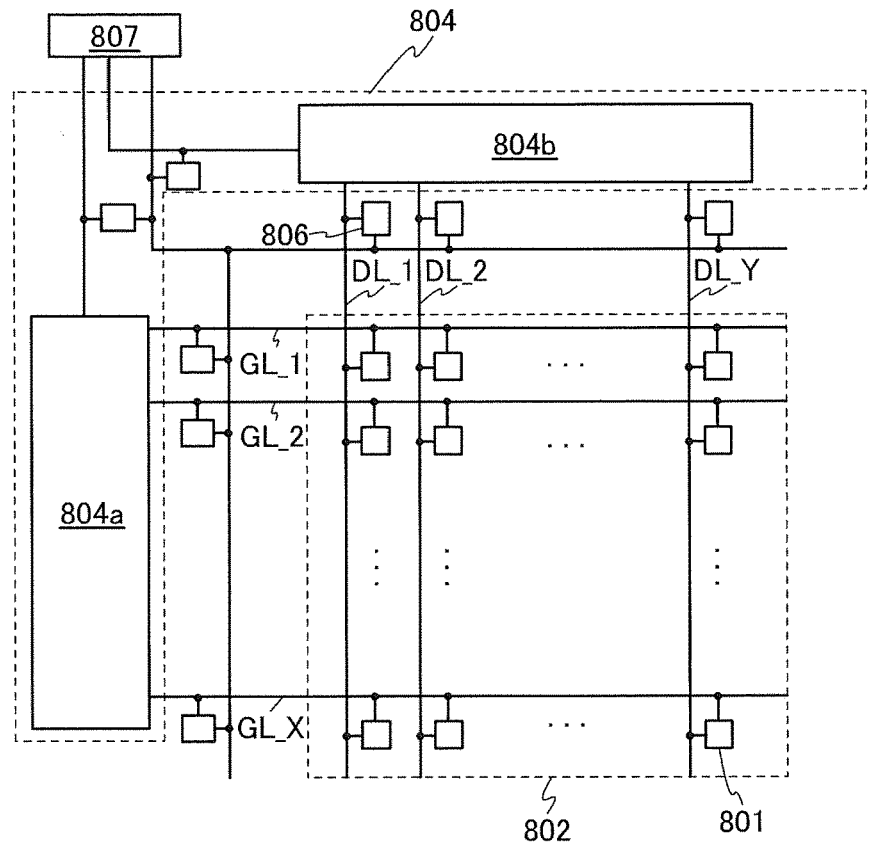
FIGS. 19A and 19B are a block diagram and a circuit diagram illustrating a display device of one embodiment of the present invention.
Figure 19B:
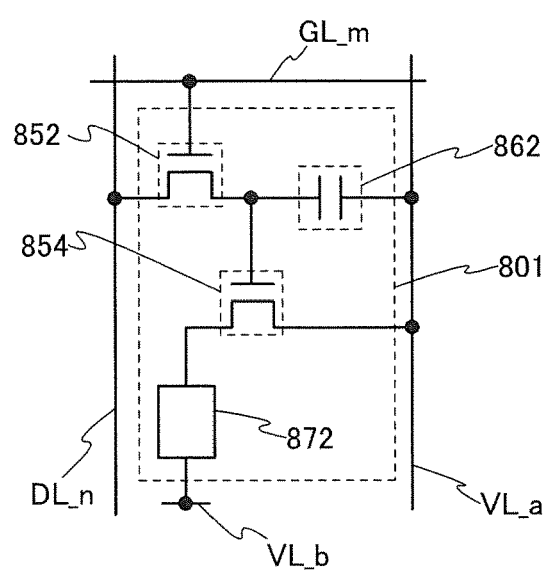

FIG. 19A is a block diagram illustrating the display device of one embodiment of the present invention, and FIG. 19B is a circuit diagram illustrating a pixel circuit of the display device of one embodiment of the present invention.

<Description of Display Device>

The display device illustrated in FIG. 19A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804a) and a circuit for supplying a signal (data signal) to drive a display element in a pixel (the circuit is hereinafter referred to as a signal line driver circuit 804b).

The scan line driver circuit 804a includes a shift register or the like. Through the terminal portion 807, the scan line driver circuit 804a receives a signal for driving the shift register and outputs a signal. For example, the scan line driver circuit 804a receives a start pulse signal, a clock signal, or the like and outputs a pulse signal. The scan line driver circuit 804a has a function of controlling the potentials of wirings supplied with scan signals (such wirings are hereinafter referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Without being limited thereto, the scan line driver circuit 804a can supply another signal.

The signal line driver circuit 804b includes a shift register or the like. The signal line driver circuit 804b receives a signal (video signal) from which a data signal is derived, as well as a signal for driving the shift register, through the terminal portion 807. The signal line driver circuit 804b has a function of generating a data signal to be written to the pixel circuit 801 which is based on the video signal. In addition, the signal line driver circuit 804b has a function of controlling output of a data signal in response to a pulse signal produced by input of a start pulse signal, a clock signal, or the like. Furthermore, the signal line driver circuit 804b has a function of controlling the potentials of wirings supplied with data signals (such wirings are hereinafter referred to as data lines DL_1 to DL_Y). Alternatively, the signal line driver circuit 804b has a function of supplying an initialization signal. Without being limited thereto, the signal line driver circuit 804b can supply another signal.

The signal line driver circuit 804b includes a plurality of analog switches or the like, for example. The signal line driver circuit 804b can output, as the data signals, signals obtained by time-dividing the video signal by sequentially turning on the plurality of analog switches.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804a. For example, to the pixel circuit 801 in the m-th row and the n-th column (m is a natural number of less than or equal to X, and n is a natural number of less than or equal to Y), a pulse signal is input from the scan line driver circuit 804a through the scan line GL_m, and a data signal is input from the signal line driver circuit 804b through the data line DL_n in accordance with the potential of the scan line GL_m.

The protection circuit 806 shown in FIG. 19A is connected to, for example, the scan line GL between the scan line driver circuit 804a and the pixel circuit 801. Alternatively, the protection circuit 806 is connected to the data line DL between the signal line driver circuit 804b and the pixel circuit 801. Alternatively, the protection circuit 806 can be connected to a wiring between the scan line driver circuit 804a and the terminal portion 807. Alternatively, the protection circuit 806 can be connected to a wiring between the signal line driver circuit 804b and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 19A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804a or a configuration in which the protection circuits 806 are connected to the signal line driver circuit 804b may be employed. Alternatively, the protection circuits 806 may be configured to be connected to the terminal portion 807.

In FIG. 19A, an example in which the driver circuit portion 804 includes the scan line driver circuit 804a and the signal line driver circuit 804b is shown; however, the structure is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

<Structural Example of Pixel Circuit>

Each of the plurality of pixel circuits 801 in FIG. 19A can have a structure illustrated in FIG. 19B, for example.

The pixel circuit 801 illustrated in FIG. 19B includes transistors 852 and 854, a capacitor 862, and a light-emitting element 872.

One of a source electrode and a drain electrode of the transistor 852 is electrically connected to a wiring to which a data signal is supplied (a data line DL_n). A gate electrode of the transistor 852 is electrically connected to a wiring to which a gate signal is supplied (a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 and 2 can be used.

Note that a high power supply potential VDD is supplied to one of the potential supply line VL_a and the potential supply line VL_b, and a low power supply potential VSS is supplied to the other.

In the display device including the pixel circuits 801 in FIG. 19B, the pixel circuits 801 are sequentially selected row by row by the scan line driver circuit 804a in FIG. 19A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 20A and 20B and FIGS. 21A and 21B illustrate examples of the pixel circuit.

Figure 20A:
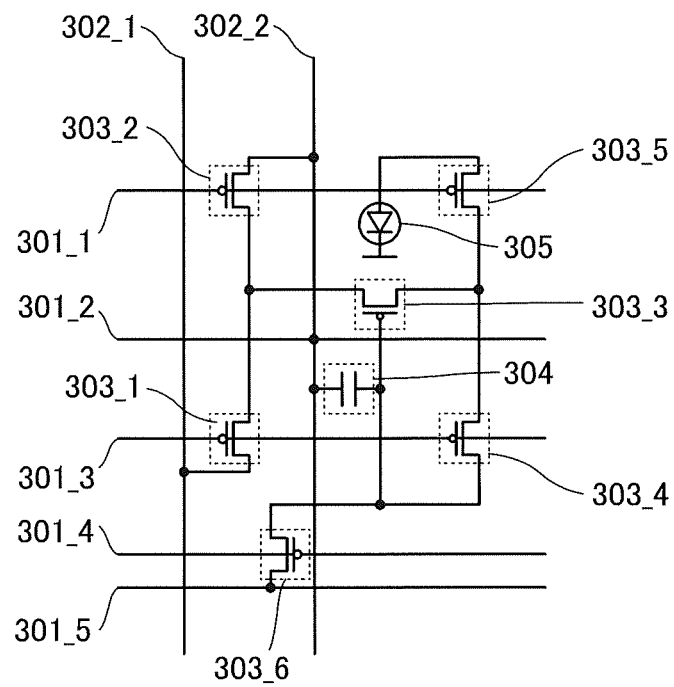
FIGS. 20A and 20B are circuit diagrams each illustrating a pixel circuit of a display device of one embodiment of the present invention.

The pixel circuit illustrated in FIG. 20A includes six transistors (transistors 303_1 to 303_6), a capacitor 304, and a light-emitting element 305. The pixel circuit illustrated in FIG. 20A is electrically connected to wirings 301_1 to 301_5 and wirings 302_1 and 302_2. Note that as the transistors 303_1 to 303_6, for example, p-channel transistors can be used.

Figure 20B:
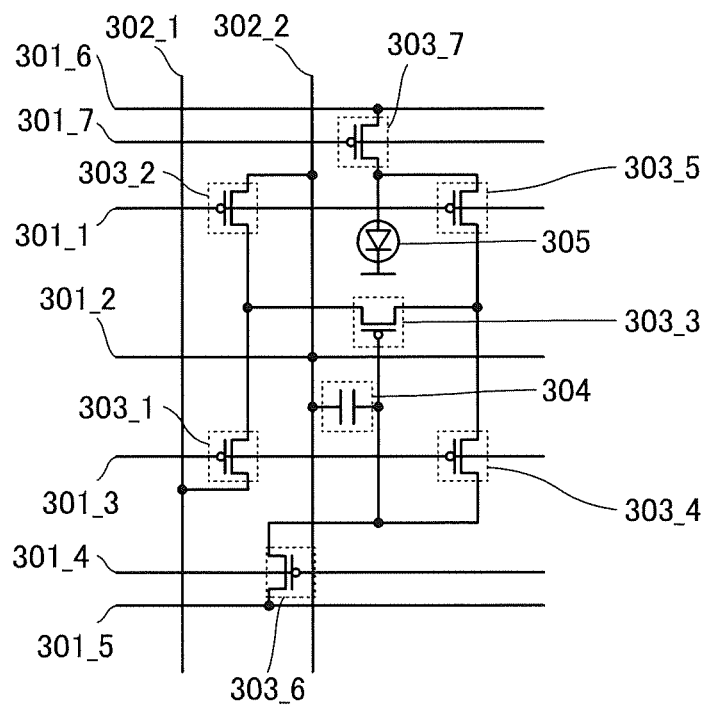

The pixel circuit shown in FIG. 20B has a configuration in which a transistor 303_7 is added to the pixel circuit shown in FIG. 20A. The pixel circuit illustrated in FIG. 20B is electrically connected to wirings 301_6 and 301_7. The wirings 301_5 and 301_6 may be electrically connected to each other. Note that as the transistor 303_7, for example, a p-channel transistor can be used.

Figure 21A:
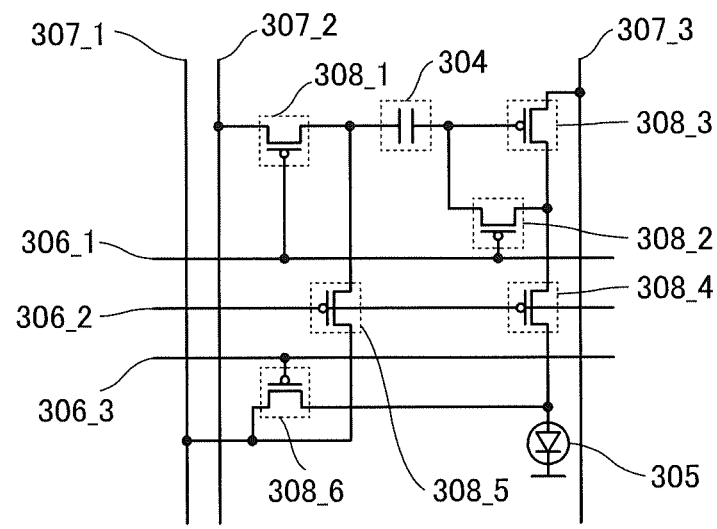
FIGS. 21A and 21B are circuit diagrams each illustrating a pixel circuit of a display device of one embodiment of the present invention.

The pixel circuit shown in FIG. 21A includes six transistors (transistors 308_1 to 308_6), the capacitor 304, and the light-emitting element 305. The pixel circuit illustrated in FIG. 21A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 21B:
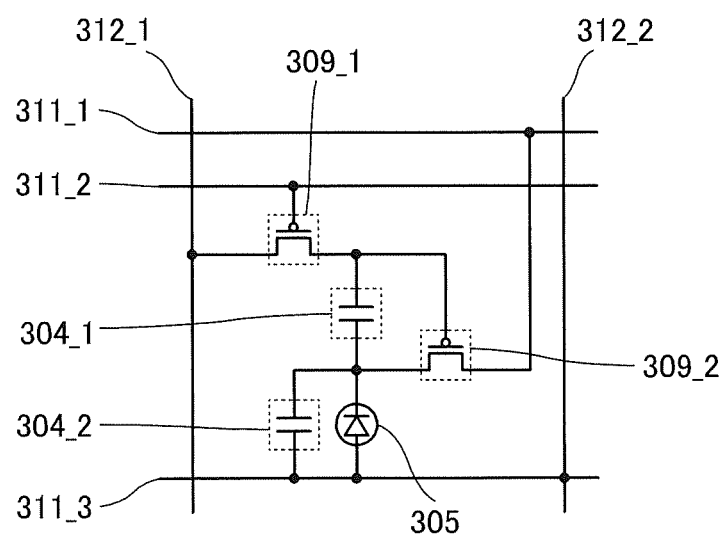

The pixel circuit illustrated in FIG. 21B includes two transistors (transistors 309_1 and 309_2), two capacitors (capacitors 304_1 and 304_2), and the light-emitting element 305. The pixel circuit illustrated in FIG. 21B is electrically connected to wirings 311_1 to 311_3 and wirings 312_1 and 312_2. With the configuration of the pixel circuit illustrated in FIG. 21B, the pixel circuit can be driven by a voltage inputting current driving method (also referred to as CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced and higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be combined with any of the structures described in the other embodiments as appropriate.

Embodiment 5

In this embodiment, a display device including a light-emitting element of one embodiment of the present invention and an electronic device in which the display device is provided with an input device will be described with reference to FIGS. 22A and 22B, FIGS. 23A to 23C, FIGS. 24A and 24B, FIGS. 25A and 25B, and FIG. 26.

<Description 1 of Touch Panel>

In this embodiment, a touch panel 2000 including a display device and an input device will be described as an example of an electronic device. In addition, an example in which a touch sensor is included as an input device will be described.

Figure 22A:
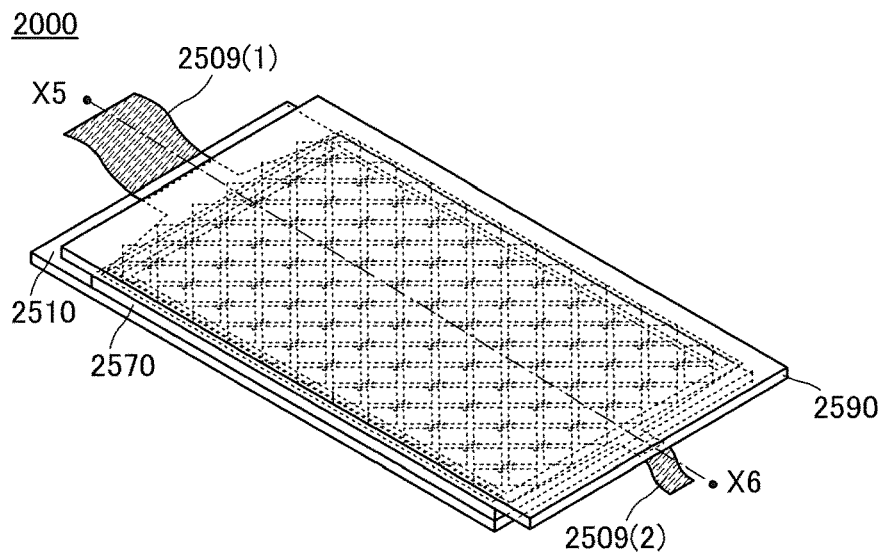
FIGS. 22A and 22B are perspective views of an example of a touch panel of one embodiment of the present invention.
Figure 22B:
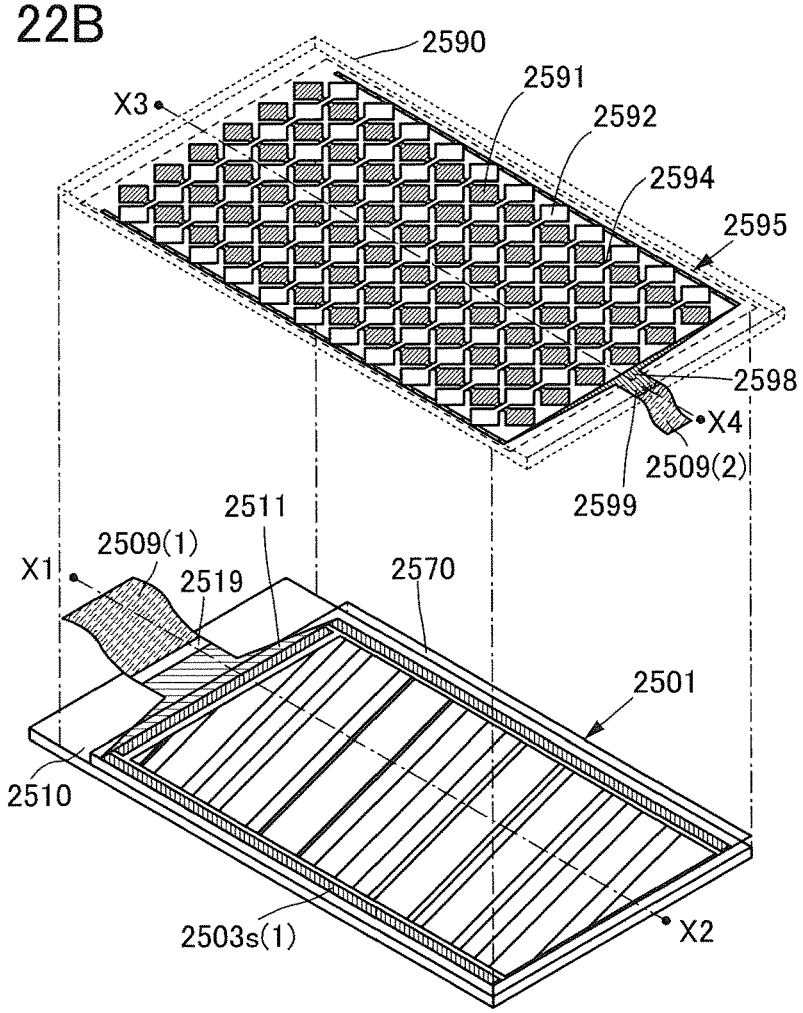

FIGS. 22A and 22B are perspective views of the touch panel 2000. Note that FIGS. 22A and 22B illustrate only main components of the touch panel 2000 for simplicity.

The touch panel 2000 includes a display device 2501 and a touch sensor 2595 (see FIG. 22B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1). The plurality of wirings 2511 can supply signals from a signal line driver circuit 2503s(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 22B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 22B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 22A and 22B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

<Description of Display Device>

Figure 23A:
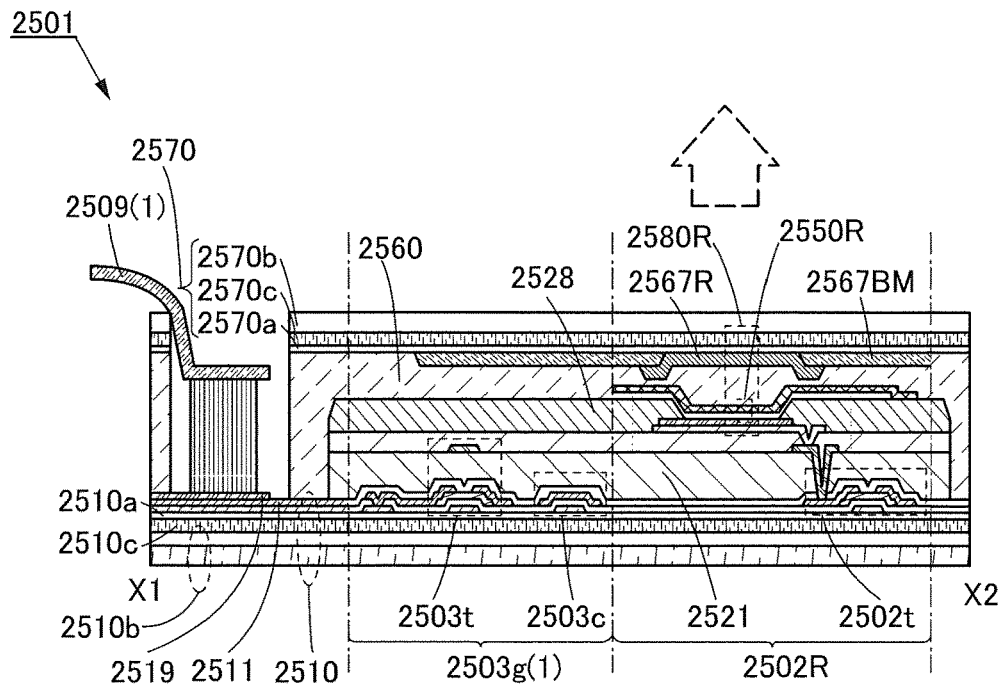
FIGS. 23A to 23C are cross-sectional views of examples of a display device and a touch sensor of one embodiment of the present invention.

Next, the display device 2501 will be described in detail with reference to FIG. 23A. FIG. 23A corresponds to a cross-sectional view taken along dashed-dotted line X1-X2 in FIG. 22B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1 \times 10^{-5}$ g·m$^{-2}$·day$^{-1}$, preferably lower than or equal to $1 \times 10^{-6}$ g·m$^{-2}$·day$^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1 \times 10^{-3}$/K, further preferably lower than or equal to $5 \times 10^{-5}$/K, and still further preferably lower than or equal to $1 \times 10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, polyester, polyolefin, polyamide (e.g., nylon, aramid), polyimide, polycarbonate, or acrylic, urethane, or epoxy can be used. Alternatively, a material that includes a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 23A, the sealing layer 2560 can also serve as an optical adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen and argon) may be used instead of the sealing layer 2560. A drying agent may be provided in the inert gas so as to adsorb moisture or the like. An ultraviolet curable resin or a heat curable resin may be used. An epoxy-based resin or a glass frit is preferably used as the sealant. As a material used for the sealant, a material which is impermeable to moisture and oxygen is preferably used.

The display device 2501 includes a pixel 2502R. The pixel 2502R includes a light-emitting module 2580R.

The pixel 2502R includes the light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 and 2 can be used.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in FIG. 23A.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength region. For example, a color filter for transmitting light in a red wavelength region, a color filter for transmitting light in a green wavelength region, a color filter for transmitting light in a blue wavelength region, a color filter for transmitting light in a yellow wavelength region, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. Note that the insulating layer 2521 has a function of covering unevenness caused by the pixel circuit. The insulating layer 2521 may have a function of suppressing impurity diffusion. This can prevent the reliability of the transistor 2502t or the like from being lowered by impurity diffusion.

The light-emitting element 2550R is formed over the insulating layer 2521. A partition 2528 is provided so as to overlap with an end portion of the lower electrode of the light-emitting element 2550R. Note that a spacer for controlling the distance between the substrate 2510 and the substrate 2570 may be formed over the partition 2528.

A scan line driver circuit 2503g(1) includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a PWB.

Figure 23B:
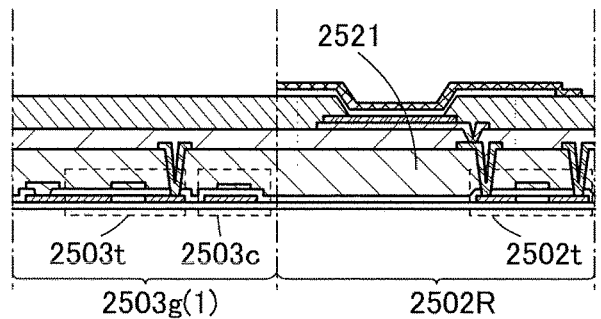

In the display device 2501, transistors with any of a variety of structures can be used. FIG. 23A illustrates an example of using bottom-gate transistors; however, the present invention is not limited to this example, and top-gate transistors may be used in the display device 2501 as illustrated in FIG. 23B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide, an In-M-Zn oxide (M represents Al, Ga, Y, Zr, La, Ce, Sn, Hf, or Nd), and the like.

<Description of Touch Sensor>

Figure 23C:
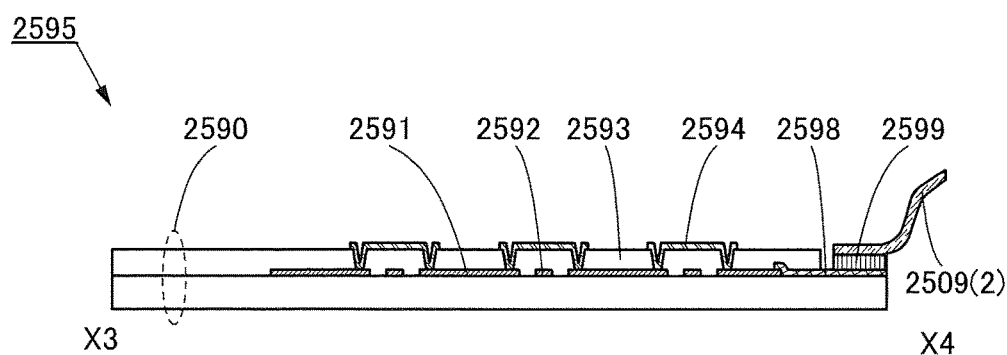

Next, the touch sensor 2595 will be described in detail with reference to FIG. 23C. FIG. 23C corresponds to a cross-sectional view taken along dashed-dotted line X3-X4 in FIG. 22B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 24A:
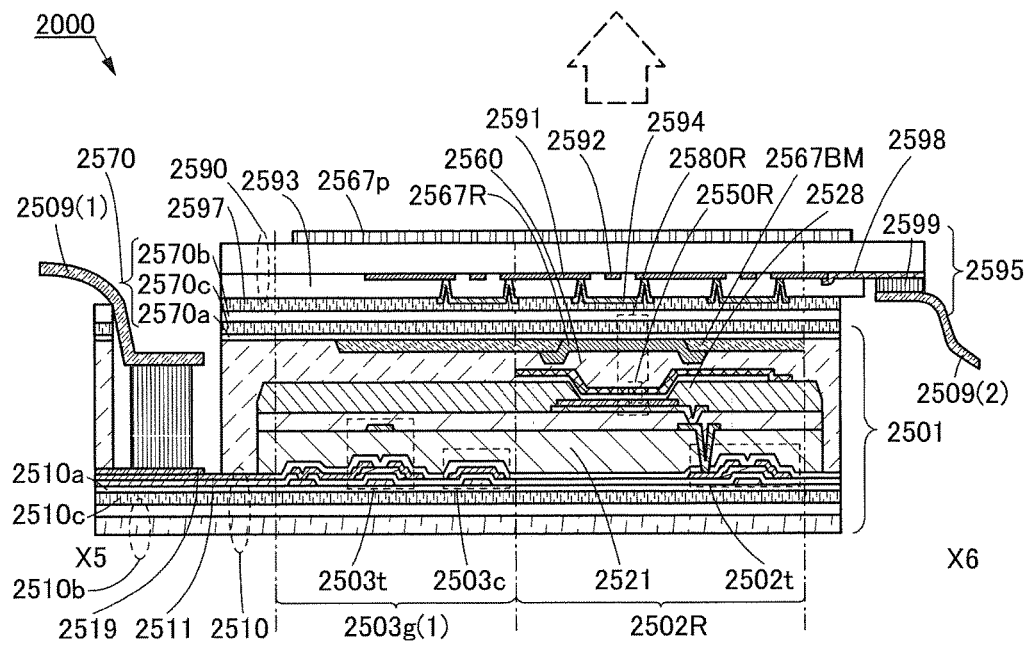
FIGS. 24A and 24B are cross-sectional views each illustrating an example of a touch panel of one embodiment of the present invention.

Next, the touch panel 2000 will be described in detail with reference to FIG. 24A. FIG. 24A corresponds to a cross-sectional view taken along dashed-dotted line X5-X6 in FIG. 22A.

In the touch panel 2000 illustrated in FIG. 24A, the display device 2501 described with reference to FIG. 23A and the touch sensor 2595 described with reference to FIG. 23C are attached to each other.

The touch panel 2000 illustrated in FIG. 24A includes an adhesive layer 2597 and an anti-reflective layer 2567p in addition to the components described with reference to FIGS. 23A and 23C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567p is positioned in a region overlapping with pixels. As the anti-reflective layer 2567p, a circularly polarizing plate can be used, for example.

Next, a touch panel having a structure different from that illustrated in FIG. 24A will be described with reference to FIG. 24B.

Figure 24B:
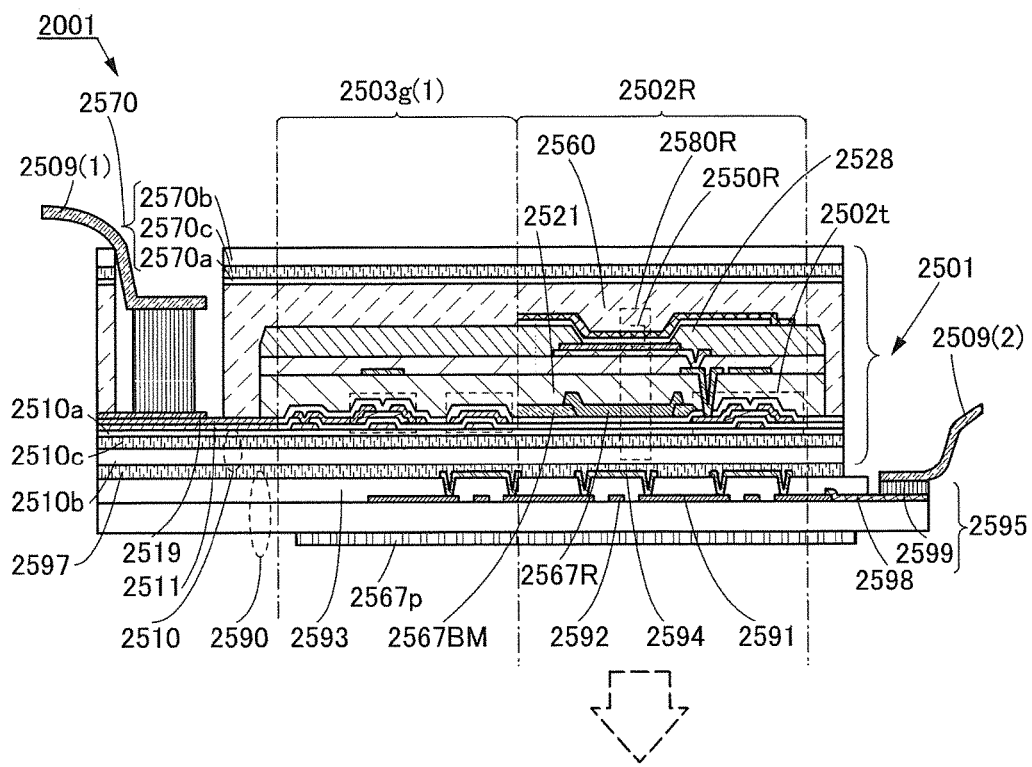

FIG. 24B is a cross-sectional view of a touch panel 2001. The touch panel 2001 illustrated in FIG. 24B differs from the touch panel 2000 illustrated in FIG. 24A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 24B emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 24B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 24A or 24B, light may be emitted from the light-emitting element through one or both of the substrate 2510 and the substrate 2570.

<Description of Method for Driving Touch Panel>

Next, an example of a method for driving a touch panel will be described with reference to FIGS. 25A and 25B.

Figure 25A:
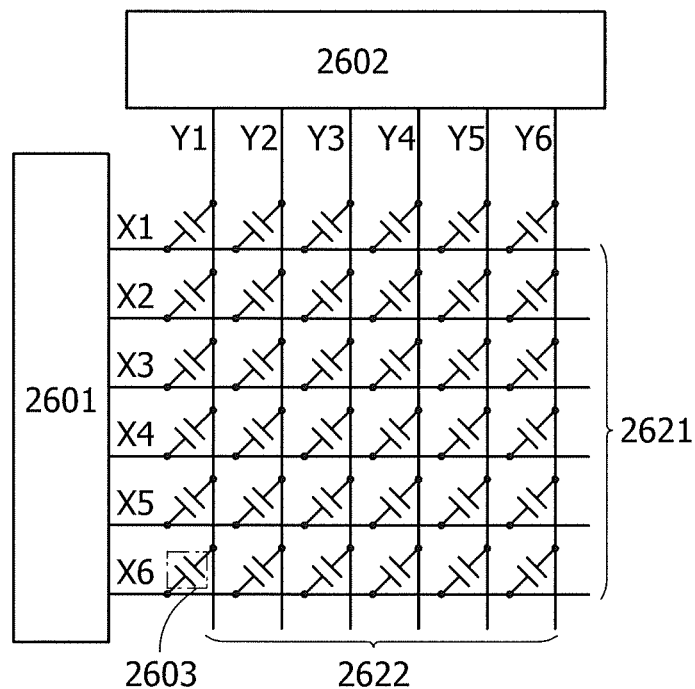
FIGS. 25A and 25B are a block diagram and a timing chart of a touch sensor according to one embodiment of the present invention.

FIG. 25A is a block diagram illustrating the structure of a mutual capacitive touch sensor. FIG. 25A illustrates a pulse voltage output circuit 2601 and a current sensing circuit 2602. Note that in FIG. 25A, six wirings X1 to X6 represent the electrodes 2621 to which a pulse voltage is applied, and six wirings Y1 to Y6 represent the electrodes 2622 that detect changes in current. FIG. 25A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 25B:
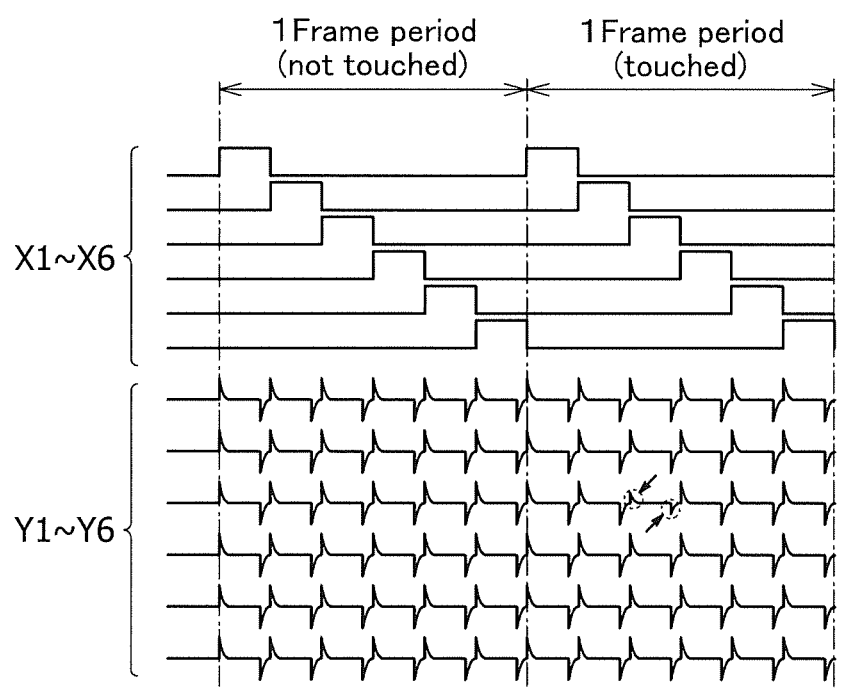

FIG. 25B is a timing chart showing input and output waveforms in the mutual capacitive touch sensor illustrated in FIG. 25A. In FIG. 25B, sensing of a sensing target is performed in all the rows and columns in one frame period. FIG. 25B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Description of Sensor Circuit>

Figure 26:
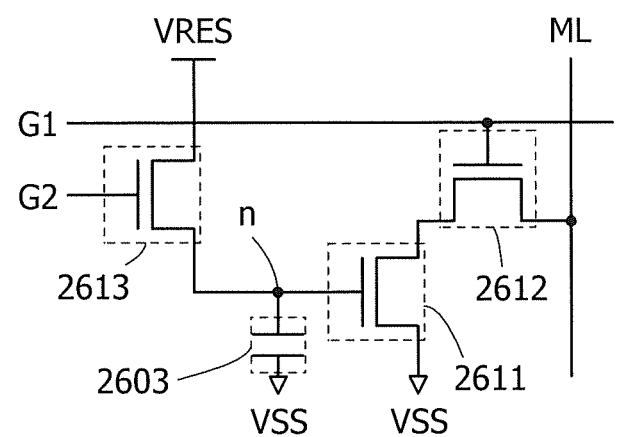
FIG. 26 is a circuit diagram of a touch sensor according to one embodiment of the present invention.

Although FIG. 25A illustrates a passive matrix type touch sensor in which only the capacitor 2603 is provided at the intersection of wirings as a touch sensor, an active matrix type touch sensor including a transistor and a capacitor may be used. FIG. 26 illustrates an example of a sensor circuit included in an active matrix type touch sensor.

The sensor circuit in FIG. 26 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 26 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be combined with any of the structures described in the other embodiments as appropriate.

Embodiment 6

In this embodiment, a display module and electronic devices including a light-emitting element of one embodiment of the present invention will be described with reference to FIG. 27 and FIGS. 28A to 28G.

<Description of Display Module>

Figure 27:
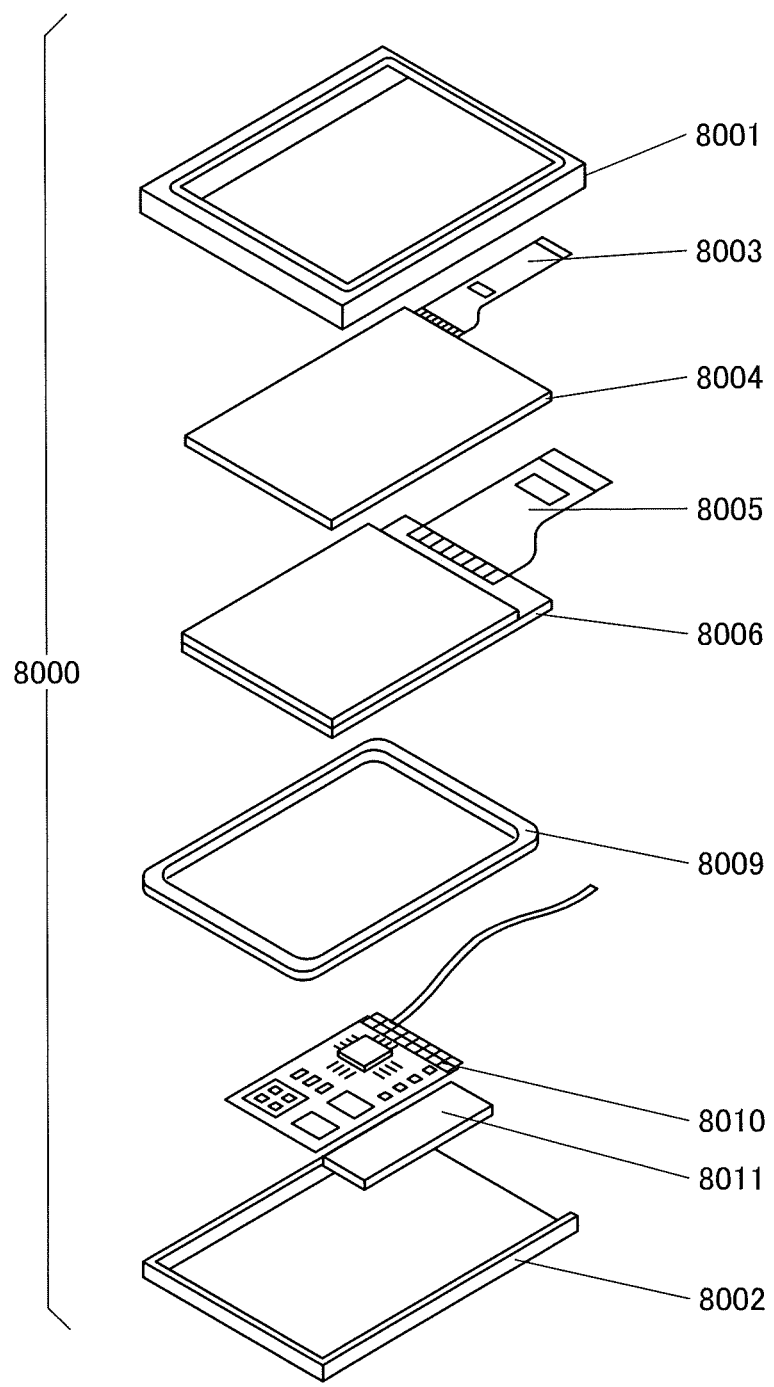
FIG. 27 is a perspective view illustrating a display module of one embodiment of the present invention.

In a display module 8000 in FIG. 27, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<Description of Electronic Device>

FIGS. 28A to 28G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 28A to 28G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 28A to 28G are not limited to those described above, and the electronic devices can have a variety of functions. Although not illustrated in FIGS. 28A to 28G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 28A to 28G will be described in detail below.

Figure 28A:
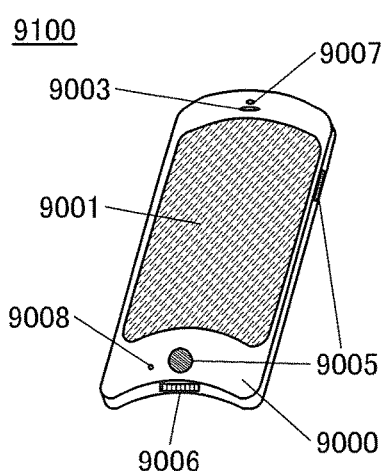
FIGS. 28A to 28G illustrate electronic devices of one embodiment of the present invention.

FIG. 28A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 28B:
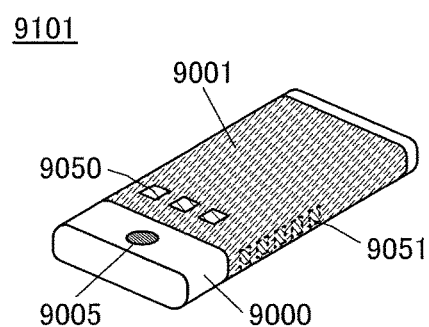

FIG. 28B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 28B, can be positioned in the portable information terminal 9101 as in the portable information terminal 9100 shown in FIG. 28A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 28C:
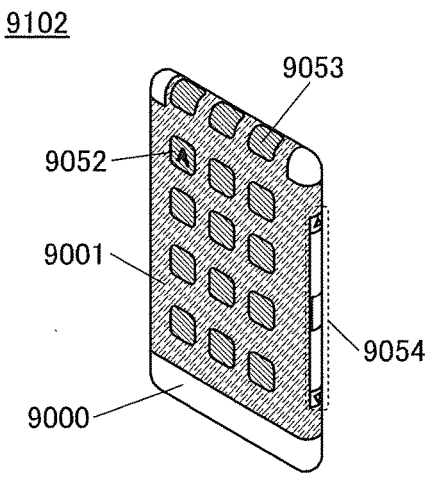

FIG. 28C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 28D:
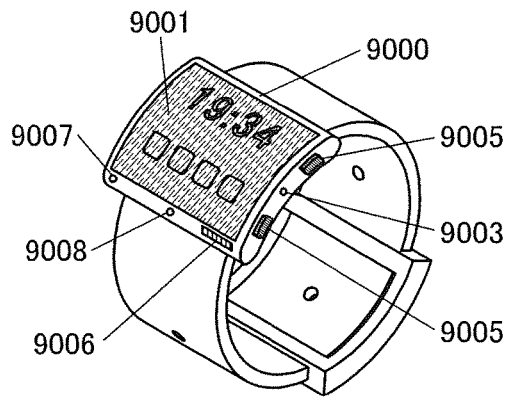

FIG. 28D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 28E:
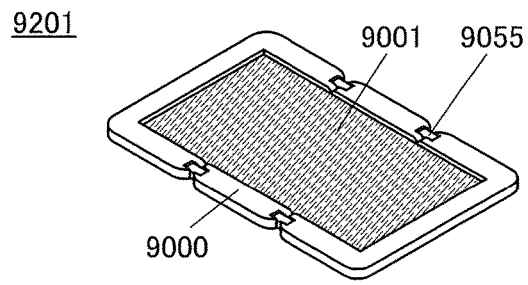
Figure 28F:
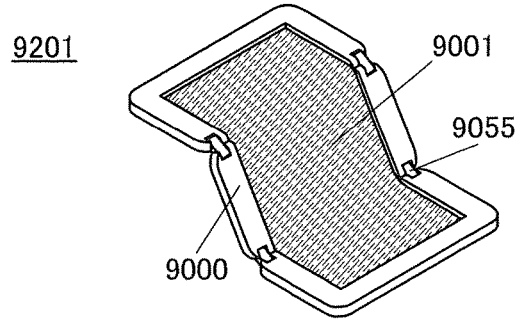
Figure 28G:
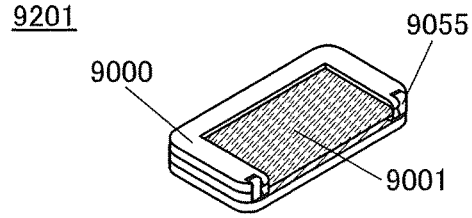

FIGS. 28E, 28F, and 28G are perspective views of a foldable portable information terminal 9201. FIG. 28E is a perspective view illustrating the portable information terminal 9201 that is opened. FIG. 28F is a perspective view illustrating the portable information terminal 9201 that is being opened or being folded. FIG. 28G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be combined with any of the structures described in the other embodiments as appropriate.

Embodiment 7

In this embodiment, a light-emitting device including the light-emitting element of one embodiment of the present invention will be described with reference to FIGS. 29A to 29C and FIGS. 30A to 30D.

Figure 29A:
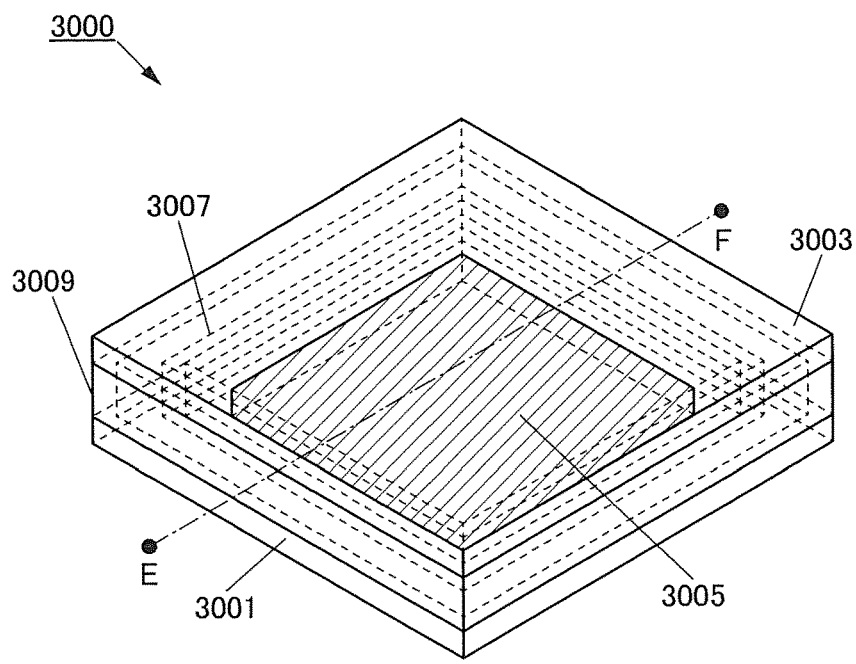
FIGS. 29A to 29C are a perspective view and cross-sectional views illustrating light-emitting devices of one embodiment of the present invention.
Figure 29B:
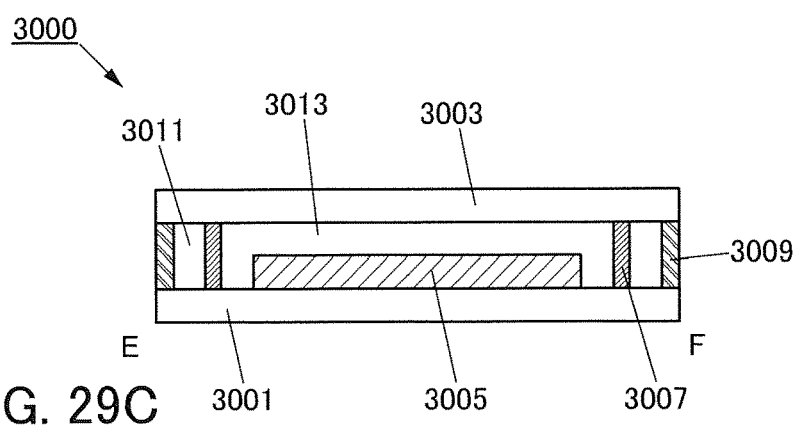

FIG. 29A is a perspective view of a light-emitting device 3000 shown in this embodiment, and FIG. 29B is a cross-sectional view along dashed-dotted line E-F in FIG. 29A. Note that in FIG. 29A, some components are illustrated by broken lines in order to avoid complexity of the drawing.

The light-emitting device 3000 illustrated in FIGS. 29A and 29B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 29A and 29B, a structure in which light is emitted from the light-emitting element 3005 to the lower side (the substrate 3001 side) is illustrated.

As illustrated in FIGS. 29A and 29B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 29B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in Embodiment 1, respectively. The light-emitting element 3005 can have a structure similar to that of any of the light-emitting elements described in Embodiments 1 and 2.

For the first sealing region 3007, a material containing glass (e.g., a glass fit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, materials that include polyester, polyolefin, polyamide (e.g., nylon, aramid), polyimide, polycarbonate, an acrylic resin, urethane, an epoxy resin, or a resin having a siloxane bond can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 29B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Note that for the first region 3011 and the second region 3013, a reduced pressure state is preferred to an atmospheric pressure state.

Figure 29C:
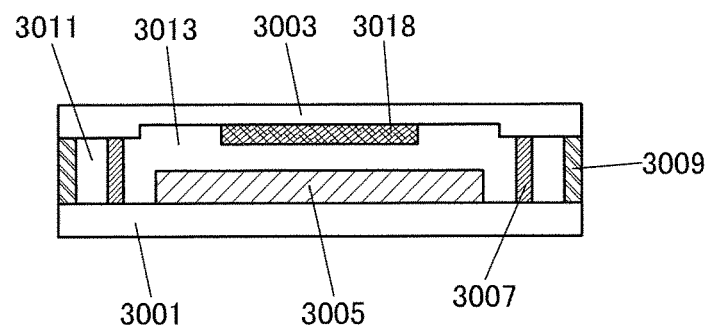

FIG. 29C illustrates a modification example of the structure in FIG. 29B. FIG. 29C is a cross-sectional view illustrating the modification example of the light-emitting device 3000.

FIG. 29C illustrates a structure in which a desiccant 3018 is provided in a recessed portion provided in part of the substrate 3003. The other components are the same as those of the structure illustrated in FIG. 29B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 29B are described with reference to FIGS. 30A to 30D. Note that FIGS. 30A to 30D are cross-sectional views illustrating the modification examples of the light-emitting device 3000 illustrated in FIG. 29B.

In each of the light-emitting devices illustrated in FIGS. 30A to 30D, the second sealing region 3009 is not provided but only the first sealing region 3007 is provided. Moreover, in each of the light-emitting devices illustrated in FIGS. 30A to 30D, a region 3014 is provided instead of the second region 3013 illustrated in FIG. 29B.

For the region 3014, for example, polyester, polyolefin, polyamide (e.g., nylon or aramid), polyimide, polycarbonate, an acrylic resin, urethane, or an epoxy resin can be used. Alternatively, a material including a siloxane bond can be used.

When the above-described material is used for the region 3014, what is called a solid-sealing light-emitting device can be obtained.

Figure 30A:
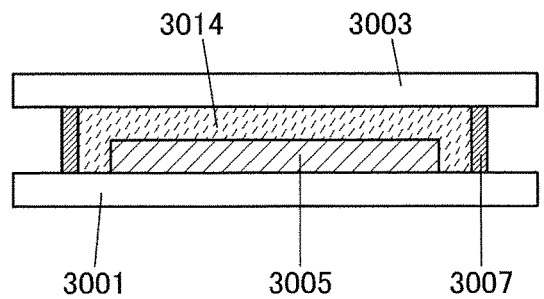
FIGS. 30A to 30D are cross-sectional views each illustrating a light-emitting device of one embodiment of the present invention.
Figure 30B:
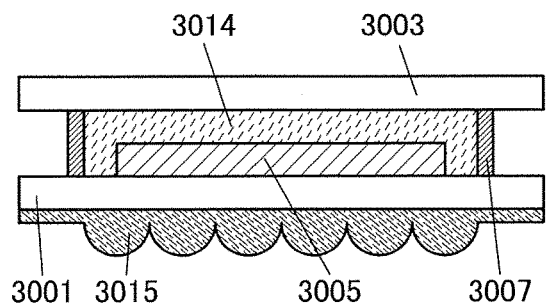

In the light-emitting device illustrated in FIG. 30B, a substrate 3015 is provided on the substrate 3001 side of the light-emitting device illustrated in FIG. 30A.

The substrate 3015 has unevenness as illustrated in FIG. 30B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 30B, a substrate having a function as a diffusion plate may be provided.

Figure 30C:
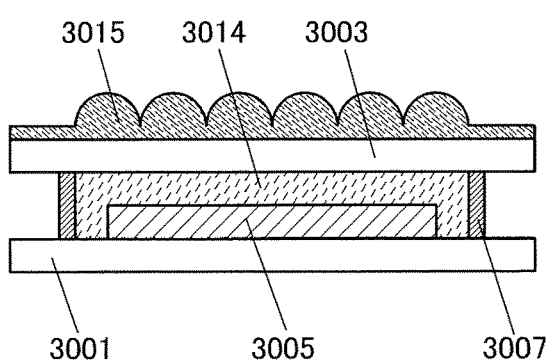

In the light-emitting device illustrated in FIG. 30C, light is extracted through the substrate 3003 side, unlike in the light-emitting device illustrated in FIG. 30A, in which light is extracted through the substrate 3001 side.

The light-emitting device illustrated in FIG. 30C includes the substrate 3015 on the substrate 3003 side. The other components are the same as those of the light-emitting device illustrated in FIG. 30B.

Figure 30D:
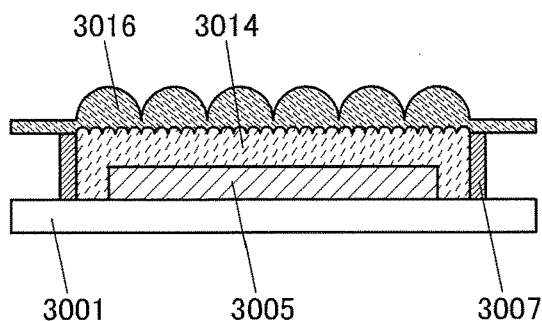

In the light-emitting device illustrated in FIG. 30D, the substrate 3003 and the substrate 3015 included in the light-emitting device illustrated in FIG. 30C are not provided but a substrate 3016 is provided.

The substrate 3016 includes first unevenness positioned closer to the light-emitting element 3005 and second unevenness positioned farther from the light-emitting element 3005. With the structure illustrated in FIG. 30D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

Note that the structure described in this embodiment can be combined as appropriate with any of the structures described in the other embodiments.

Embodiment 8

In this embodiment, examples in which the light-emitting element of one embodiment of the present invention is used for various lighting devices and electronic devices will be described with reference to FIGS. 31A to 31C and FIG. 32.

An electronic device or a lighting device that has a light-emitting region with a curved surface can be obtained with the use of the light-emitting element of one embodiment of the present invention which is manufactured over a substrate having flexibility.

Furthermore, a light-emitting device to which one embodiment of the present invention is applied can also be used for lighting for motor vehicles, examples of which are lighting for a dashboard, a windshield, a ceiling, and the like.

Figure 31A:
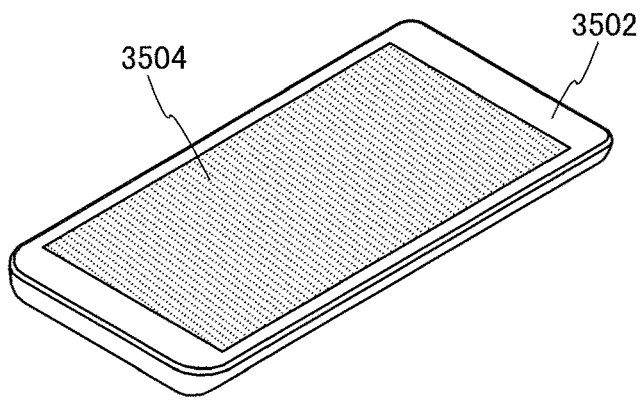
FIGS. 31A to 31C illustrate a lighting device and an electronic device of one embodiment of the present invention.
Figure 31B:
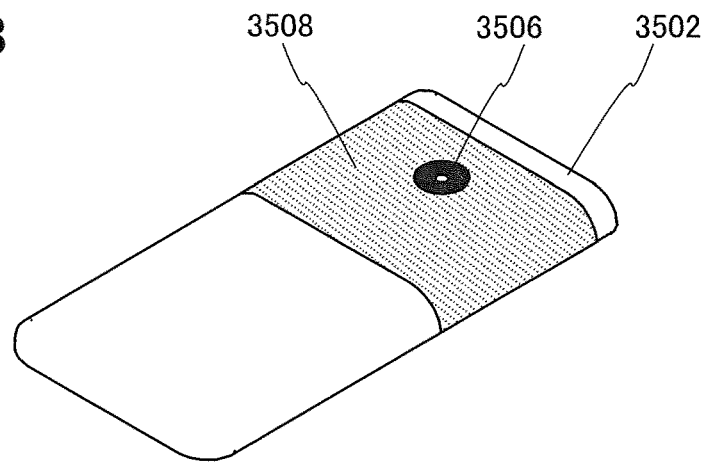

FIG. 31A is a perspective view illustrating one surface of a multifunction terminal 3500, and FIG. 31B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 31A and 31B can have a variety of functions as in the electronic devices illustrated in FIGS. 28A to 28G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 31C:
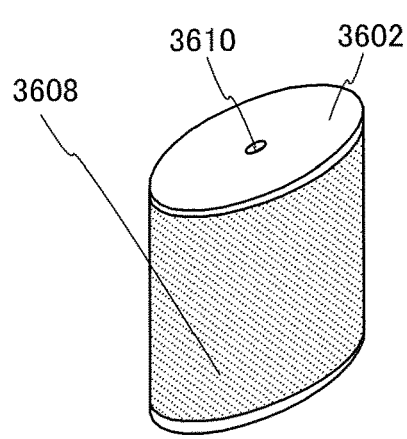

FIG. 31C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently plural times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 32:
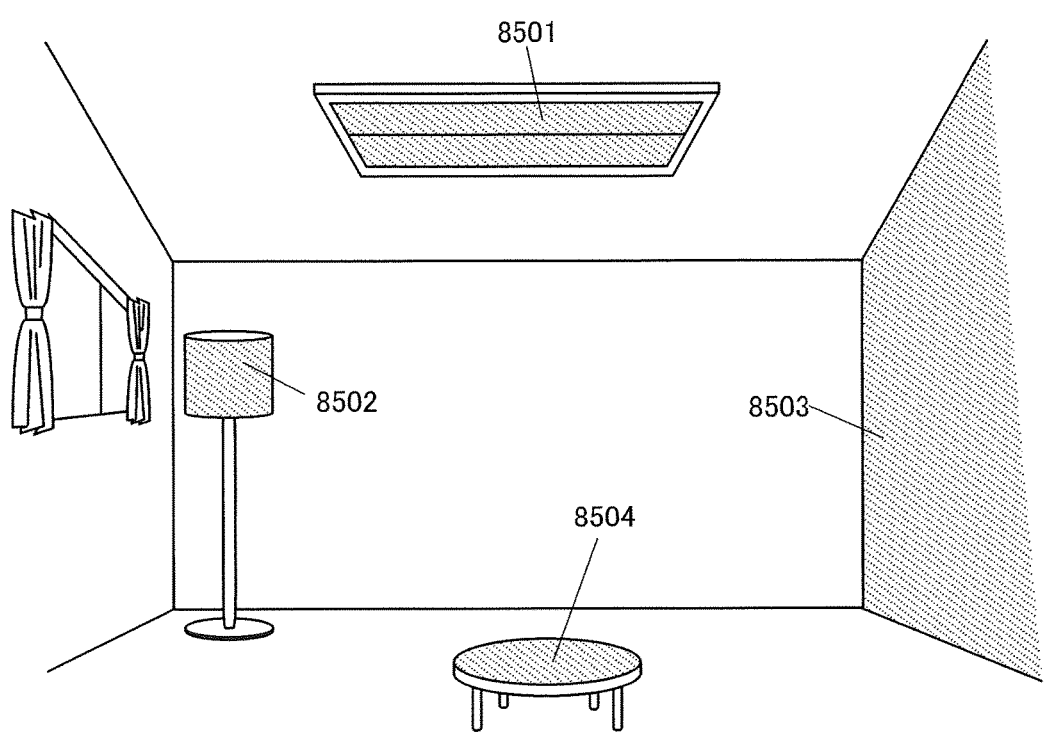
FIG. 32 illustrates a lighting device of one embodiment of the present invention.

FIG. 32 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting device of one embodiment of the present invention. Note that the light-emitting device can be used for electronic devices in a variety of fields without being limited to the lighting devices and the electronic devices described in this embodiment.

Note that the structure described in this embodiment can be combined as appropriate with any of the structures described in the other embodiments.

Example 1

In this example, the carrier-injection property and the carrier-transport property of a carrier-injection layer that can be used in a light-emitting element of one embodiment of the present invention were measured.

In this example, samples each including, in a hole-injection layer, a composite material of a hole-transport material functioning as a donor material and a transition metal oxide functioning as an acceptor material, specifically, molybdenum oxide (abbreviation: $MoO_3$) were fabricated and current density-voltage characteristics of the samples were measured. The results are described below. The fabricated samples are Samples A1 to A3, Samples B1 to B10, and Samples C1 to C8. The structure and abbreviation of the hole-transport material used in the composite material are shown below.

[Chemial Formula 1]

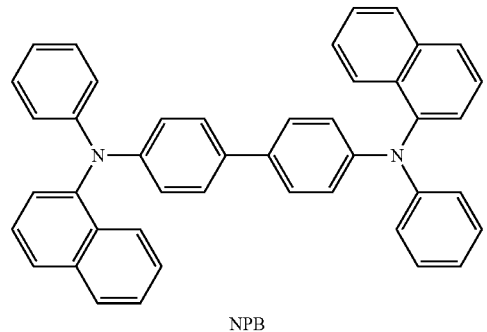

NPB

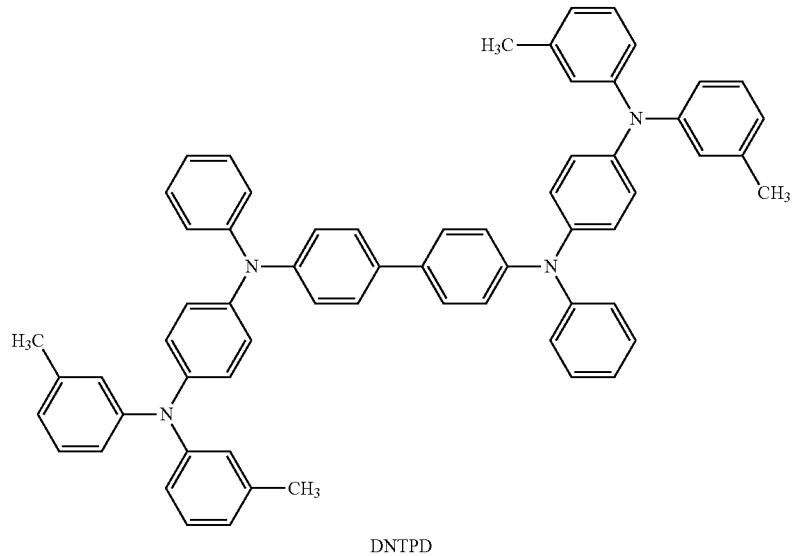

DNTPD

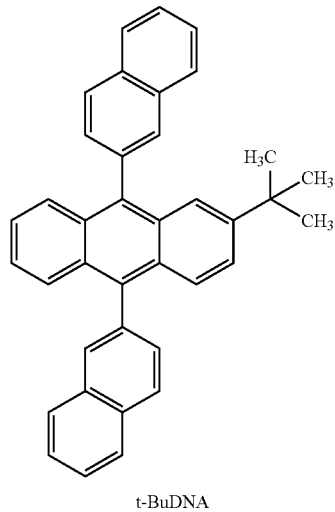

t-BuDNA

<Sample Fabrication>

As the electrode 101, a film of indium tin oxide containing silicon oxide (abbreviation: ITSO) was formed to a thickness of 110 nm. Note that the area of the electrode 101 was 4 mm² (2 mm×2 mm).

In Samples A1 to A3, the composite material of the hole-transport material and MoO₃ was deposited to a thickness of 200 nm, as the hole-injection layer over the electrode 101. Co-evaporation was performed for Sample A1 so that the weight ratio of 4,4'-bis[N-(1-naphthyl)-N-phenylamino] biphenyl (abbreviation: NPB) to MoO₃ (NPB:MoO₃) can be 1:0.25. Co-evaporation was performed for Sample A2 so that the weight ratio of 4,4'-bis(N-{4-[N'-(3-methylphenyl)-N-phenylamino]phenyl}-N-phenylamino)biphenyl (abbreviation: DNTPD) to MoO₃ (DNTPD:MoO₃) can be 1:0.5. Co-evaporation was performed for Sample A3 so that the weight ratio of 2-tert-butyl-9,10-di(2-naphthyl)anthracene (abbreviation: t-BuDNA) to MoO₃ (t-BuDNA:MoO₃) can be 1:0.5. Note that co-evaporation is an evaporation method in which a plurality of different substances are concurrently vaporized from different evaporation sources.

In Samples B2 to B9 and Samples C2 to C7, the composite material of the hole-transport material and MoO₃ was deposited to a thickness of 50 nm, as the hole-injection layer over the electrode 101. Co-evaporation was performed for Samples B2 to B9 so that the molar ratio of NPB to MoO₃ (NPB:MoO₃) can be 1:0.02, 1:0.04, 1:0.1, 1:0.2, 1:0.4, 1:1, 1:2, and 1:4. Co-evaporation was performed for Samples C2 to C7 so that the molar ratio of DNTPD to MoO₃ (DNTPD:MoO₃) can be 1:0.1, 1:0.5, 1:1, 1:2, 1:5, and 1:10. For comparison, NPB was vapor-deposited for Sample B1, DNTPD was vapor-deposited for Sample C1, and MoO₃ was vapor-deposited for Samples B10 and C8, each to a thickness of 50 nm.

As the electrode 102, aluminum (Al) was vapor-deposited over the hole-injection layer to a thickness of 200 nm. Through the above-described process, Samples A1 to A3, Samples B1 to B10, and Samples C1 to C8 were fabricated. The property of injecting holes from the electrode to the hole-injection layer and the hole-transport property of the hole-injection layer of the fabricated samples can be evaluated because only the hole-injection layer is sandwiched between the pair of electrodes (the electrode 101 and the electrode 102) in the samples.

Figure 33:
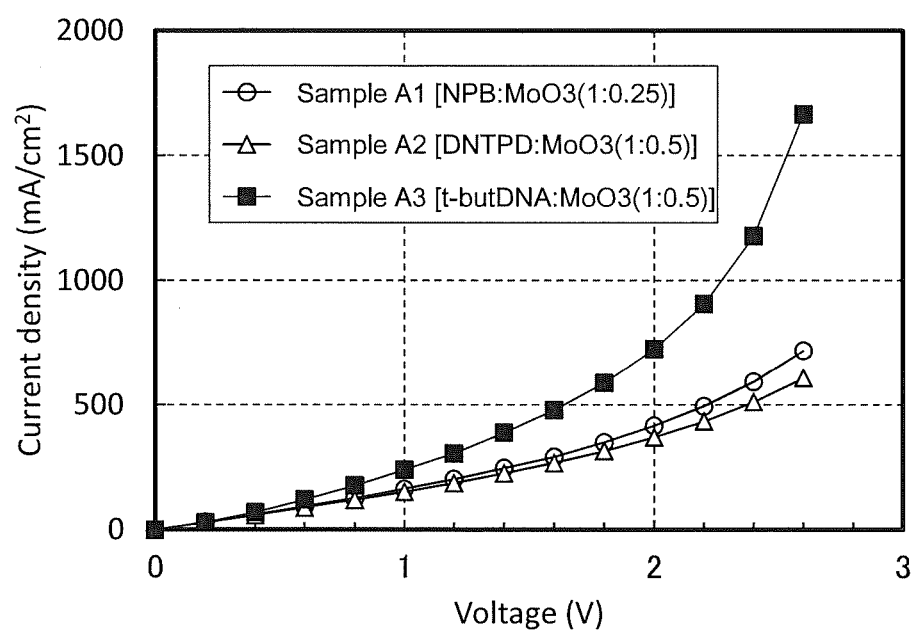
FIG. 33 shows current density-voltage characteristics of Samples in Example.
Figure 34:
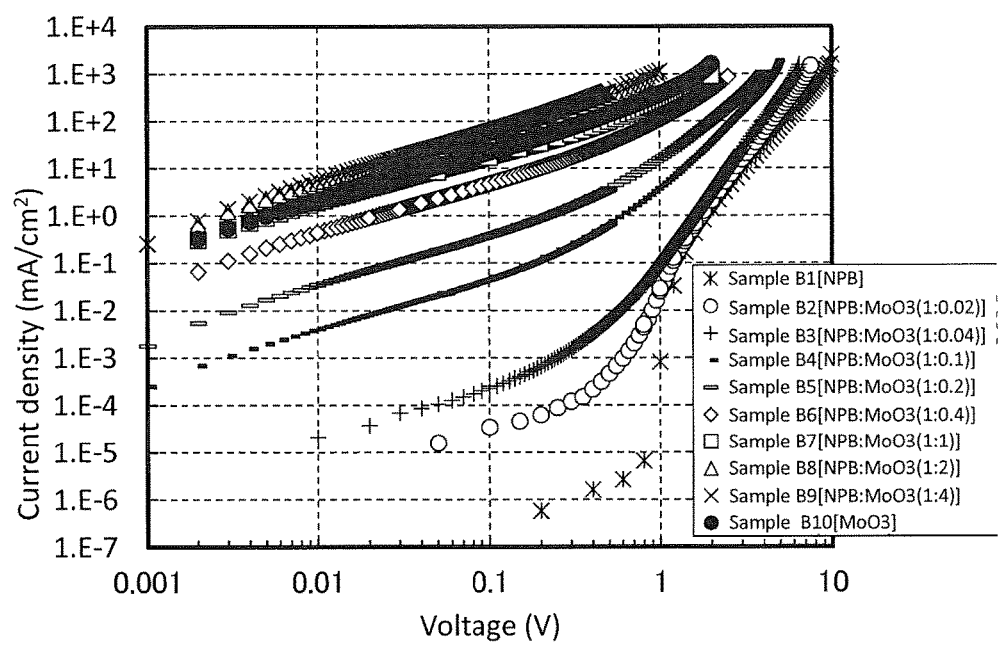
FIG. 34 shows current density-voltage characteristics of Samples in Example.
Figure 35:
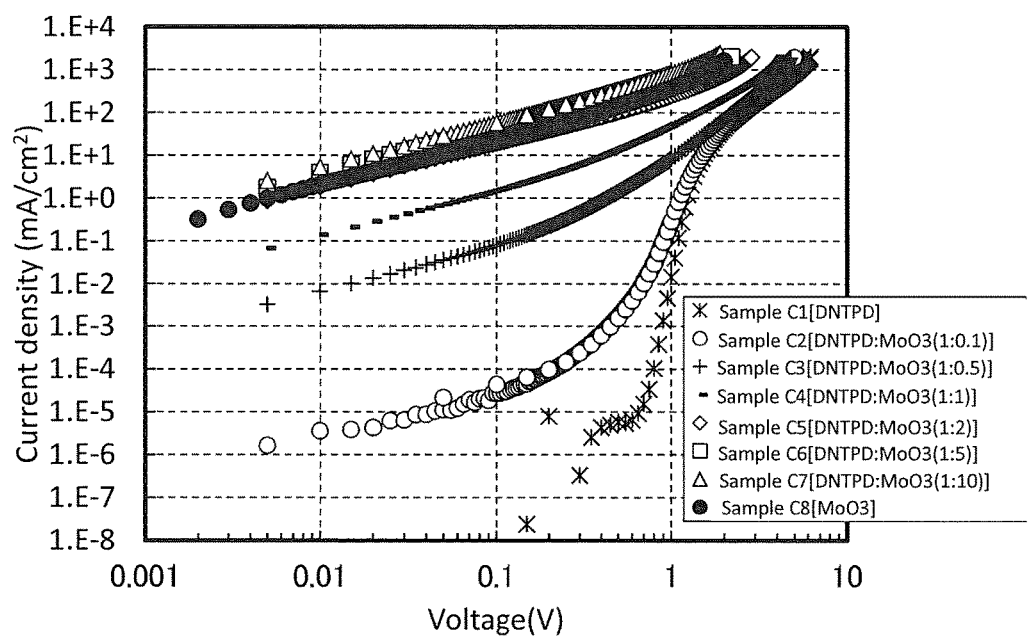
FIG. 35 shows current density-voltage characteristics of Samples in Example.

FIG. 33, FIG. 34, and FIG. 35 show current density-voltage characteristics of Samples A1 to A3, Samples B1 to B10, and Samples C1 to C8, respectively. To obtain the results in FIG. 33 to FIG. 35, measurement was performed under conditions where the electrode 101 (ITSO film) was an anode and the electrode 102 (Al film) was a cathode.

As shown in FIG. 33, Samples A1 to A3 including different hole-transport materials functioning as donor materials in the composite materials of the hole-injection layers showed different current density-voltage characteristics from each other.

The measured HOMO levels of the hole-transport materials used in the composite materials are shown in Table 1. To obtain the HOMO levels of the hole-transport materials in the thin-film state in Table 1, the ionization potential of each compound was measured by a photoelectron spectrometer (AC-2, manufactured by Riken Keiki, Co., Ltd.) in the air, and the measured ionization potentials were converted into negative values.

TABLE 1

| Abbreviation | HOMO level (eV) |
|---|---|
| DNTPD | −5.14 |
| NPB | −5.38 |
| t-BuDNA | −5.53 |

As shown in Table 1, the hole-transport materials in Samples A1, A2, and A3 have different HOMO levels, and this difference might be a reason for the different hole-injection properties and hole-transport properties among Samples A1, A2, and A3.

Furthermore, the results shown in FIG. 34 and FIG. 35 indicate significantly different hole-injection properties and hole-transport properties of the hole-injection layers with varying mixing ratio between the hole-transport material (donor material) and MoO₃ (acceptor material) in the composite material used for the hole-injection layer.

In the composite materials used for the hole-injection layers, electrons are extracted from the donor material by the acceptor material and thereby holes are generated. In the case where equal amounts (in molar ratio) of the acceptor material and the donor material are mixed or the acceptor material has a higher proportion in the mixed acceptor and donor materials, more electrons are extracted from the donor material by the acceptor material, which facilitates generation of holes in the hole-injection layer and thereby improves the hole-injection property and the hole-transport property of the hole-injection layer. In the case where the donor material has a higher proportion (in molar ratio) in the mixed acceptor and donor materials, less electrons are extracted from the donor material by the acceptor material, which reduces the number of holes generated in the hole-injection layer; accordingly, the hole-injection property and the hole-transport property of the hole-injection layer can be lowered.

The structures described above in this example can be used in combination with any of the structures described in the other embodiments as appropriate.

Example 2

Figure 36A:
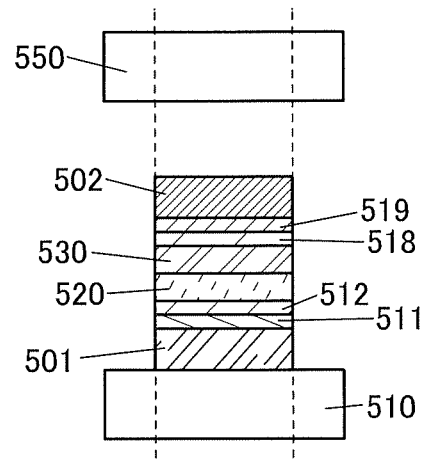
FIGS. 36A and 36B are schematic cross-sectional views illustrating light-emitting elements of Examples.

In this example, examples of fabricating light-emitting elements 1 to 4 according to one embodiment of the present invention will be described. A schematic cross-sectional view of the light-emitting elements fabricated in this example is shown in FIG. 36A. The element structures are shown in Table 2. The structures and abbreviations of the compounds used in this example are shown below.

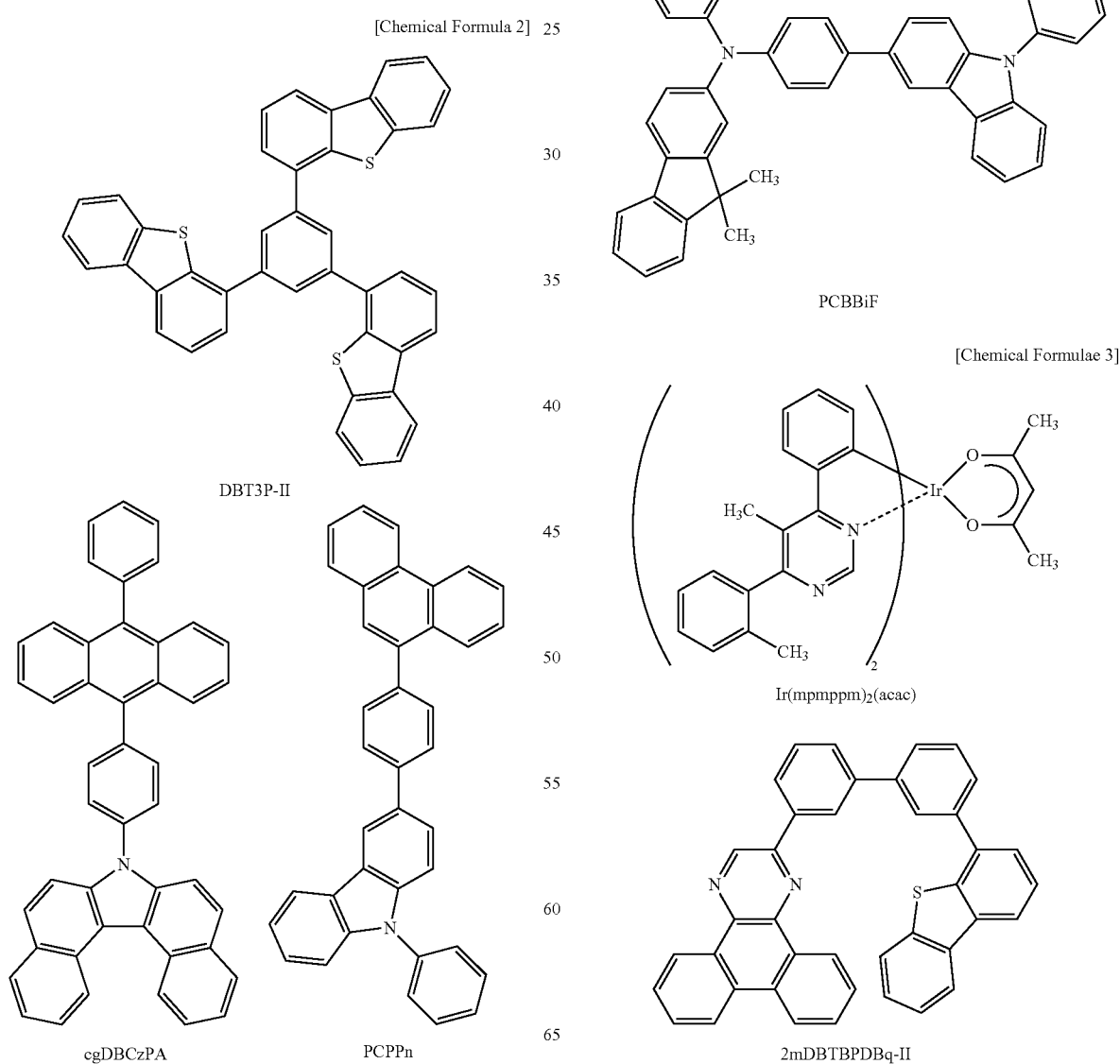

-continued

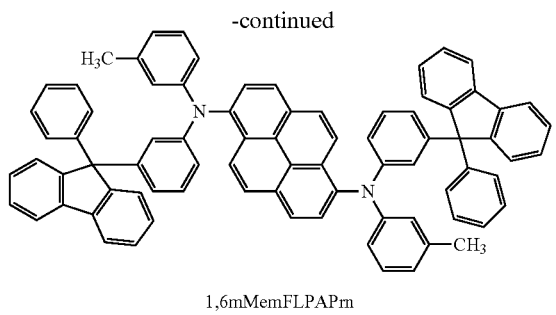

1,6mMemFLPAPrn

Then, as a hole-transport layer 512, 3-[4-(9-phenanthryl)-phenyl]-9-phenyl-9H-carbazole (abbreviation: PCPPn) was vapor-deposited to a thickness of 10 nm.

Next, as a light-emitting layer 520, 7-[4-(10-phenyl-9-anthryl)phenyl]-7H-dibenzo[e,g]carbazole (abbreviation: cgDBCzPA) and N,N'-bis(3-methylphenyl)-N,N'-bis[3-(9-phenyl-9H-fluoren-9-yl)phenyl]pyrene-1,6-diamine (abbreviation: 1,6mMemFLPAPrn) were deposited by co-evaporation such that the deposited layer has a weight ratio of cgDBCzPA to 1,6mMemFLPAPrn of 1:0.02 and a thickness of 10 nm. In the light-emitting layer 520, cgDBCzPA is a host material and 1,6mMemFLPAPrn is a guest material (fluorescent material).

TABLE 2

| | Layer | Reference numeral | Thickness (nm) | Material | Weight ratio |
|---|---|---|---|---|---|
| Light-emitting element 1 | Electrode | 502 | 130 | Al | — |
| | Electron-injection layer | 519 | 1 | LiF | — |
| | Electron-transport layer | 518 (2) | 15 | Bphen | — |
| | | 518 (1) | 20 | 2mDBTBPDBq-II | — |
| | Light-emitting layer | 530 (2) | 20 | 2mDBTBPDBq-II:PCBBiF:Ir(mpmppm)$_2$(acac) | 0.8:0.2:0.06 |
| | | 530 (1) | 2 | 2mDBTBPDBq-II:PCBBiF | 0.8:0.2 |
| | | 520 | 10 | cgDBCzPA:1,6mMemFLPAPm | 1:0.02 |
| | Hole-transport layer | 512 | 10 | PCPPn | — |
| | Hole-injection layer | 511 | 35 | DBT3P-II:MoO$_3$ | 1:0.1 |
| | Electrode | 501 | 110 | ITSO | — |
| Light-emitting element 2 | Electrode | 502 | 130 | Al | — |
| | Electron-injection layer | 519 | 1 | LiF | — |
| | Electron-transport layer | 518 (2) | 15 | Bphen | — |
| | | 518 (1) | 20 | 2mDBTBPDBq-II | — |
| | Light-emitting layer | 530 (2) | 20 | 2mDBTBPDBq-II:PCBBiF:Ir(mpmppm)$_2$(acac) | 0.8:0.2:0.06 |
| | | 530 (1) | 2 | 2mDBTBPDBq-II:PCBBiF | 0.8:0.2 |
| | | 520 | 10 | cgDBCzPA:1,6mMemFLPAPm | 1:0.02 |
| | Hole-transport layer | 512 | 10 | PCPPn | — |
| | Hole-injection layer | 511 | 35 | NPB:MoO$_3$ | 1:0.1 |
| | Electrode | 501 | 110 | ITSO | — |
| Light-emitting element 3 | Electrode | 502 | 130 | Al | — |
| | Electron-injection layer | 519 | 1 | LiF | — |
| | Electron-transport layer | 518 (2) | 15 | Bphen | — |
| | | 518 (1) | 20 | 2mDBTBPDBq-II | — |
| | Light-emitting layer | 530 (2) | 20 | 2mDBTBPDBq-II:PCBBiF:Ir(mpmppm)$_2$(acac) | 0.8:0.2:0.06 |
| | | 530 (1) | 2 | 2mDBTBPDBq-II:PCBBiF | 0.8:0.2 |
| | | 520 | 10 | cgDBCzPA:1,6mMemFLPAPm | 1:0.02 |
| | Hole-transport layer | 512 | 10 | PCPPn | — |
| | Hole-injection layer | 511 | 35 | DBT3P-II:MoO$_3$ | 1:0.5 |
| | Electrode | 501 | 110 | ITSO | — |
| Light-emitting element 4 | Electrode | 502 | 130 | Al | — |
| | Electron-injection layer | 519 | 1 | LiF | — |
| | Electron-transport layer | 518 (2) | 15 | Bphen | — |
| | | 518 (1) | 20 | 2mDBTBPDBq-II | — |
| | Light-emitting layer | 530 (2) | 20 | 2mDBTBPDBq-II:PCBBiF:Ir(mpmppm)$_2$(acac) | 0.8:0.2:0.06 |
| | | 530 (1) | 2 | 2mDBTBPDBq-II:PCBBiF | 0.8:0.2 |
| | | 520 | 10 | cgDBCzPA:1,6mMemFLPAPm | 1:0.02 |
| | Hole-transport layer | 512 | 10 | PCPPn | — |
| | Hole-injection layer | 511 | 30 | PCPPn:MoO$_3$ | 1:0.5 |
| | Electrode | 501 | 110 | ITSO | — |

<Fabrication of Light-Emitting Element 1>

As an electrode 501, an ITSO film was formed to a thickness of 110 nm over a substrate 510. Note that the area of the electrode 501 was 4 mm$^2$ (2 mm×2 mm).

Next, an EL layer was formed over the electrode 501. As a hole-injection layer 511, 1,3,5-tri(dibenzothiophen-4-yl)-benzene (abbreviated as DBT3P-II) and molybdenum oxide (MoO$_3$) were deposited by co-evaporation such that the deposited layer has a weight ratio of DBT3P-II to MoO$_3$ (DBT3P-II:MoO$_3$) of 1:0.1 and a thickness of 35 nm. In other words, the hole-injection layer 511 was formed of a composite material of a donor material and an acceptor material. In the hole-injection layer 511, DBT3P-II is a donor material and MoO$_3$ is an acceptor material.

Next, as a first layer in a light-emitting layer 530, 2-[3'-(dibenzothiophen-4-yl)biphenyl-3-yl]dibenzo[f,h]quinoxaline (abbreviation: 2mDBTBPDBq-II) and N-(1,1'-biphenyl-4-yl)-N-[4-(9-phenyl-9H-carbazol-3-yl)phenyl]-9,9-dimethyl-9H-fluoren-2-amine (abbreviation: PCBBiF) were deposited by co-evaporation such that the deposited layer has a weight ratio of 2mDBTBPDBq-II to PCBBiF of 0.8:0.2 and a thickness of 2 nm. Then, as a second layer in the light-emitting layer 530, 2mDBTBPDBq-II, PCBBiF, and (acetylacetonato)bis[5-methyl-6-(2-methylphenyl)-4-phenylpyrimidinato]iridium (III) (abbreviation: Ir(mpmppm)$_2$(acac)) were deposited by co-evaporation such that the deposited layer has a weight ratio of 2mDBTBPDBq-II to PCBBiF and Ir(mpmppm)$_2$(acac) of 0.8:0.2:0.06 and a thickness of 20 nm. In the light-emitting layer 530, 2mDBTBPDBq-II and PCBBiF are host materials and Ir(mpmppm)$_2$(acac) is a guest material (phosphorescent material).

As an electron-transport layer 518, 2mDBTBPDBq-II and bathophenanthroline (Bphen) were sequentially vapor-deposited to have thicknesses of 20 nm and 15 nm, respectively, over the light-emitting layer 530. Next, as an electron-injection layer 519, lithium fluoride (LiF) was vapor-deposited to a thickness of 1 nm.

As the electrode 502, aluminum (Al) was deposited to a thickness of 130 nm.

<Operation Characteristics of Light-Emitting Element>

Next, emission characteristics of the fabricated light-emitting elements 1 to 4 were measured. Note that the measurement was performed at room temperature (in an atmosphere kept at 23° C.).

Figure 37:
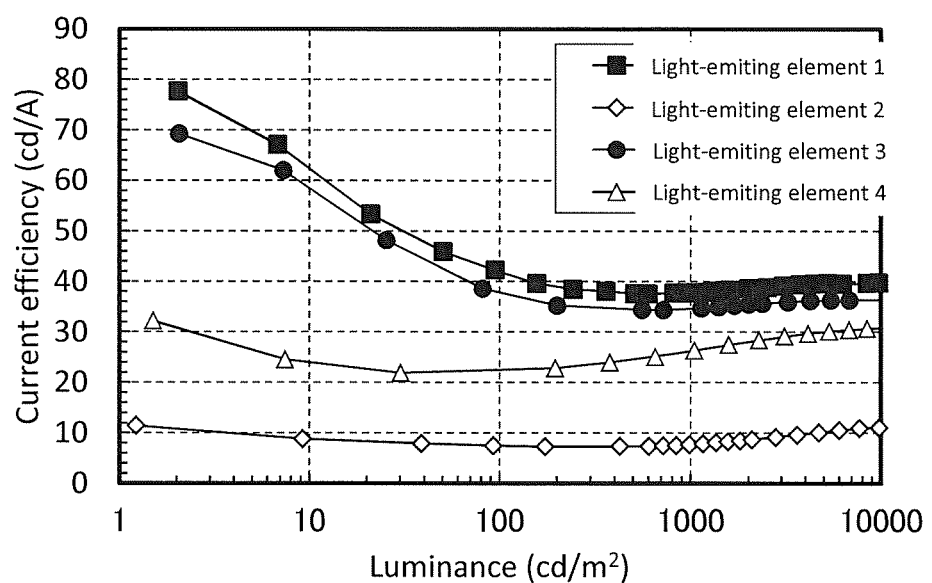
FIG. 37 shows current efficiency-luminance characteristics of light-emitting elements in Example.
Figure 38:
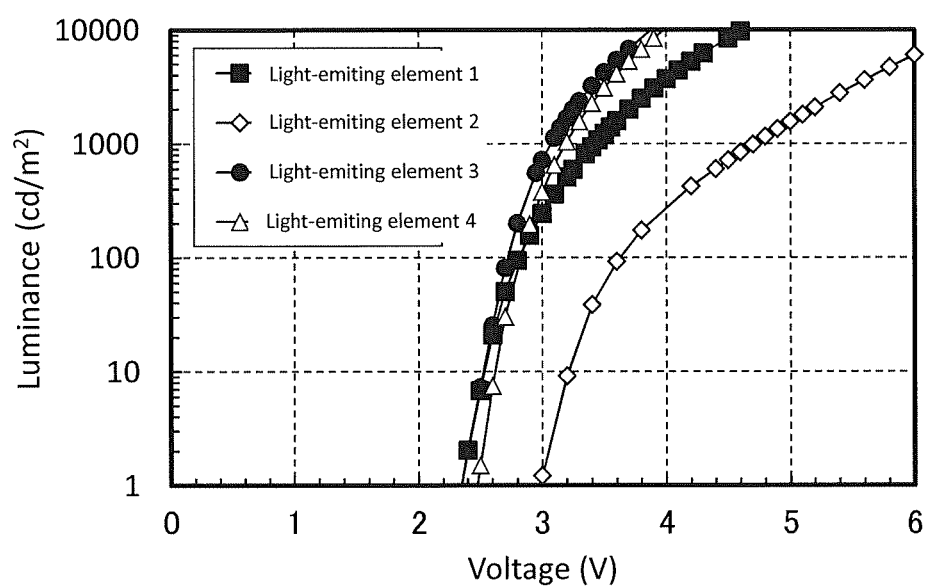
FIG. 38 shows luminance-voltage characteristics of light-emitting elements in Example.
Figure 39:
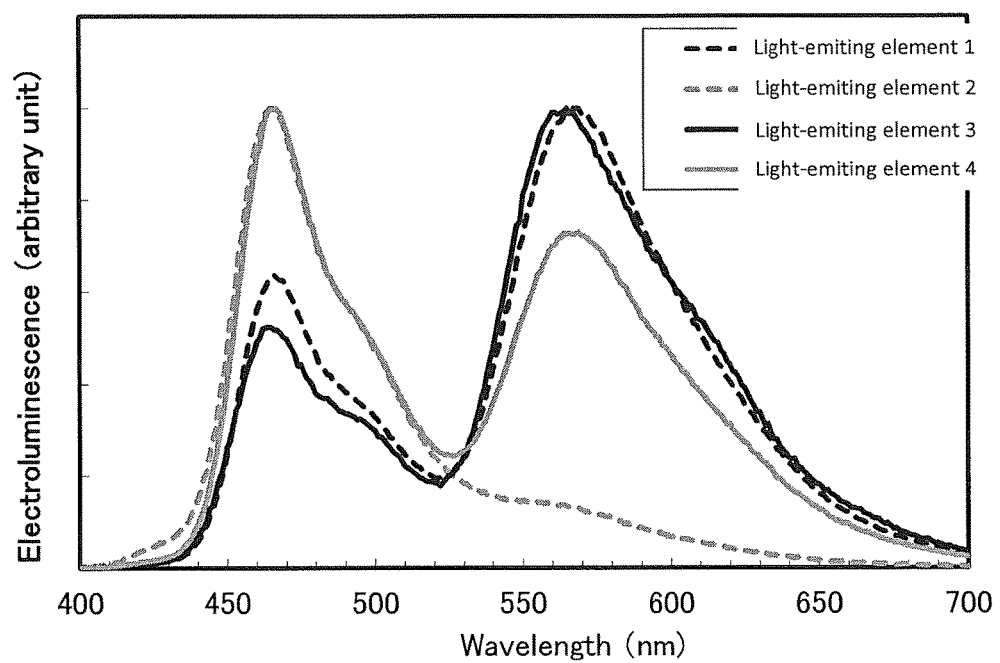
FIG. 39 shows electroluminescence spectra of light-emitting elements in Example.

The emission characteristics of the light-emitting elements at a luminance around 1000 cd/m$^2$ are shown below in Table 3. The current efficiency-luminance characteristics and luminance-voltage characteristics of the light-emitting elements are shown in FIG. 37 and FIG. 38, respectively. FIG. 39 shows electroluminescence spectra at the time when a current was made to flow in the light-emitting elements at a current density of 2.5 mA/cm$^2$.

TABLE 3

|  | Voltage (V) | Current density (mA/cm$^2$) | CIE chromaticity (x, y) | Luminance (cd/m$^2$) | Current efficiency (cd/A) | External quantum efficiency (%) |
| --- | --- | --- | --- | --- | --- | --- |
| Light-emitting element 1 | 3.4 | 2.5 | (0.38, 0.41) | 950 | 38 | 14 |
| Light-emitting element 2 | 4.7 | 13 | (0.20, 0.24) | 990 | 7.7 | 5.1 |
| Light-emitting element 3 | 3.1 | 2.6 | (0.39, 0.41) | 910 | 34 | 13 |
| Light-emitting element 4 | 3.2 | 4.0 | (0.34, 0.37) | 1000 | 26 | 11 |

Next, in a glove box containing a nitrogen atmosphere, the light-emitting element 1 was sealed by fixing a sealing substrate 550 to the substrate 510 provided with the EL layer using a sealant for an organic EL device. Specifically, after the sealant was applied to surround the EL layer over the substrate 510 and the substrate 510 was bonded to the sealing substrate 550, irradiation with ultraviolet light having a wavelength of 365 nm at 6 J/cm$^2$ and heat treatment at 80° C. for one hour were performed. Through the above process, the light-emitting element 1 was obtained.

<Fabrication of Light-Emitting Elements 2 to 4>

The light-emitting elements 2 to 4 are different from the above-described light-emitting element 1 in only the structure of the hole-injection layer 511, and steps for the other components are the same as those in a method for fabricating the light-emitting element 1.

The hole-injection layer 511 of the light-emitting element 2 was deposited by co-evaporation such that the deposited layer has a weight ratio of NPB to MoO$_3$ (NPB: MoO$_3$) of 1:0.1 and a thickness of 35 nm. In other words, the hole-injection layer 511 was formed of a composite material of a donor material and an acceptor material. In the hole-injection layer 511, NPB is a donor material and MoO$_3$ is an acceptor material.

The hole-injection layer 511 of the light-emitting element 3 was deposited by co-evaporation such that the deposited layer has a weight ratio of DBT3P-II to MoO$_3$ (DBT3P-II: MoO$_3$) of 1:0.5 and a thickness of 35 nm. In other words, the hole-injection layer 511 was formed of a composite material of a donor material and an acceptor material. In the hole-injection layer 511, DBT3P-II is a donor material and MoO$_3$ is an acceptor material.

The hole-injection layer 511 of the light-emitting element 4 was deposited by co-evaporation such that the deposited layer has a weight ratio of PCPPn to MoO$_3$ (PCPPn:MoO$_3$) of 1:0.5 and a thickness of 35 nm. In other words, the hole-injection layer 511 was formed of a composite material of a donor material and an acceptor material. In the hole-injection layer 511, PCPPn is a donor material and MoO$_3$ is an acceptor material.

As shown by the peaks in the electroluminescence spectra in FIG. 39, blue light emission derived from 1,6mMemFL-PAPrn, which is a fluorescent material, and yellow light emission derived from Ir(mpmppm)$_2$(acac), which is a phosphorescent material, were observed from the light-emitting elements 1, 3, and 4. Both the fluorescent material and the phosphorescent material were able to emit light of different colors in the light-emitting elements 1, 3, and 4. Moreover, as indicated in Table 3, they have high external quantum efficiency of more than 10% while exhibiting light emission from both the fluorescent material and the phosphorescent material. By using the light-emitting layers of one embodiment of the present invention, the light-emitting elements exhibiting efficient light emission from both of the fluorescent and phosphorescent materials were able to be fabricated.

In contrast, as shown by the electroluminescence spectrum, only blue light emission derived from 1,6mMemFL-PAPrn, which is a fluorescent material, was observed from the light-emitting element 2. The same compounds and structure of the light-emitting layers 520 and 530 were used for the light-emitting elements 1 and 2. Therefore, it can be said that using a different hole-injection layer 511 changed the light-emitting region, that is, the emission color between the light-emitting elements 1 and 2. In other words, the region where the light-emitting region of the light-emitting element is distributed was able to be adjusted by using different donor materials in the hole-injection layers 511. Note that the external quantum efficiency of the light-emitting element 2 was more than 5%, which is a high enough emission efficiency as a light-emitting element exhibiting light emission from a fluorescent material. Therefore, in the light-emitting element 2, most of the carriers injected from the pair of electrodes were recombined in the light-emitting layer 520, contributing the light emission.

As shown in FIG. 38 and Table 3, the light-emitting elements 1 to 4 are each driven at low voltages. This shows that the light-emitting elements with reduced power consumption were fabricated with one embodiment of the present invention.

In the light-emitting elements 1 to 4, the HOMO levels of the donor materials used in the hole-injection layer 511 were measured. The HOMO levels of DBT3P-II, PCPPn, and NPB were −6.20 eV, −5.91 eV, and −5.38 eV, respectively. For the method for measuring the HOMO levels, Example 1 can be referred to.

In other words, in the light-emitting element 1, the HOMO level of the material included in the hole-transport layer 512 is higher than that of the donor material included in the hole-injection layer 511, and in the light-emitting element 2, the HOMO level of the material included in the hole-transport layer 512 is lower than that of the donor material included in the hole-injection layer 511. Accordingly, in the light-emitting element 1, the property of injecting holes from the hole-injection layer 511 to the hole-transport layer 512 is favorable; therefore, carriers injected from the pair of electrodes are recombined in both the light-emitting layer 520 and the light-emitting layer 530 and light emission from both of the light-emitting layers 520 and 530 is observed. In the light-emitting element 2, there is a hole injection barrier at the interface between the hole-injection layer 511 and the hole-transport layer 512 and holes are not easily transported to the light-emitting layers; therefore, more carriers are recombined in the light-emitting layer 520 that is located near the hole-transport layer 512. Thus, only the blue light emission from the light-emitting layer 520 is observed in the light-emitting element 2.

In the light-emitting element 3, the HOMO level of the material included in the hole-transport layer 512 is higher than that of the donor material included in the hole-injection layer 511, and in the light-emitting element 4, the HOMO level of the material included in the hole-transport layer 512 is equal to that of the donor material included in the hole-injection layer 511. Accordingly, in both of the light-emitting elements 3 and 4, the property of injecting holes from the hole-injection layer 511 to the hole-transport layer 512 is favorable; therefore, carriers injected from the pair of electrodes are recombined in both the light-emitting layer 520 and the light-emitting layer 530 and light emission from both of the light-emitting layers 520 and 530 is observed. Note that because the property of injecting holes from the hole-injection layer 511 to the hole-transport layer 512 in the light-emitting element 3 is more favorable than that in the light-emitting element 4, more carriers are recombined so as to emit light in the light-emitting layer 530 that is located near the electron-transport layer 518 in the light-emitting element 3. Since the region in which the carrier recombination region and the light-emitting region are distributed differs between the light-emitting elements 3 and 4, different electroluminescence spectra and light emission colors are caused.

Although the light-emitting elements 1 and 3 use the same compounds for the hole-injection layer 511, they have different mixing ratios between the donor material and the acceptor material, which brought about a difference in the electroluminescence spectrum between the light-emitting elements 1 and 3. The region in which the recombination region of carriers injected from the pair of electrodes and the light-emitting region are distributed was changed because the hole-injection property of the hole-injection layer 511 is changed by changing the mixing ratio between the donor material and the acceptor material as presented in Example 1. Thus, the ratio between the light emission from the light-emitting layer 520 and the light emission from the light-emitting layer 530 was changed, causing the difference in the shape of the electroluminescence spectrum.

In the above-described manner, a light-emitting element including regions which have different emission spectra or emission colors can be fabricated with one embodiment of the present invention. In addition, light-emitting elements with high emission efficiency can be fabricated. Further, light-emitting elements that are easily formed in a relatively small number of steps for forming films and perform multi-color light emission can be fabricated.

The structures described above in this example can be used in combination with any of the structures described in the other embodiments as appropriate.

Example 3

Figure 36B:
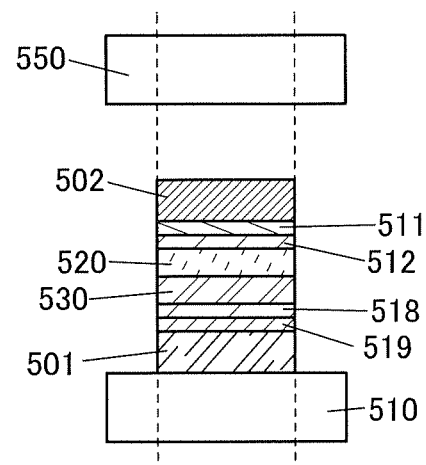

In this example, examples of fabricating light-emitting elements 5 and 6 according to one embodiment of the present invention will be described. A schematic cross-sectional view of the light-emitting elements fabricated in this example is shown in FIG. 36B. The detailed element structures are shown in Table 4. The structure and abbreviation of the compound used in this example are shown below. The other compounds are the same as those used in Example 2.

[Chemical Formula 4]

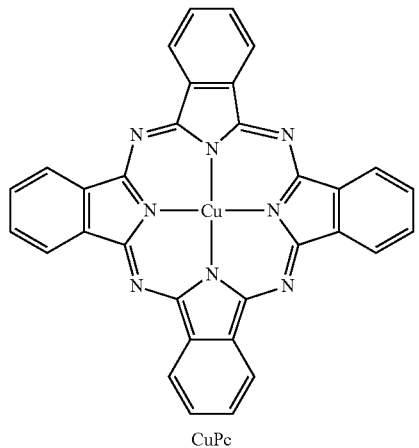

CuPc

TABLE 4

| Layer | | Reference numeral | Thickness (nm) | Material | Weight ratio |
|---|---|---|---|---|---|
| Light-emitting element 5 | Electrode | 502 | 150 | Al | — |
| | Hole-injection layer | 511 | 20 | DBT3P-II:MoO$_3$ | 1:0.5 |
| | Hole-transport layer | 512 | 20 | PCPPn | — |
| | Light-emitting layer | 520 | 10 | cgDBCzPA:1,6mMemFLPAPm | 1:0.02 |
| | | 530 (2) | 2 | 2mDBTBPDBq-II | — |
| | | 530 (1) | 20 | 2mDBTBPDBq-II:PCBBiF:Ir(mpmppm)$_2$(acac) | 0.9:0.1:0.06 |
| | Electron-transport layer | 518 (2) | 15 | 2mDBTBPDBq-II | — |
| | | 518 (1) | 10 | Bphen | — |

TABLE 4-continued

|  | Layer | Reference numeral | Thickness (nm) | Material | Weight ratio |
|---|---|---|---|---|---|
|  | Electron-injection layer | 519 (3) | 0.15 | Li$_2$O | — |
|  |  | 519 (2) | 5 | Bphen | — |
|  |  | 519 (1) | 2 | CuPc | — |
|  | Electrode | 501 | 110 | ITSO | — |
| Light-emitting element 6 | Electrode | 502 | 150 | Al | — |
|  | Hole-injection layer | 511 | 20 | PCPPn:MoO$_3$ | 1:0.5 |
|  | Hole-transport layer | 512 | 20 | PCPPn | — |
|  | Light-emitting layer | 520 | 10 | cgDBCzPA:1,6mMemFLPAPrn | 1:0.02 |
|  |  | 530 (2) | 2 | 2mDBTBPDBq-II | — |
|  |  | 530 (1) | 20 | 2mDBTBPDBq-II:PCBBiF:Ir(mpmppm)$_2$(acac) | 0.9:0.1:0.06 |
|  | Electron-transport layer | 518 (2) | 15 | 2mDBTBPDBq-II | — |
|  |  | 518 (1) | 10 | Bphen | — |
|  | Electron-injection layer | 519 (4) | 0.15 | Li$_2$O | — |
|  |  | 519 (3) | 5 | Bphen | — |
|  |  | 519 (2) | 2 | CuPc | — |
|  |  | 519 (1) | 70 | PCPPn:MoO$_3$ | 1:0.5 |
|  | Electrode | 501 | 70 | ITSO | — |

<Fabrication of Light-Emitting Element 5>

As the electrode 501, an ITSO film was formed to a thickness of 110 nm over the substrate 510. Note that the area of the electrode 501 was 4 mm$^2$ (2 mm×2 mm).

Next, an EL layer was formed over the electrode 501. As the electron-injection layer 519, copper phthalocyanine (CuPc), Bphen, and lithium oxide (Li$_2$O) were sequentially vapor-deposited to have thicknesses of 2 nm, 5 nm, and 0.15 nm, respectively.

Next, as the electron-transport layer 518, Bphen and 2mDBTBPDBq-II were sequentially vapor-deposited to have thicknesses of 10 nm and 15 nm, respectively.

Next, as a first layer in the light-emitting layer 530, 2mDBTBPDBq-II, PCBBiF, and Ir(mpmppm)$_2$(acac) were deposited by co-evaporation such that the deposited layer has a weight ratio of 2mDBTBPDBq-II to PCBBiF and Ir(mpmppm)$_2$(acac) of 0.9:0.1:0.06 and a thickness of 20 nm. Then, as a second layer in the light-emitting layer 530, 2mDBTBPDBq-II was vapor-deposited to a thickness of 2 nm. In the light-emitting layer 530, 2mDBTBPDBq-II and PCBBiF are host materials and Ir(mpmppm)$_2$(acac) is a guest material (phosphorescent material).

Next, as a light-emitting layer 520, cgDBCzPA and 1,6mMemFLPAPrn were deposited by co-evaporation such that the deposited layer has a weight ratio of cgDBCzPA to 1,6mMemFLPAPrn of 1:0.02 and a thickness of 10 nm. In the light-emitting layer 520, cgDBCzPA is as a host material and 1,6mMemFLPAPrn is a guest material (fluorescent material).

Next, as the hole-transport layer 512, PCPPn was vapor-deposited to a thickness of 20 nm. Then, as the hole-injection layer 511, DBT3P-II and MoO$_3$ were deposited by co-evaporation such that the deposited layer has a weight ratio of DBT3P-II to MoO$_3$ (DBT3P-II:MoO$_3$) of 1:0.5 and a thickness of 20 nm. In other words, the hole-injection layer 511 was formed of a composite material of a donor material and an acceptor material. In the hole-injection layer 511, DBT3P-II is a donor material and MoO$_3$ is an acceptor material.

As the electrode 502, aluminum (Al) was deposited to a thickness of 150 nm.

Next, in a glove box containing a nitrogen atmosphere, the light-emitting element 5 was sealed by fixing a sealing substrate 550 to the substrate 510 provided with the EL layer using a sealant for an organic EL device. Specifically, after the sealant was applied to surround the EL layer over the substrate 510 and the substrate 510 was bonded to the sealing substrate 550, irradiation with ultraviolet light having a wavelength of 365 nm at 6 J/cm$^2$ and heat treatment at 80° C. for one hour were performed. Through the above process, the light-emitting element 5 was obtained.

<Fabrication of Light-Emitting Element 6>

The light-emitting element 6 is different from the above-described light-emitting element 5 in only, the structures of the electrode 101, the electron-injection layer 519, and the hole-injection layer 511, and steps for the other components are the same as those in a method for fabricating the light-emitting element 5.

In the light-emitting element 6, as the electrode 501, an ITSO film was formed to a thickness of 70 nm over the substrate 510. Note that the area of the electrode 501 was 4 mm$^2$ (2 mm×2 mm).

Next, as a first layer in the electron-injection layer 519 over the electrode 501, PCPPn and MoO$_3$ were deposited by co-evaporation such that the deposited layer has a weight ratio of PCPPn to MoO$_3$ (PCPPn:MoO$_3$) of 1:0.5 and a thickness of 70 nm. In other words, the electron-injection layer 519 includes a composite material functioning as a charge-generation layer, and the composite material is formed of a donor material and an acceptor material. In the electron-injection layer 519, PCPPn is a donor material and MoO$_3$ is an acceptor material. Then, as second to fourth layers in the electron-injection layer 519, CuPc, Bphen, and Li$_2$O were sequentially vapor-deposited to have thicknesses of 2 nm, 5 nm, and 0.15 nm, respectively.

The hole-injection layer 511 of the light-emitting element 6 was deposited by co-evaporation such that the deposited layer has a weight ratio of PCPPn to MoO$_3$ (PCPPn:MoO$_3$) of 1:0.5 and a thickness of 20 nm. In other words, the hole-injection layer 511 was formed of a composite material of a donor material and an acceptor material. In the hole-injection layer 511, PCPPn is a donor material and MoO$_3$ is an acceptor material.

<Operation Characteristics of Light-Emitting Element>

Next, emission characteristics of the fabricated light-emitting elements 5 and 6 were measured. Note that the measurement was performed at room temperature (in an atmosphere kept at 23° C.).

Figure 40:
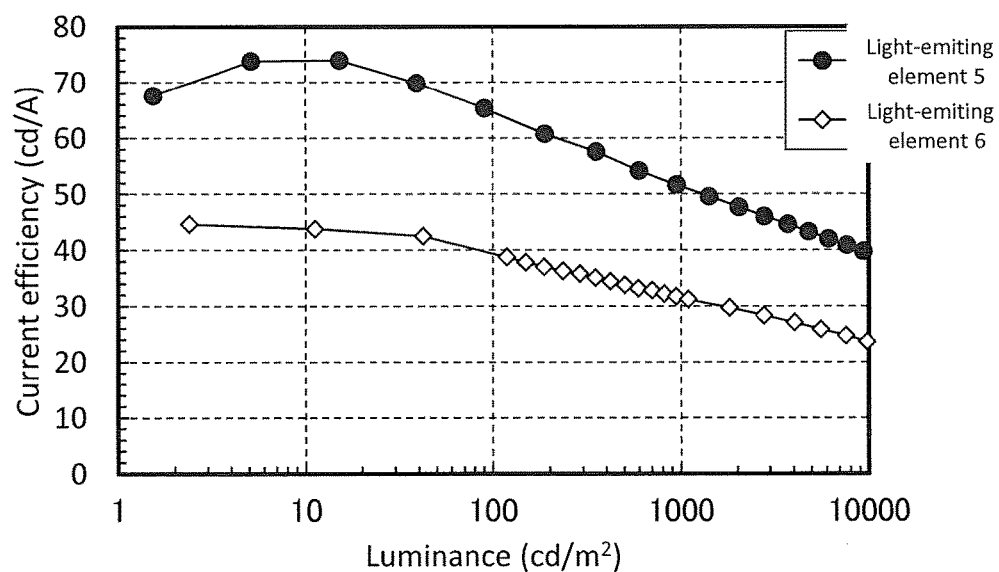
FIG. 40 shows current efficiency-luminance characteristics of light-emitting elements in Example.
Figure 41:
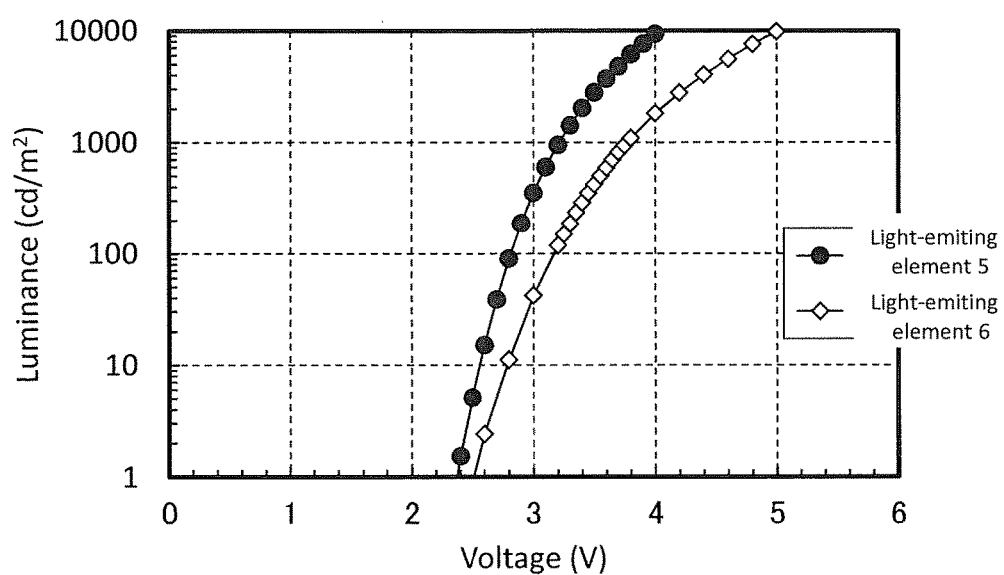
FIG. 41 shows luminance-voltage characteristics of light-emitting elements in Example.
Figure 42:
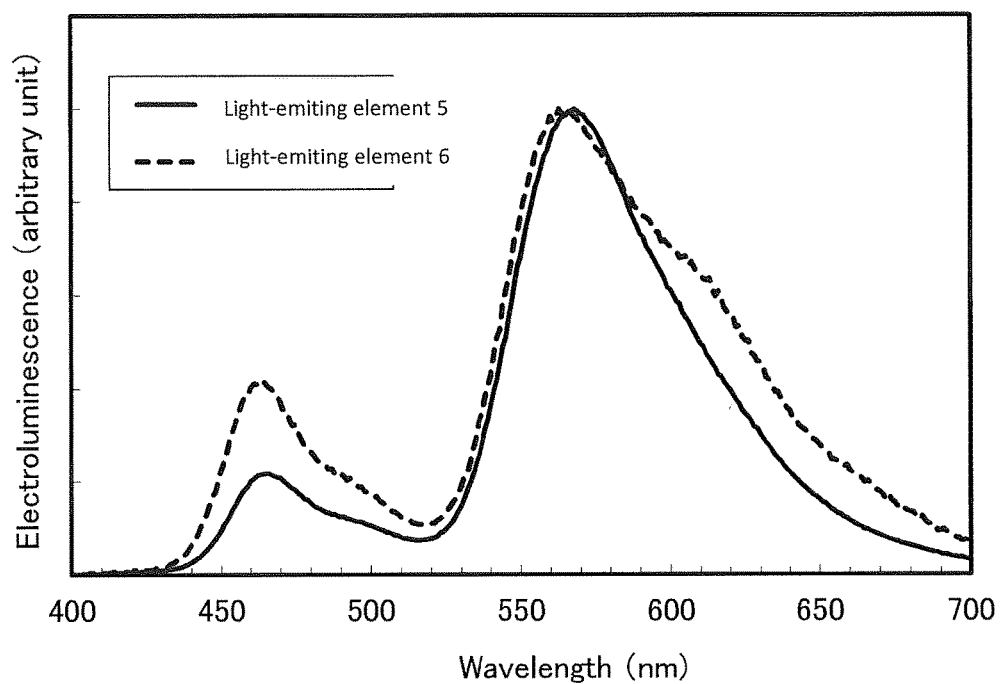
FIG. 42 shows electroluminescence spectra of light-emitting elements in Example.

The emission characteristics of the light-emitting elements at a luminance around 1000 cd/m$^2$ are shown below in Table 5. The current efficiency-luminance characteristics and luminance-voltage characteristics of the light-emitting elements are shown in FIG. 40 and FIG. 41, respectively. FIG. 42 shows electroluminescence spectra at the time when a current was made to flow in the light-emitting elements at a current density of 2.5 mA/cm$^2$.

TABLE 5

|  | Voltage (V) | Current density (mA/cm$^2$) | CIE chromaticity (x, y) | Luminance (cd/m$^2$) | Current efficiency (cd/A) | External quantum efficiency (%) |
|---|---|---|---|---|---|---|
| Light-emitting element 5 | 3.2 | 1.8 | (0.44, 0.47) | 950 | 52 | 17 |
| Light-emitting element 6 | 3.8 | 3.0 | (0.41, 0.41) | 940 | 32 | 12 |

As shown by the peaks in the electroluminescence spectra in FIG. 42, blue light emission derived from 1,6mMemFL-PAPrn, which is a fluorescent material, and yellow light emission derived from Ir(mpmppm)$_2$(acac), which is a phosphorescent material, were observed from the light-emitting elements 5 and 6. Both the fluorescent material and the phosphorescent material were able to emit light of different colors in the light-emitting elements 5 and 6. Moreover, as indicated in Table 5, they have high external quantum efficiency of more than 10% while exhibiting light emission from both the fluorescent material and the phosphorescent material. By using the light-emitting layers of one embodiment of the present invention, the light-emitting elements exhibiting efficient light emission from both of the fluorescent and phosphorescent materials were able to be fabricated.

As shown in FIG. 41 and Table 5, the light-emitting elements 5 and 6 are each driven at low voltages. This shows that the light-emitting elements with reduced power consumption were fabricated with one embodiment of the present invention.

Furthermore, as described in Example 2, the HOMO level of the material included in the hole-transport layer 512 is higher than that of the donor material included in the hole-injection layer 511 in the light-emitting element 5, and the HOMO level of the material included in the hole-transport layer 512 is equal to that of the donor material included in the hole-injection layer 511 in the light-emitting element 6. Accordingly, in both of the light-emitting elements 5 and 6, the property of injecting holes from the hole-injection layer 511 to the hole-transport layer 512 is favorable; however, the hole-injection property in the light-emitting element 5 is more favorable than that in the light-emitting element 6.

Moreover, the electron-injection layer 519 in the light-emitting element 6 includes a composite material which is formed of a donor material and an acceptor material. In contrast, the electron-injection layer 519 in the light-emitting element 5 does not include such a composite material. This results in the favorable electron-injection property of the light-emitting element 6 compared with the light-emitting element 5.

In other words, the light-emitting elements 5 and 6 are different from each other in structures of both the hole-injection layer 511 and the electron-injection layer 519. The hole-injection property in the light-emitting element 5 is more favorable than that in the light-emitting element 6, and the electron-injection property in the light-emitting element 6 is more favorable than that in the light-emitting element 5. Accordingly, in the light-emitting element 5, more carriers injected from the pair of electrodes are recombined in the light-emitting layer 530 that is located near the electron-transport layer 518. In the light-emitting element 6, more carriers are recombined in the light-emitting layer 520 that is located near the hole-transport layer 512.

Thus, the region where the carrier recombination region and the light-emitting region are distributed is different between the light-emitting elements 5 and 6, and therefore the light-emitting elements 5 and 6 have different electroluminescence spectra and emission colors.

In the above-described manner, a light-emitting element including regions which have different emission spectra or emission colors can be fabricated with one embodiment of the present invention. In addition, light-emitting elements with high emission efficiency can be fabricated. Further, light-emitting elements that are easily formed in a relatively small number of steps for forming films and perform multi-color light emission can be fabricated.

The structures described above in this example can be used in combination with any of the structures described in the other embodiments as appropriate.

This application is based on Japanese Patent Application serial no. 2015-035678 filed with Japan Patent Office on Feb. 25, 2015, the entire contents of which are hereby incorporated by reference.

What is claimed is:
1. A light-emitting element comprising:
a first electrode;
a second electrode;
a third electrode; and
an EL layer,
wherein the EL layer comprises a first region and a second region,
wherein the first region is positioned between the first electrode and the second electrode,
wherein the second region is positioned between the second electrode and the third electrode,
wherein the first region comprises a first injection layer, a first light-emitting layer, and a second light-emitting layer,
wherein the second region comprises a second injection layer, the first light-emitting layer, and the second light-emitting layer,
wherein the first injection layer comprises a region in contact with the first electrode,
wherein the second injection layer comprises a region in contact with the third electrode,
wherein a third injection layer is over the first injection layer and the second injection layer,
wherein the first light-emitting layer comprises a first light-emitting material and a first host material,
wherein the second light-emitting layer comprises a second light-emitting material and a second host material,
wherein the first light-emitting material has an emission spectrum different from an emission spectrum of the second light-emitting material, and
wherein the first electrode and the third electrode comprise different materials.
2. The light-emitting element according to claim 1, wherein a color of light to be emitted from the first region is different from a color of light to be emitted from the second region.

3. The light-emitting element according to claim 1,
wherein a conductivity of the first injection layer is different from a conductivity of the second injection layer.

4. The light-emitting element according to claim 1,
wherein the first light-emitting material has a peak of an emission spectrum in a wavelength range of at least one color selected from violet, blue, and blue green, and
wherein the second light-emitting material has a peak of an emission spectrum in a wavelength range of at least one color selected from green, yellow green, yellow, orange, and red.

5. The light-emitting element according to claim 1,
wherein a singlet excitation energy level of the first host material is higher than a singlet excitation energy level of the first light-emitting material, and
wherein a triplet excitation energy level of the first host material is lower than a triplet excitation energy level of the first light-emitting material.

6. The light-emitting element according to claim 1,
wherein the second host material comprises a first compound and a second compound, and
wherein the first compound and the second compound are able to form an exciplex.

7. The light-emitting element according to claim 6,
wherein a triplet excitation energy level of the first host material is lower than a triplet excitation energy level of the first compound, and
wherein the triplet excitation energy level of the first host material is lower than a triplet excitation energy level of the second compound.

8. The light-emitting element according to claim 1, further comprising a region in which the first light-emitting layer and the second light-emitting layer are in contact with each other.

9. The light-emitting element according to claim 1,
wherein the first light-emitting material is capable of converting singlet excitation energy into light emission, and
wherein the second light-emitting material is capable of converting triplet excitation energy into light emission.

10. A display device comprising:
the light-emitting element according to claim 1; and
at least one of a color filter and a transistor.

11. An electronic device comprising:
the display device according to claim 10; and
at least one of a housing and a touch sensor.

12. A lighting device comprising:
the light-emitting element according to claim 1; and
at least one of a housing and a touch sensor.

13. The light-emitting element according to claim 1,
wherein the third injection layer overlaps with the first injection layer and the second injection layer.

14. A light-emitting element comprising:
a first electrode;
a second electrode;
a third electrode; and
an EL layer,
wherein the EL layer comprises a first region and a second region,
wherein the first region is positioned between the first electrode and the second electrode,
wherein the second region is positioned between the second electrode and the third electrode,
wherein the first region comprises a first injection layer, a first light-emitting layer, and a second light-emitting layer,
wherein the second region comprises the first injection layer, the first light-emitting layer, and the second light-emitting layer,
wherein the first injection layer comprises a region in contact with the first electrode,
wherein the first injection layer comprises a region in contact with the third electrode,
wherein a second injection layer is over the first injection layer,
wherein the first light-emitting layer comprises a first light-emitting material and a first host material,
wherein the second light-emitting layer comprises a second light-emitting material and a second host material,
wherein the first light-emitting material has an emission spectrum different from an emission spectrum of the second light-emitting material, and
wherein the first electrode and the third electrode comprise different materials.

15. The light-emitting element according to claim 14,
wherein a color of light to be emitted from the first region is different from a color of light to be emitted from the second region.

16. The light-emitting element according to claim 14,
wherein the first light-emitting material has a peak of an emission spectrum in a wavelength range of at least one color selected from violet, blue, and blue green, and
wherein the second light-emitting material has a peak of an emission spectrum in a wavelength range of at least one color selected from green, yellow green, yellow, orange, and red.

17. The light-emitting element according to claim 14,
wherein a singlet excitation energy level of the first host material is higher than a singlet excitation energy level of the first light-emitting material, and
wherein a triplet excitation energy level of the first host material is lower than a triplet excitation energy level of the first light-emitting material.

18. The light-emitting element according to claim 14,
wherein the second host material comprises a first compound and a second compound, and
wherein the first compound and the second compound are able to form an exciplex.

19. The light-emitting element according to claim 18,
wherein a triplet excitation energy level of the first host material is lower than a triplet excitation energy level of the first compound, and
wherein the triplet excitation energy level of the first host material is lower than a triplet excitation energy level of the second compound.

20. The light-emitting element according to claim 14, further comprising a region in which the first light-emitting layer and the second light-emitting layer are in contact with each other.

21. The light-emitting element according to claim 14,
wherein the first light-emitting material is capable of converting singlet excitation energy into light emission, and
wherein the second light-emitting material is capable of converting triplet excitation energy into light emission.

22. A display device comprising:
the light-emitting element according to claim 14; and
at least one of a color filter and a transistor.

23. An electronic device comprising:
the display device according to claim 22; and
at least one of a housing and a touch sensor.

24. A lighting device comprising:
the light-emitting element according to claim 14; and
at least one of a housing and a touch sensor.

* * * * *